United States Patent
Sonoda et al.

(10) Patent No.: US 9,622,319 B2
(45) Date of Patent: Apr. 11, 2017

(54) SUBSTRATE TO WHICH FILM IS FORMED, METHOD FOR PRODUCTION, AND ORGANIC EL DISPLAY DEVICE

(75) Inventors: Tohru Sonoda, Osaka (JP); Shinichi Kawato, Osaka (JP); Satoshi Inoue, Osaka (JP); Satoshi Hashimoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 937 days.

(21) Appl. No.: 13/980,571

(22) PCT Filed: Jan. 13, 2012

(86) PCT No.: PCT/JP2012/050579
§ 371 (c)(1),
(2), (4) Date: Jul. 18, 2013

(87) PCT Pub. No.: WO2012/099011
PCT Pub. Date: Jul. 26, 2012

(65) Prior Publication Data
US 2013/0302572 A1 Nov. 14, 2013

(30) Foreign Application Priority Data
Jan. 20, 2011 (JP) .................................. 2011-010179

(51) Int. Cl.
| | | |
|---|---|---|
| H05B 33/14 | (2006.01) | |
| H01L 27/32 | (2006.01) | |
| H01L 51/56 | (2006.01) | |
| H01L 51/00 | (2006.01) | |
| C23C 14/04 | (2006.01) | |
| C23C 14/54 | (2006.01) | |

(52) U.S. Cl.
CPC ......... *H05B 33/145* (2013.01); *C23C 14/042* (2013.01); *C23C 14/54* (2013.01);
(Continued)

(58) Field of Classification Search
CPC .... H01J 9/221; C09K 11/06; Y10T 428/2991; B32B 9/04; H01L 2251/55;
(Continued)

(56) References Cited

U.S. PATENT DOCUMENTS 5,688,551 A 11/1997 Littman et al.
5,742,129 A 4/1998 Miayguchi et al.
(Continued)

FOREIGN PATENT DOCUMENTS

JP 08-227276 A 9/1996
JP 09-167684 A 6/1997
(Continued)

OTHER PUBLICATIONS

International Search Report mailed Mar. 6, 2012 for PCT/JP2012/050579, 2 pages English Translation and 2 pages ISR; total 4 pages.

*Primary Examiner* — Aaron Austin
*Assistant Examiner* — Elizabeth Ivey
(74) *Attorney, Agent, or Firm* — Morrison & Foerster LLP

(57) ABSTRACT

A film formation substrate is arranged such that (i) a base end, in a y-axis direction, of a film-thickness-gradually-diminishing part of a first film overlaps a first film formation region, and (ii) a film-thickness-gradually-diminishing part of a second film is disposed on an outside, in the y-axis direction, of a second film formation region and overlaps the film-thickness-gradually-diminishing part of the first film so as to compensate for a gradually diminished thickness of the film-thickness-gradually-diminishing part.

9 Claims, 23 Drawing Sheets

(52) U.S. Cl.
CPC ...... *H01L 27/3211* (2013.01); *H01L 51/0002* (2013.01); *H01L 51/56* (2013.01); *Y10T 428/24612* (2015.01)

(58) Field of Classification Search
CPC ........... H01L 2251/558; H01L 51/0021; H01L 51/5209; H01L 51/5225; F21Y 2113/10; F21Y 2115/10
See application file for complete search history.

(56) References Cited

U.S. PATENT DOCUMENTS

| | | | |
|---|---|---|---|
| 6,294,892 | B1 | 9/2001 | Utsugi et al. |
| 6,366,016 | B1* | 4/2002 | Sakaguchi .......... H01L 27/3211 313/502 |
| 2004/0207321 | A1 | 10/2004 | Maeda et al. |
| 2005/0174044 | A1* | 8/2005 | Miura ................ H01L 27/3211 313/504 |
| 2010/0149204 | A1 | 6/2010 | Han |
| 2010/0297349 | A1 | 11/2010 | Lee et al. |

FOREIGN PATENT DOCUMENTS

| | | |
|---|---|---|
| JP | 10-102237 A | 4/1998 |
| JP | 2000-188179 A | 7/2000 |
| JP | 2004-227851 A | 8/2004 |
| JP | 2005-222853 A | 8/2005 |
| JP | 2007-280866 A | 10/2007 |
| JP | 2008-058729 A | 3/2008 |
| JP | 2010-270396 A | 12/2010 |
| JP | 2012-018868 A | 1/2012 |

* cited by examiner

Substrate Scanning Direction

SUBSTRATE TO WHICH FILM IS FORMED, METHOD FOR PRODUCTION, AND ORGANIC EL DISPLAY DEVICE

CROSS REFERENCE TO RELATED APPLICATIONS

This is a U.S. National Phase patent application of PCT/JP2012/050579, filed Jan. 13, 2012, which claims priority to Japanese patent application no. 2011-010179, filed Jan. 20, 2011, each of which is hereby incorporated by reference in the present disclosure in its entirety.

TECHNICAL FIELD

The present invention relates to a film formation substrate that can be employed in an organic EL display device, a method for producing the film formation substrate, and an organic EL display device using the film formation substrate.

BACKGROUND ART

Recent years have witnessed practical use of a flat-panel display in various products and fields. This has led to a demand for a flat-panel display that is larger in size, achieves higher image quality, and consumes less power.

Under such circumstances, great attention has been drawn to an organic EL display device that (i) includes an organic electroluminescence (hereinafter abbreviated to "EL") element which uses EL of an organic material and that (ii) is an all-solid-state flat-panel display which is excellent in, for example, low-voltage driving, high-speed response, and self-emitting.

An organic EL display device includes, for example, (i) a substrate made up of members such as a glass substrate and TFTs (thin film transistors) provided to the glass substrate and (ii) organic EL elements provided on the substrate and connected to the TFTs.

An organic EL element is a light-emitting element capable of high-luminance light emission based on low-voltage direct-current driving, and includes in its structure a first electrode, an organic EL layer, and a second electrode stacked on top of one another in that order, the first electrode being connected to a TFT. The organic EL layer between the first electrode and the second electrode is an organic layer including a stack of layers such as a hole injection layer, a hole transfer layer, an electron blocking layer, a luminescent layer, a hole blocking layer, an electron transfer layer, and an electron injection layer.

A full-color organic EL display device typically includes organic EL elements of red (R), green (G), and blue (B) as sub-pixels aligned on a substrate. The full-color organic EL display device carries out an image display by, with use of TFTs, selectively causing the organic EL elements to each emit light with a desired luminance.

Such an organic EL display device is produced through a process that forms, for each organic EL element serving as a light-emitting element, a pattern of a luminescent layer made of an organic luminescent material which emits light of at least the above three colors (see, for example, Patent Literatures 1 to 3).

Such formation of a luminescent layer pattern is performed by a method such as (i) a vacuum vapor deposition method that uses a vapor deposition mask referred to as a shadow mask, (ii) an inkjet method, and (iii) a laser transfer method.

The production of, for example, a low-molecular organic EL display (OLED) has conventionally used a vapor deposition method involving a shadow mask, the vapor deposition method forming organic layers by selective application.

The vacuum vapor deposition method involving a shadow mask uses a shadow mask (full-cover contact type shadow mask) that is so sized as to allow vapor deposition to be performed throughout the entire vapor deposition region of a substrate. The shadow mask is typically equivalent in size to the substrate.

FIG. 24 is a cross-sectional view schematically illustrating a configuration of a conventional vapor deposition device involving a shadow mask.

The vacuum vapor deposition method involving a shadow mask, as illustrated in FIG. 24, forms a pattern by (i) placing a substrate 301 and a vapor deposition source 302 at such positions that the substrate 301 and the vapor deposition source 302 face each other, (ii) forming, in a shadow mask 303, openings 304 corresponding to a pattern of a portion of a target vapor deposition region so that no vapor deposition particles are adhered to a region other than the vapor deposition region, and (iii) depositing vapor deposition particles onto the substrate 301 through the openings 304.

The substrate 301 is placed in a vacuum chamber (not shown). The vapor deposition source 302 is fixed below the substrate 301. The shadow mask 303 is either fixed at a certain interval from the substrate 301 or moved relative to the substrate 301 while the substrate 301 and the vapor deposition source 302 are fixed to an inner wall of the vacuum chamber.

Patent Literature 1, for example, discloses a method that involves a load-lock vapor deposition source, the method (i) aligning a mask and a substrate with each other, next (ii) performing vacuum vapor deposition of a first luminescent material from directly below the substrate to form an arrangement of first light-emitting sections each substantially identical in shape to an opening of the mask, then (iii) shifting the mask, and (iv) performing vacuum vapor deposition of a second luminescent material from directly below the substrate to form an arrangement of second light-emitting sections each substantially identical in shape to the opening of the mask.

Patent Literature 2 discloses a method involving a partition wall that is so provided on a substrate to which display electrodes are provided as to protrude from the substrate and surround the display electrodes, the method (i) placing a mask on a top surface of the partition wall, (ii) depositing an organic EL medium on the display electrodes surrounded by the partition wall, then (iii) shifting the mask so that an opening of the mask is shifted from the position directly above a display electrode to the position directly above an adjacent display electrode, thereby sequentially forming luminescent layers each substantially identical in shape to the opening of the mask.

The vacuum vapor deposition method involving a shadow mask is used not only to form a luminescent layer but also to form an electrode pattern.

Patent Literature 4, for example, discloses a method for forming an electrode pattern, the method (i) aligning, in a mask equivalent in size to a substrate, short-diameter holes or long and narrow slit pores in a direction which intersects a direction in which the mask is shifted and (ii) performing vapor deposition of an electrode material while the mask is shifted in a direction in which the short-diameter holes or slit pores are aligned.

In the vacuum vapor deposition method involving a shadow mask as described above, the shadow mask is fixed (for example, welded) to a mask frame under tension for prevention of, for example, bending and distortion.

Such a conventional selective vapor deposition method requires a mask to be larger as a substrate becomes larger. A larger mask, however, is likely to cause a gap, whose size varies depending on a position on the vapor-deposited surface of the substrate, between the substrate and the mask due to self-weight bending and elongation of the mask. Use of the conventional selective vapor deposition method therefore makes it difficult to perform precise patterning, thereby causing problems such as misplacement of vapor deposition and color mixture. As a result, the patterning cannot be performed with high resolution.

Moreover, a larger mask requires an increase in size and weight of members such as the mask and a frame holding the mask. This makes handling of these members difficult, thereby threatening productivity and safety. In addition, a larger mask requires a vapor deposition device and accompanying devices to become extremely large and complicated. This makes device designing difficult and makes a device installation cost expensive.

It is therefore difficult to apply the conventional selective vapor deposition method to a large-size substrate. For example, selective vapor deposition at a mass production level has not been established yet for a large-size substrate such as a 60-inch or larger substrate.

As a solution to the above problem, Patent Literature 5 proposes a method (scan vapor deposition method) in which a vapor deposition source and a shadow mask that is smaller in size than a substrate are unified and an organic film is formed in a pattern in a predetermined location on the substrate by carrying out vapor deposition while scanning the unified members or the substrate in a state in which a gap is secured between the shadow mask and the substrate. Such a scan vapor deposition method allows a shadow mask to be small, and therefore does not incur the above problem.

CITATION LIST

Patent Literature 1
Japanese Patent Application Publication, Tokukai, No. 2000-188179 A (Publication Date: Jul. 4, 2000) (corresponding U.S. Pat. No. 6,294,892 (Publication Date: Sep. 25, 2001))
Patent Literature 2
Japanese Patent Application Publication, Tokukaihei, No. 8-227276 A (Publication Date: Sep. 3, 1996) (corresponding U.S. Pat. No. 5,742,129 (Publication Date: Apr. 21, 1998))
Patent Literature 3
Japanese Patent Application Publication, Tokukaihei, No. 9-167684 A (Publication Date: Jun. 24, 1997) (corresponding U.S. Pat. No. 5,688,551 (Publication Date: Nov. 18, 1997))
Patent Literature 4
Japanese Patent Application Publication, Tokukaihei, No. 10-102237 A (Publication Date: Apr. 21, 1998)
Patent Literature 5
Japanese Patent Application Publication, Tokukai, No. 2010-270396 A (Publication Date: Dec. 2, 2010)

SUMMARY OF INVENTION

Technical Problem

However, such a scan vapor deposition method in which film formation is carried out while securing a gap between a shadow mask and a substrate generates, at both sides of a vapor deposition film, a film-thickness-gradually-diminishing part (vapor deposition blur) whose thickness gradually diminishes. If a width of the vapor deposition blur is equal to or larger than a width of a non-luminescent region (a gap between luminescent regions), a vapor-deposited film reaches to an adjacent pixel, and as a result, mixture of colors occurs. Increasing a width of a non-luminescent region in order to prevent such mixture of colors causes (i) a decline in resolution of a display screen and (ii) a decline in area of the luminescent regions, which results in a decline in display quality. Conversely, reducing the width of the non-luminescent region to be equal to or smaller than a lower limit in order to increase the resolution and the display quality causes the mixture of colors.

More specifically, according to the scan vapor deposition method, a width of a vapor-deposited film (i.e., a luminescent layer) 23R is determined depending on a width (hereinafter referred to as a mask opening width) B82 of a mask opening 82 of a shadow mask 81 (see (a) of FIG. 25). A substantially flat part 23t which has an almost identical size to the mask opening width B82 is formed. The substantially flat part 23t is an effective range of the luminescent layer 23R. Meanwhile, film-thickness-gradually-diminishing parts 23s whose thickness gradually diminishes are formed on an outside of the mask opening 82. The film-thickness-gradually-diminishing parts 23s are vapor deposition blurs (hereinafter referred to also as vapor deposition blurs 23s). A method of carrying out vapor deposition while securing a gap between a shadow mask 81 and a substrate 200 generates, in principle, the vapor deposition blurs 23s due to influences of a nozzle opening diameter of a vapor deposition source, a vapor deposition source-mask distance, and a mask-substrate distance.

According to the scan vapor deposition method, the mask opening width B82 is set to be larger than the width of the luminescent region 24R in order that the luminescent layer 23R has a uniform thickness within the luminescent region 24R, and the vapor deposition blur 23s is located within a non-luminescent region (region between luminescent regions 24R and 24B) 29. In other words, a width B of the vapor deposition blur 23s in a direction needs to be smaller than at least a width of the non-luminescent region 29 in the same direction.

Further, margins are provided so that a light emission property of a pixel is not impaired in a case where a pattern of the luminescent layer 23R is deviated from an intended position on the substrate 200 due to dimensional accuracy and alignment accuracy of the shadow mask 81 and the substrate 200. Specifically, (i) a distance (film thickness decrease prevention margin) A between a luminescent region 24R end and a mask opening 82 (or the substantially flat part 23t) end is set so that a film thickness within the luminescent region 24R of the pixel 2R does not decrease (see (a) of FIG. 25) and (ii) a distance (color mixture prevention margin) C between a vapor deposition blur 23s end and an adjacent pixel luminescent region 24B is set so that the luminescent layer 23R is not formed on a luminescent region 24B of an adjacent sub-pixel 2B. That is, the relationship of the following equation 1 is established:

the region (non-luminescent region) 29 between luminescent regions=the film thickness decrease prevention margin $A$+the width $B$ of the vapor deposition blur 23s+the color mixture prevention margin $C$    equation 1

In a case where mispositioning of the pattern of the luminescent layer 23R (an amount of deviation of a center of the luminescent region 24R from a center of the mask opening 82) is larger than the margin C, there arises a problem (i.e., mixture of colors) that the vapor deposition blur 23s of the luminescent layer 23R overlaps the luminescent region 24B of the adjacent sub-pixel 2B (see (b) of FIG. 25). Meanwhile, in a case where mispositioning of the pattern of the luminescent layer 23R is larger than the margin A, there arises a problem (i.e., a decrease in film thickness) that the vapor deposition blur 23s overlaps the luminescent region 24R of the pixel 2R (see (c) of FIG. 25). Since an organic EL element is extremely sensitive to a variation in film thickness and impurity incorporation, the above problems are likely to affect properties (lifetime, efficiency) of the organic EL element. This results in a decline in display quality and reliability of an organic EL display device. It is therefore desirable to solve the above problems as much as possible.

In order to increase the margins A and C, it is necessary to take a measure (1) of widening the region 29 between the luminescent regions 24R and 24B or a measure (2) of reducing the width B of the vapor deposition blur 23s. In order to take the measure (1), it is necessary to make the luminescent regions 24R and 24B smaller. However, smaller luminescent regions 24R and 24B require a higher electric current density in order that an identical luminance is obtained. The higher electric current density shortens a lifetime of an organic EL element (a deterioration in luminance over time), thereby decreasing reliability and display quality of an organic EL display device. Moreover, a wider region 29 between the luminescent regions 24R and 24B causes an image to be viewed not as uniform planar display but as an aggregate of dot-like luminescent objects. Accordingly, display quality greatly declines.

As for the measure (2), it is not easy to greatly reduce the width B of the vapor deposition blur 23s since the method of carrying out vapor deposition while securing a gap between the mask 81 and the substrate 200 generates, in principle, the vapor deposition blur 23s due to influences of a nozzle opening diameter of a vapor deposition source, a vapor deposition source-mask distance, and a mask-substrate distance as described above. For example, the vapor deposition blur B is expressed by the following equation 2:

$$B \sim D \times H_{MS}/H_{TM} \quad \text{equation 2}$$

where D is the nozzle opening diameter, $H_{TM}$ is the vapor deposition source-mask distance, and $H_{MS}$ is the mask-substrate distance.

Note, however, that the equation 2 ignores influences of a thickness of the mask 81, a cross-sectional shape of the mask opening 82, and the like. According to the equation 2, D needs to be smaller in order to reduce B. However, smaller D means a decrease in area of an opening through which vapor deposition particles are injected. This results in insufficient vapor deposition rate and a decline in processing accuracy. One option is to make $H_{TM}$ larger. However, larger $H_{TM}$ requires a vacuum chamber to be larger proportionately. Moreover, larger $H_{TM}$ decreases material use efficiency since proportion of a vapor deposition material injected in directions other than a direction towards the substrate increases. The decrease in material use efficiency further leads to a decline in vapor deposition rate. Because of such problems in terms of cost and processing tact, it is not easy to make $H_{TM}$ larger. Another option is to reduce $H_{MS}$. However, there is a limit in reducing $H_{MS}$ since it is necessary to avoid collision between the mask 81 and the substrate 200. For the reasons described above, it is not easy to reduce the width B of the vapor deposition blur 23s, and there is a limit in reducing the width B of the vapor deposition blur 23s.

In view of the above discussion, according to the conventional vapor deposition method, it is impossible to reduce the region 29 between luminescent regions (film formation regions) to be smaller than a lower limit without sacrificing display quality and reliability of an organic EL display device. Moreover, considering that the margins A and C are not zero, the equation 1 shows that in a case where the vapor deposition blur 23s whose width B is equal to or larger than the width of the region 29 between luminescent regions is present, it is conventionally impossible to produce an organic EL display device without causing problems such as a decline in film thickness and mixture of colors. It is therefore conventionally impossible to produce an organic EL display device using a large-size substrate which causes a pattern of the luminescent layer 23R to be greatly deviated and to produce an organic EL display device with high resolution (smaller region 29 between luminescent regions).

The present invention was accomplished in view of the above problems, and an object of the present invention is to provide a film formation substrate, a production method, and an organic EL display device, each of which makes it possible to suppress a decrease in film thickness in a film formation region irrespective of a large pattern mispositioning.

Solution to Problem

In order to attain the above object, a film formation substrate includes: a substrate on which first and second film formation regions are alternately provided in a predetermined direction with spaces therebetween; first films each of which is formed on the substrate so as to cover a corresponding one of the first film formation regions; and second films each of which is formed on the substrate so as to cover a corresponding one of the second film formation regions, each of the first films having, at both ends thereof in the predetermined direction, a first film-thickness-gradually-diminishing part whose thickness gradually diminishes towards a front end, in the predetermined direction, of the first film-thickness-gradually-diminishing part, each of the second films having, at both ends thereof in the predetermined direction, a second film-thickness-gradually-diminishing part whose thickness gradually diminishes towards a front end, in the predetermined direction, of the second film-thickness-gradually-diminishing part, and the second film-thickness-gradually-diminishing part overlapping the first film-thickness-gradually-diminishing part.

According to the arrangement, in which the second film-thickness-gradually-diminishing part overlaps the first film-thickness-gradually-diminishing part, the second film-thickness-gradually-diminishing part compensates for a gradually diminished thickness of the first film-thickness-gradually-diminishing part. Since a decrease in thickness in the first film-thickness-gradually-diminishing part can be reduced, it is possible to suppress a decrease in film thickness in the first film formation region irrespective of large pattern mispositioning.

A film formation substrate of the present invention includes: a substrate on which a plurality of film formation regions are provided in a predetermined direction with spaces therebetween; first films each of which is formed on the substrate so as to cover a corresponding one of the plurality of film formation regions; and second films each of which is formed in a region between the plurality of film formation regions, each of the first films having, at both ends thereof in the predetermined direction, a first film-thickness-gradually-diminishing part whose thickness gradually diminishes towards a front end, in the predetermined direction, of the first film-thickness-gradually-diminishing part, each of the second films having, at both ends thereof in the predetermined direction, a second film-thickness-gradually-diminishing part whose thickness gradually diminishes towards a front end, in the predetermined direction, of the second film-thickness-gradually-diminishing part, and the second film-thickness-gradually-diminishing part overlapping the first film-thickness-gradually-diminishing part.

According to the arrangement, in which the second film-thickness-gradually-diminishing part overlaps the first film-thickness-gradually-diminishing part, the second film-thickness-gradually-diminishing part compensates for a gradually diminished thickness of the first film-thickness-gradually-diminishing part. Since a decrease in thickness in the first film-thickness-gradually-diminishing part can be reduced, it is possible to suppress a decrease in film thickness in the first film formation region irrespective of large pattern mispositioning.

A production method of the present invention includes the steps of: preparing a substrate on which first and second film formation regions are alternately provided in a predetermined direction with spaces therebetween; (i) disposing, opposite to the substrate, a first vapor deposition mask having a first opening whose width in the predetermined direction is smaller than a width, in the predetermined direction, of the first film formation region so that a center, in the predetermined direction, of the first opening substantially coincides with a center, in the predetermined direction, of the first film formation region, and (ii) depositing vapor deposition particles on the substrate through the first opening so as to form, in the first film formation region, a first film having, at both ends thereof in the predetermined direction, a first film-thickness-gradually-diminishing part whose thickness gradually diminishes towards a front end, in the predetermined direction, of the first film-thickness-gradually-diminishing part; and (i) disposing, opposite to the substrate, a second vapor deposition mask having a second opening so that a center, in the predetermined direction, of the second opening substantially coincides with a center, in the predetermined direction, of the second film formation region, and (ii) depositing the vapor deposition particles on the substrate through the second opening so as to form, in the second film formation region, a second film having, at both ends thereof in the predetermined direction, a second film-thickness-gradually-diminishing part whose thickness gradually diminishes towards a front end, in the predetermined direction, of the second film-thickness-gradually-diminishing part, the second film-thickness-gradually-diminishing part overlapping the first film-thickness-gradually-diminishing part.

According to the arrangement, it is possible to produce an organic EL display device having the effects of the film formation substrate.

Advantageous Effects of Invention

As described above, a film formation substrate of the present invention includes: a substrate on which first and second film formation regions are alternately provided in a predetermined direction with spaces therebetween; first films each of which is formed on the substrate so as to cover a corresponding one of the first film formation regions; and second films each of which is formed on the substrate so as to cover a corresponding one of the second film formation regions, each of the first films having, at both ends thereof in the predetermined direction, a first film-thickness-gradually-diminishing part whose thickness gradually diminishes towards a front end, in the predetermined direction, of the first film-thickness-gradually-diminishing part, each of the second films having, at both ends thereof in the predetermined direction, a second film-thickness-gradually-diminishing part whose thickness gradually diminishes towards a front end, in the predetermined direction, of the second film-thickness-gradually-diminishing part, and the second film-thickness-gradually-diminishing part overlapping the first film-thickness-gradually-diminishing part.

A film formation substrate of the present invention includes: a substrate on which a plurality of film formation regions are provided in a predetermined direction with spaces therebetween; first films each of which is formed on the substrate so as to cover a corresponding one of the plurality of film formation regions; and second films each of which is formed in a region between the plurality of film formation regions, each of the first films having, at both ends thereof in the predetermined direction, a first film-thickness-gradually-diminishing part whose thickness gradually diminishes towards a front end, in the predetermined direction, of the first film-thickness-gradually-diminishing part, each of the second films having, at both ends thereof in the predetermined direction, a second film-thickness-gradually-diminishing part whose thickness gradually diminishes towards a front end, in the predetermined direction, of the second film-thickness-gradually-diminishing part, and the second film-thickness-gradually-diminishing part overlapping the first film-thickness-gradually-diminishing part.

A production method of the present invention includes the steps of: preparing a substrate on which first and second film formation regions are alternately provided in a predetermined direction with spaces therebetween; (i) disposing, opposite to the substrate, a first vapor deposition mask having a first opening whose width in the predetermined direction is smaller than a width, in the predetermined direction, of the first film formation region so that a center, in the predetermined direction, of the first opening substantially coincides with a center, in the predetermined direction, of the first film formation region, and (ii) depositing vapor deposition particles on the substrate through the first opening so as to form, in the first film formation region, a first film having, at both ends thereof in the predetermined direction, a first film-thickness-gradually-diminishing part whose thickness gradually diminishes towards a front end, in the predetermined direction, of the first film-thickness-gradually-diminishing part; and (i) disposing, opposite to the substrate, a second vapor deposition mask having a second opening so that a center, in the predetermined direction, of the second opening substantially coincides with a center, in the predetermined direction, of the second film formation region, and (ii) depositing the vapor deposition particles on the substrate through the second opening so as to form, in the second film formation region, a second film having, at both ends thereof in the predetermined direction, a second film-thickness-gradually-diminishing part whose thickness gradually diminishes towards a front end, in the predetermined direction, of the second film-thickness-gradually-diminishing part, the second film-thickness-gradually-diminishing part overlapping the first film-thickness-gradually-diminishing part.

It is therefore possible to suppress a decrease in film thickness in film formation regions irrespective of large pattern mispositioning.

Figure 5:
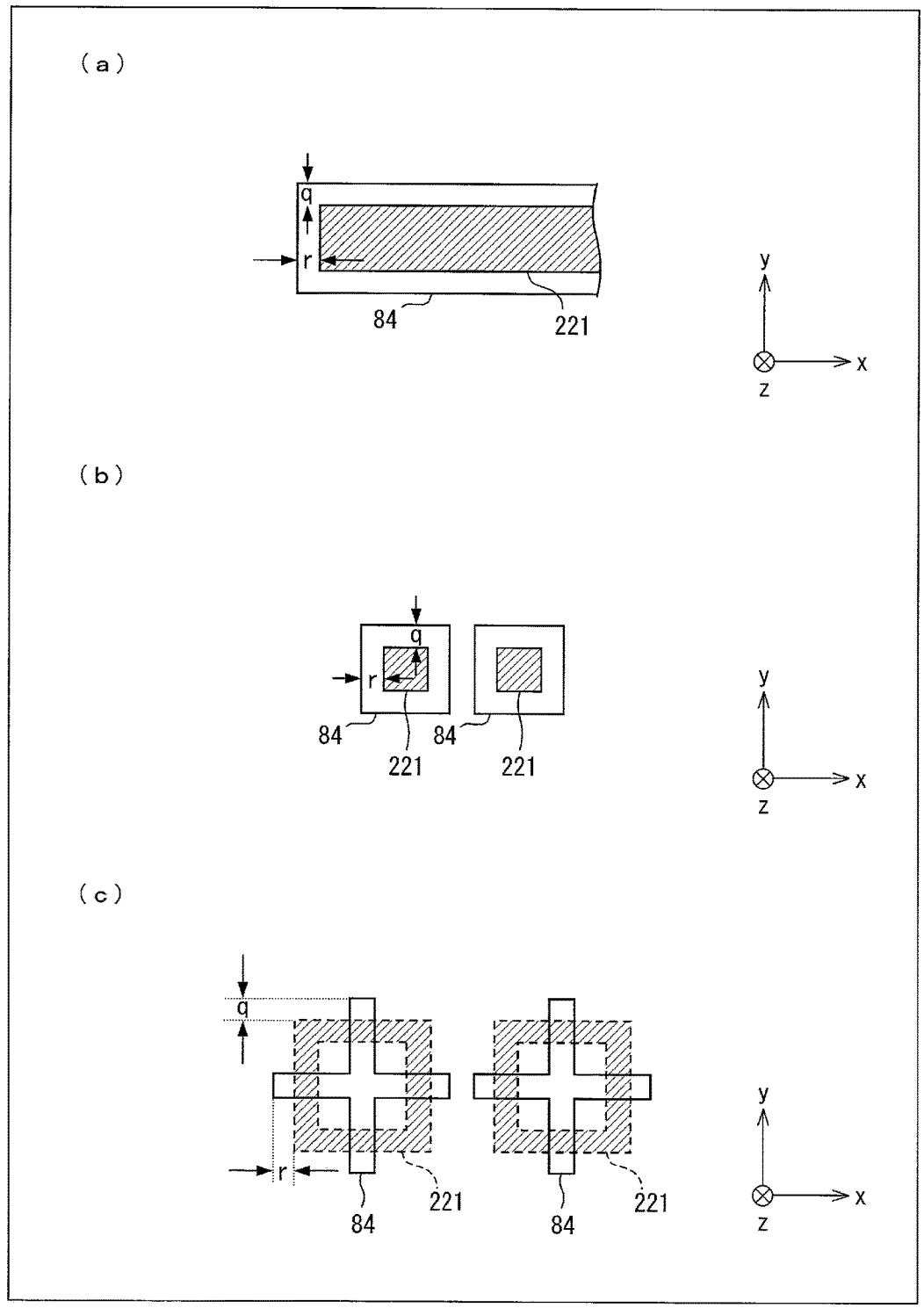

(a) through (c) of FIG. 5 are each a diagram illustrating example shapes of alignment markers provided to the film formation substrate and a vapor deposition mask according to First Embodiment of the present invention.

Figure 6:
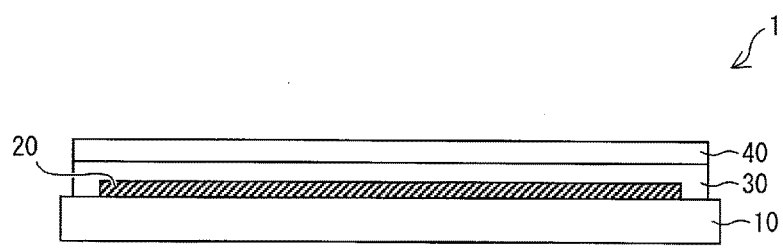

FIG. 6 is a cross-sectional view schematically illustrating a configuration of an organic EL display device for carrying out an RGB full color display.

Figure 7:
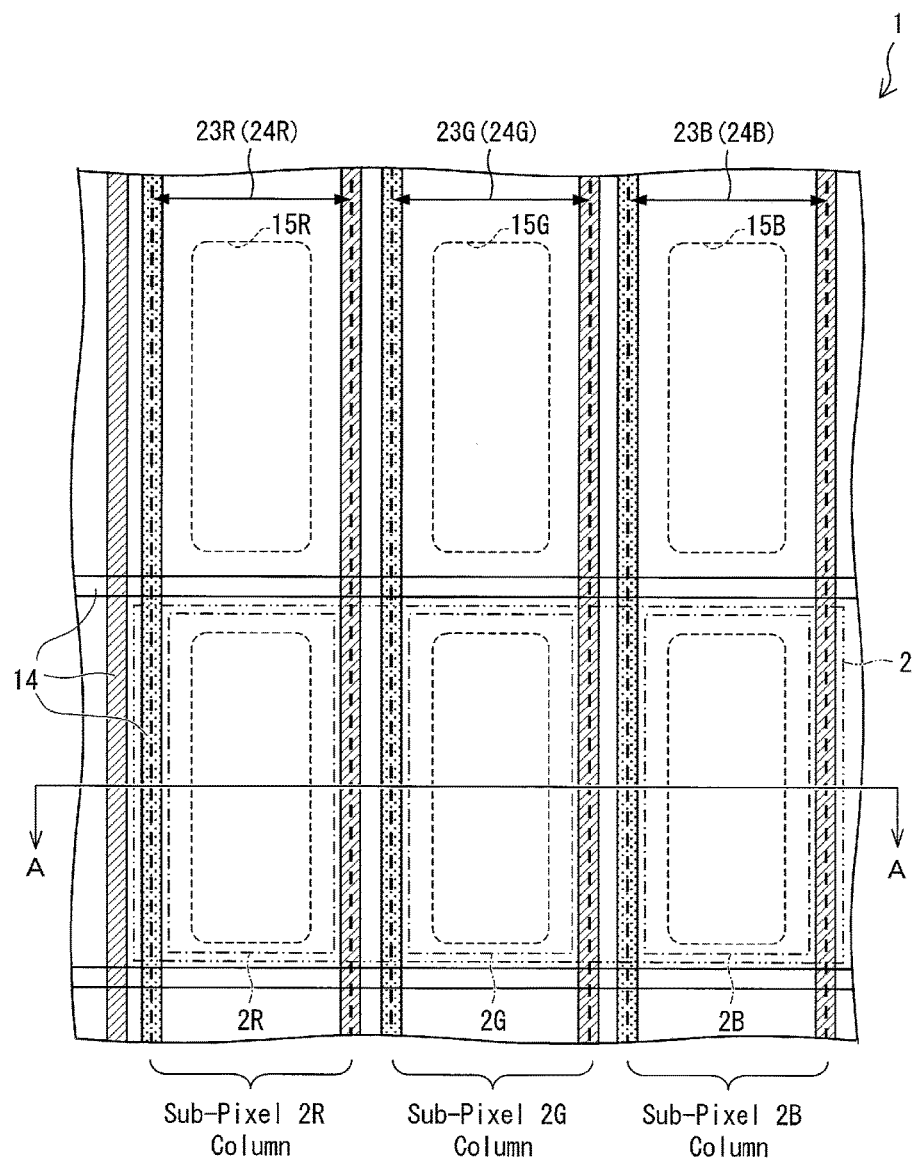

FIG. 7 is a plan view illustrating an arrangement of pixels constituting the organic EL display device illustrated in FIG. 6.

Figure 8:
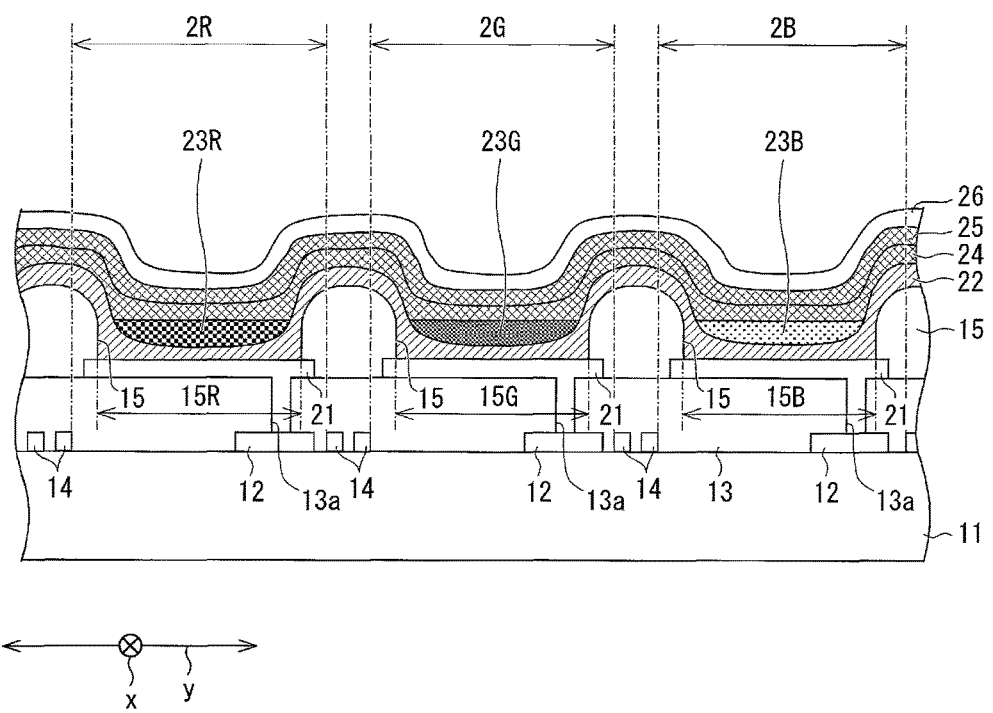

FIG. 8 is a cross-sectional view, taken along line A-A, illustrating a TFT substrate in the organic EL display device illustrated in FIG. 7.

Figure 9:
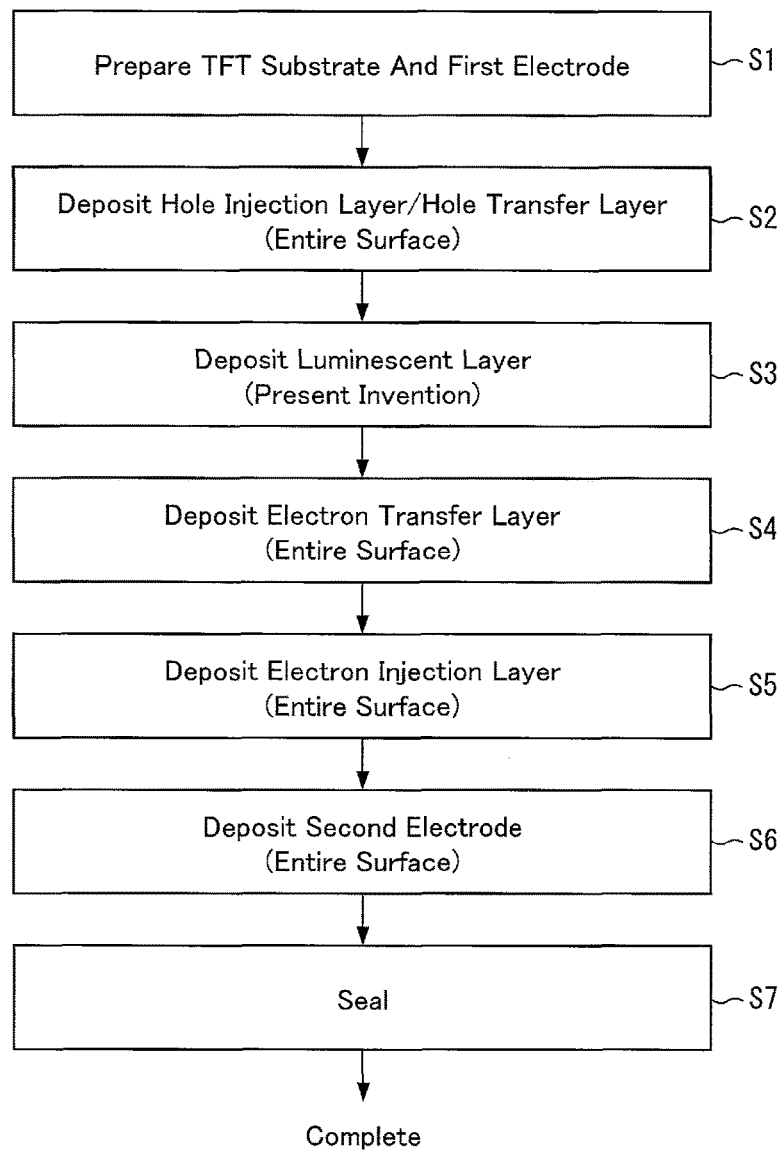

FIG. 9 is a flowchart indicating successive steps for producing the organic EL display device according to First Embodiment of the present invention.

Figure 10:
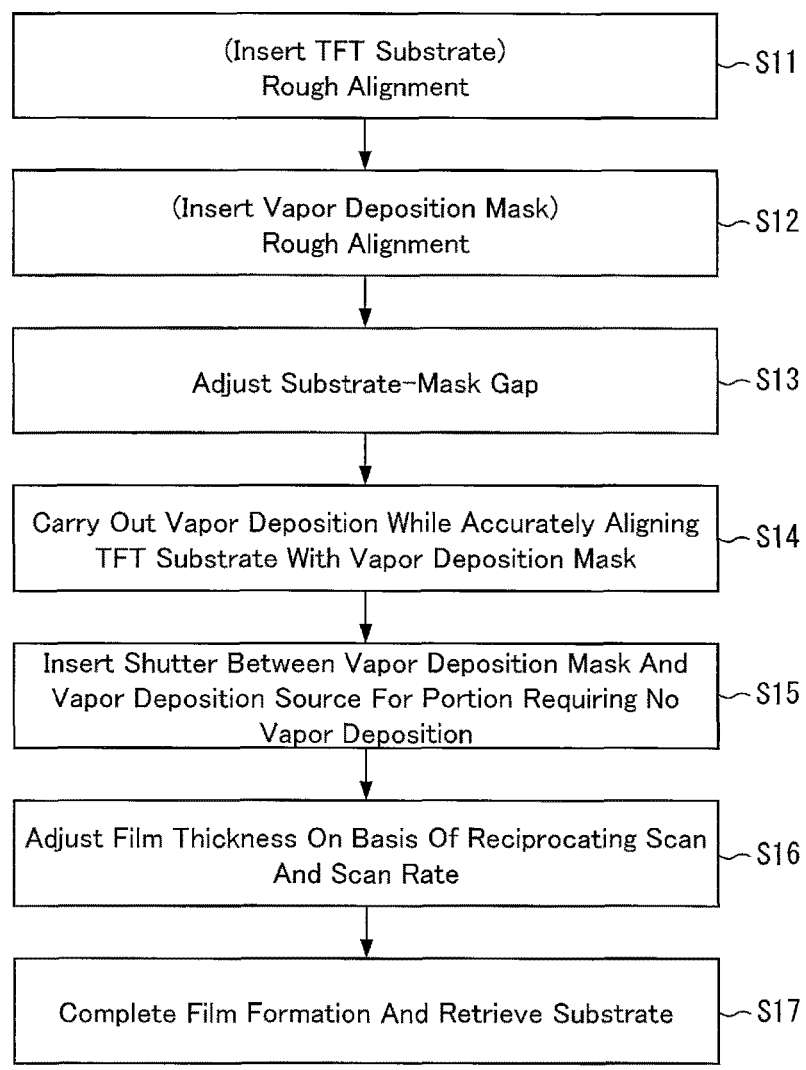

FIG. 10 is a flowchart indicating an example method for forming a predetermined pattern on a TFT substrate with use of the vapor deposition device according to First Embodiment of the present invention.

Figure 11:
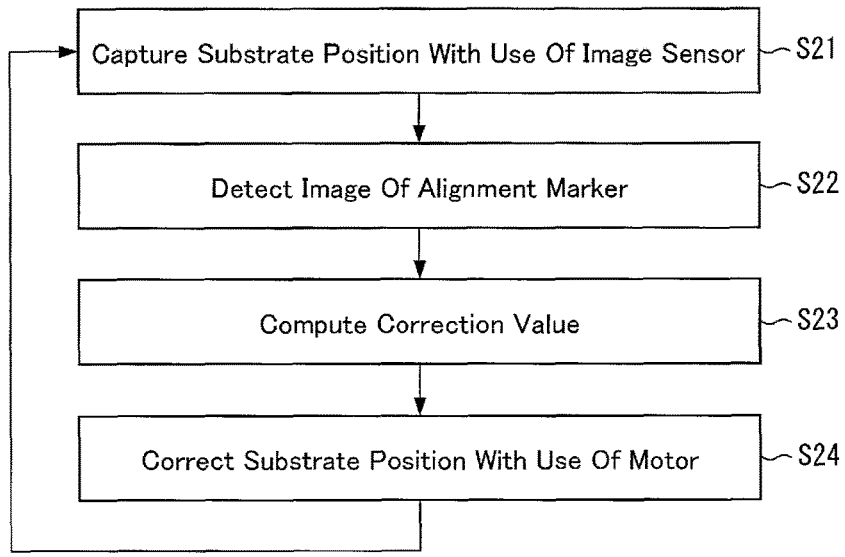

FIG. 11 is a flowchart indicating an alignment adjustment method.

Figure 12:
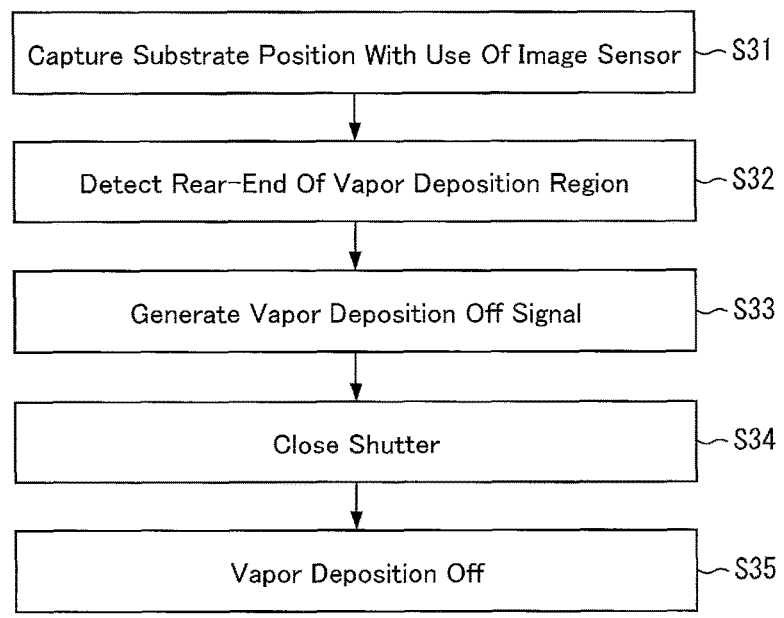

FIG. 12 is a flowchart indicating a flow of a vapor deposition control carried out when vapor deposition is turned OFF.

Figure 13:
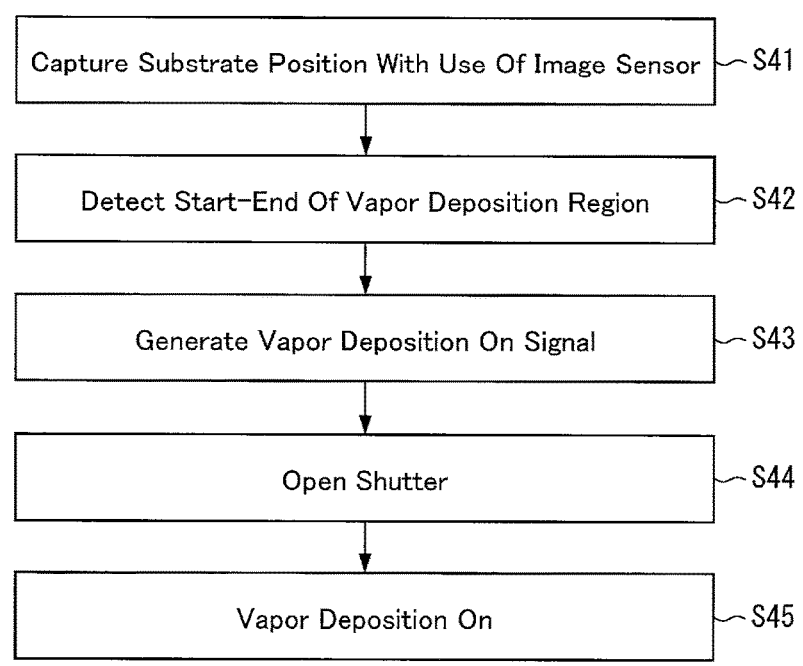

FIG. 13 is a flowchart indicating a flow of a vapor deposition control carried out when vapor deposition is turned ON.

Figure 14:
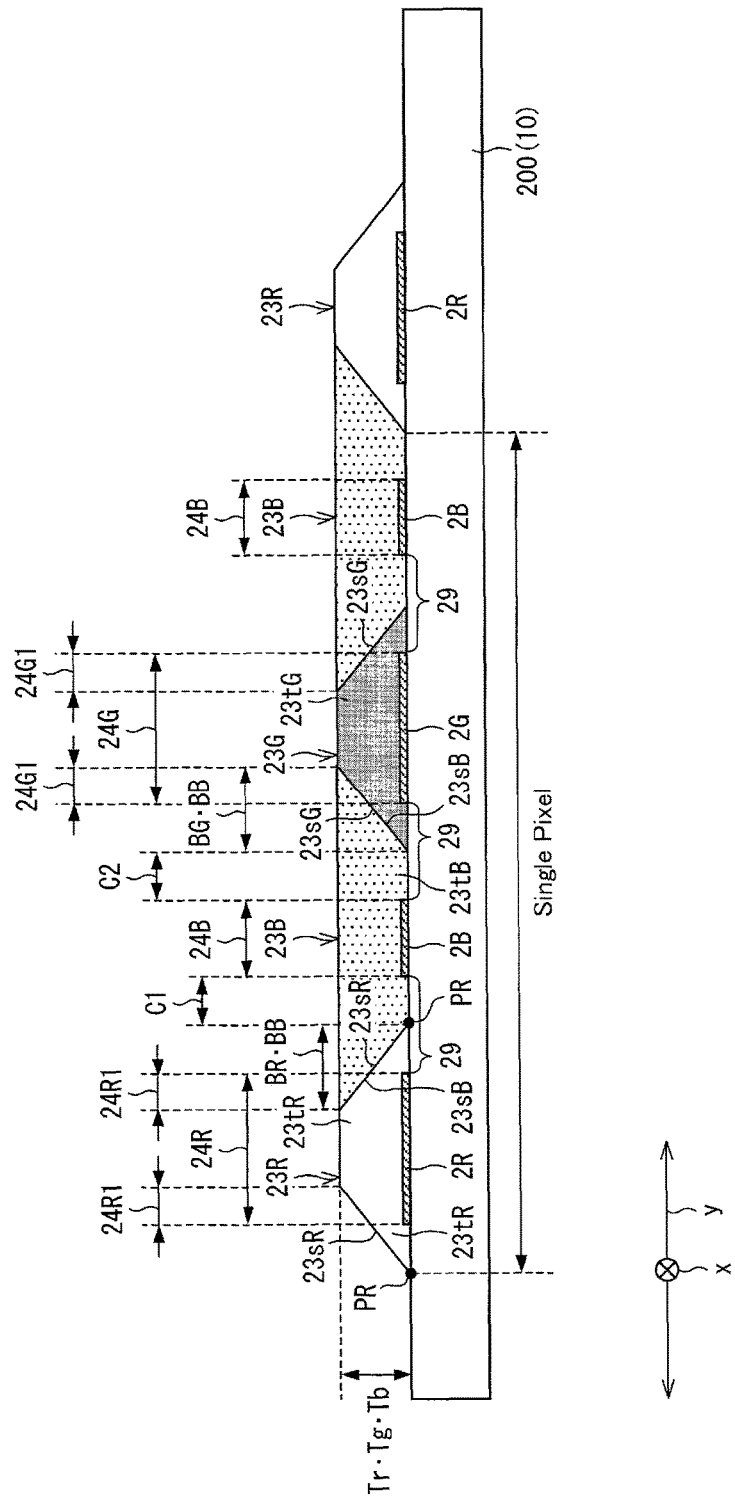

FIG. 14 is a diagram illustrating an example of a relationship among a shadow mask, luminescent regions, and luminescent layers in First Embodiment of the present invention.

Figure 15:
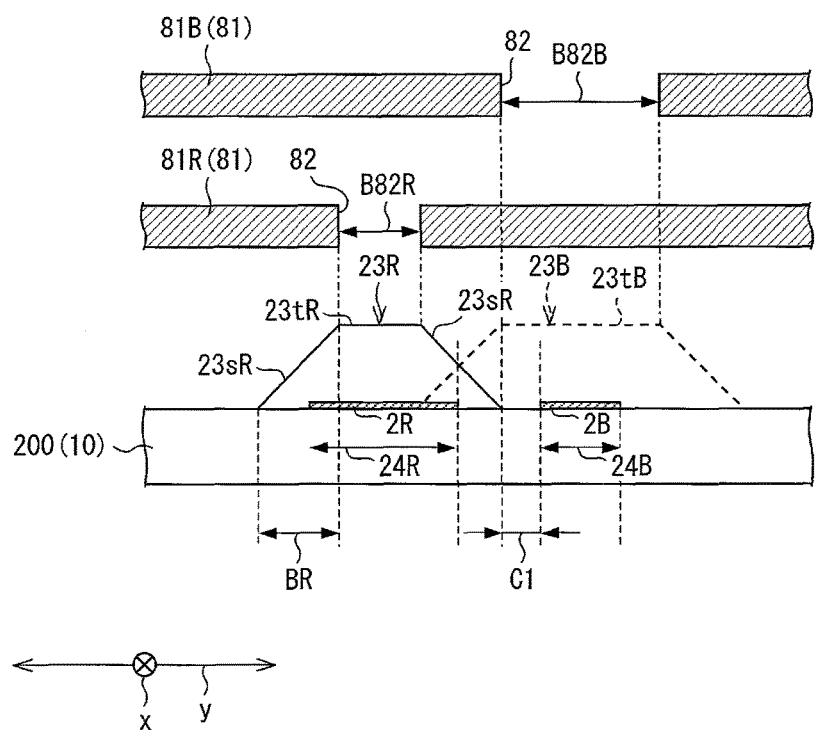

FIG. 15 is a cross-sectional view schematically illustrating luminescent layers of First Embodiment of the present invention.

Figure 16:
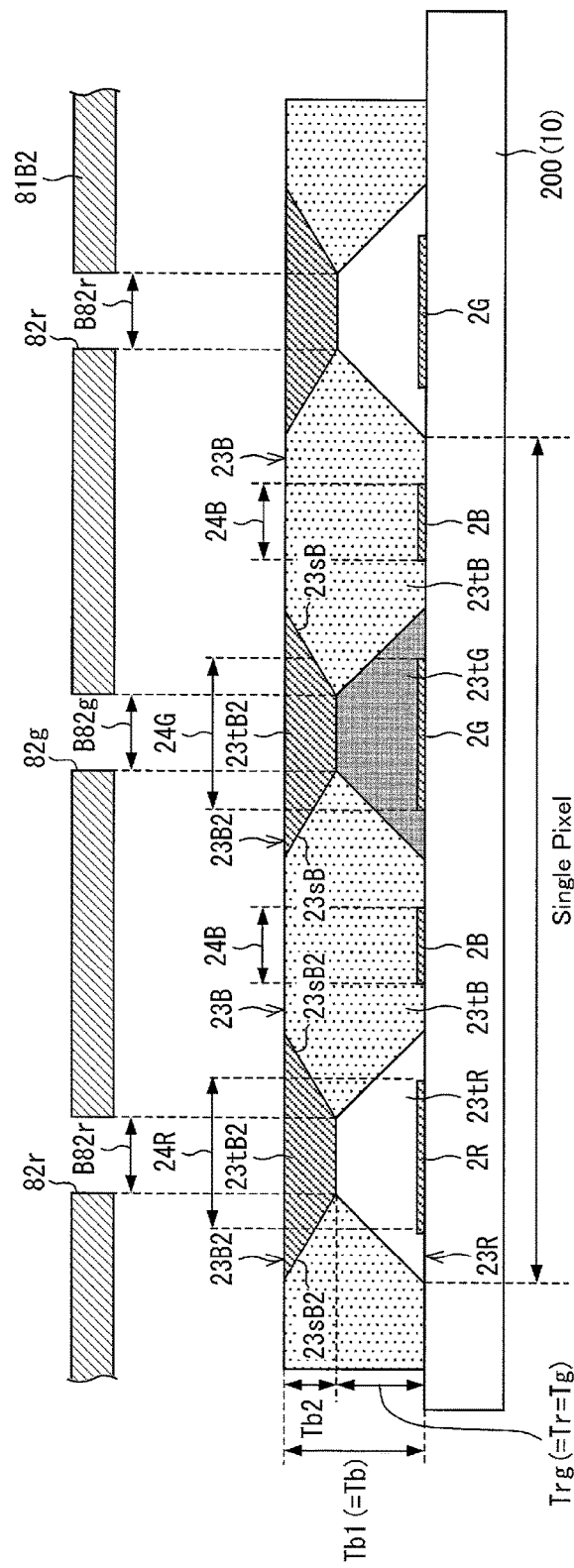

FIG. 16 is a cross-sectional view schematically illustrating luminescent layers of Second Embodiment of the present invention.

Figure 17:
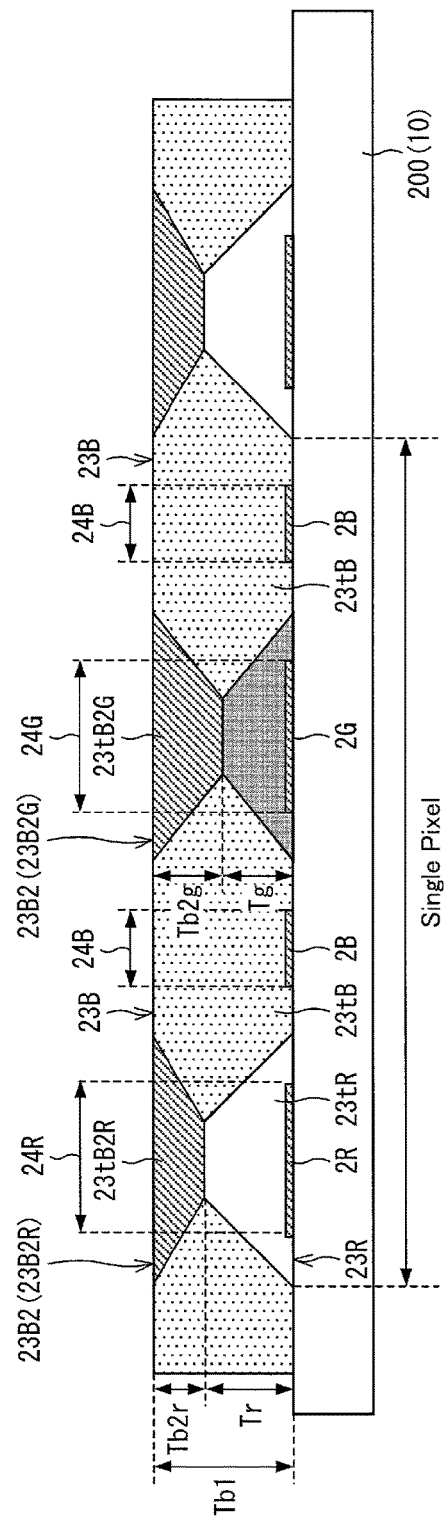

FIG. 17 is a cross-sectional view schematically illustrating luminescent layers of Third Embodiment of the present invention.

Figure 18:
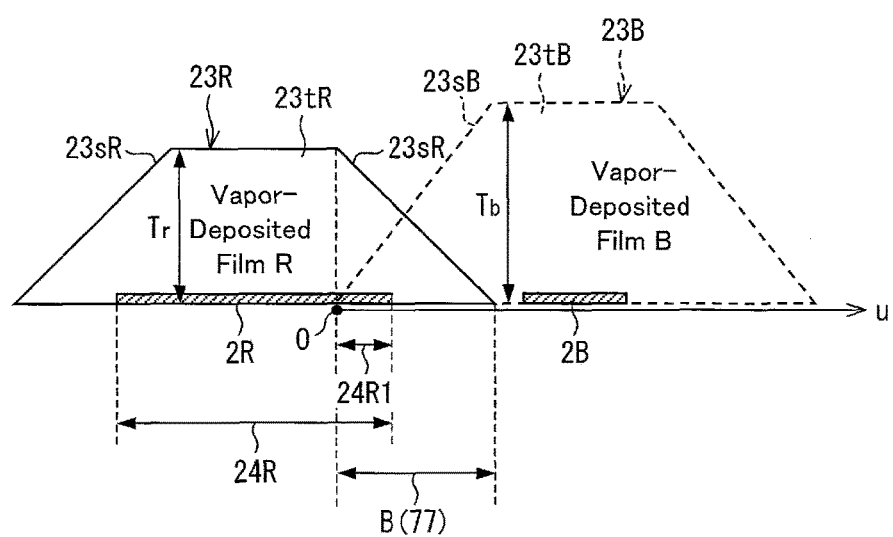

FIG. 18 is a diagram for explaining a relationship between resistances, in a film thickness direction, of respective luminescent layers of Fourth Embodiment of the present invention.

Figure 19:
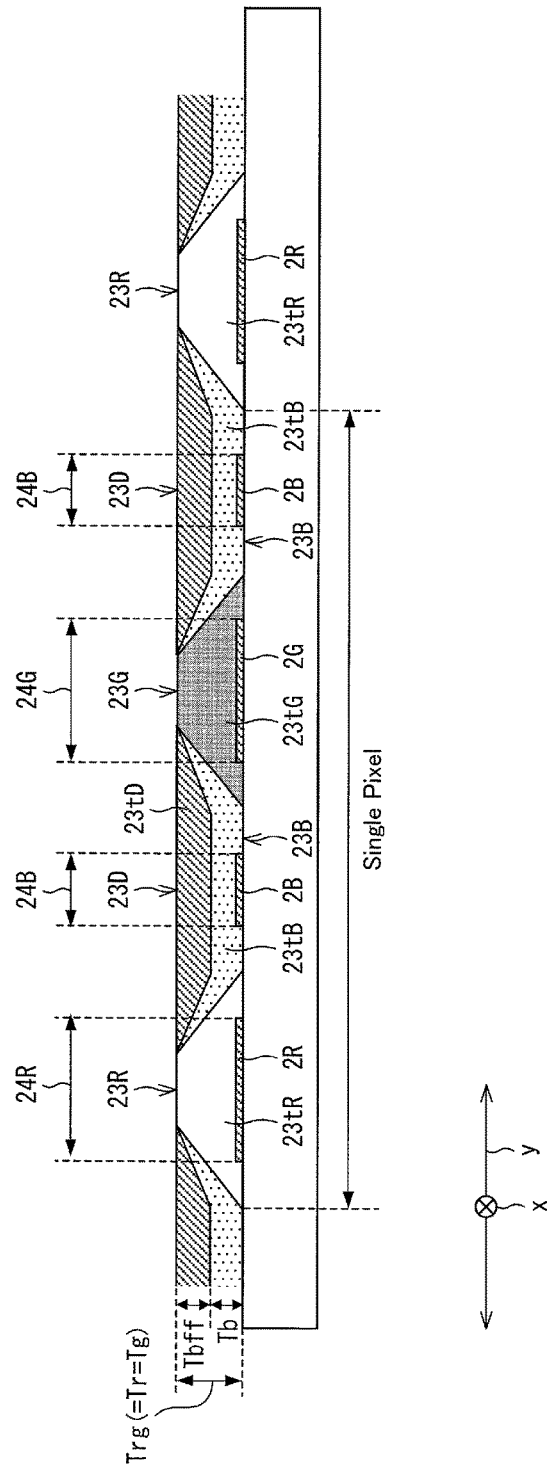

FIG. 19 is a cross-sectional view schematically illustrating luminescent layers of Fifth Embodiment of the present invention.

Figure 20:
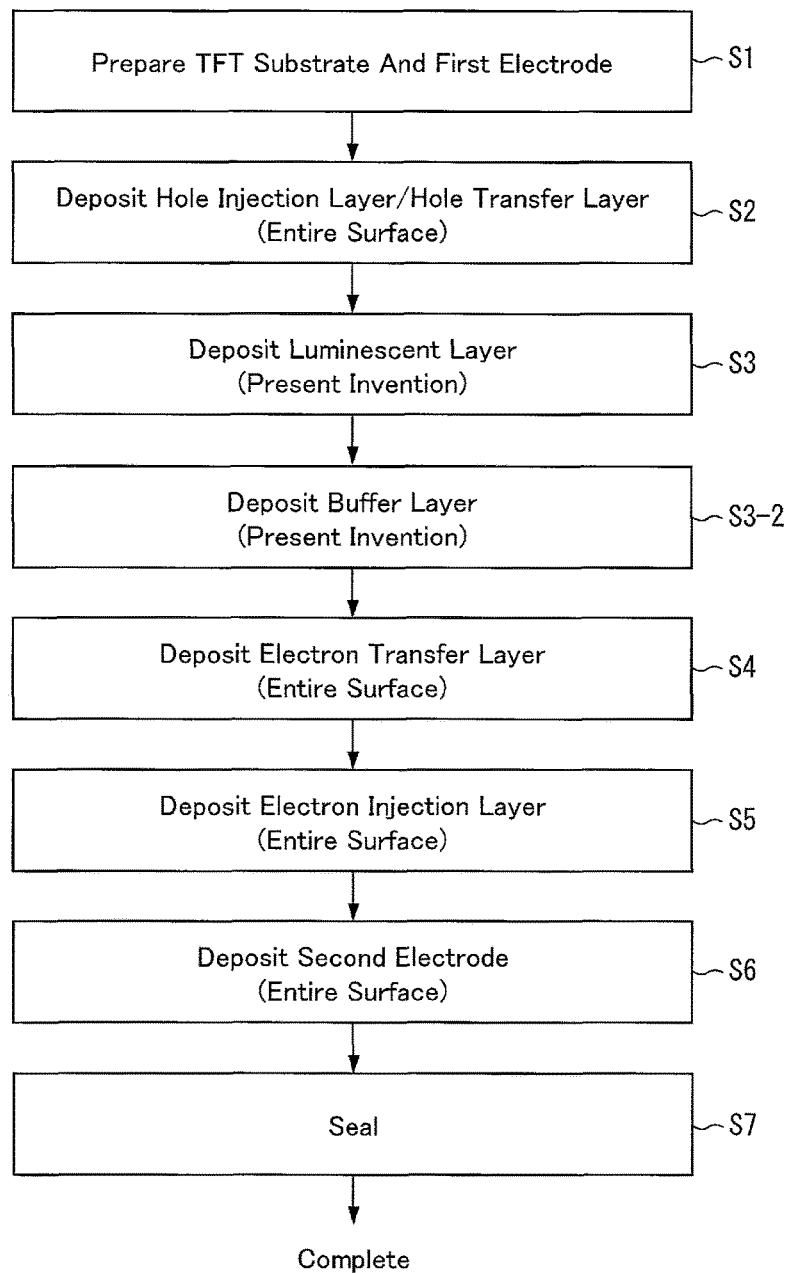

FIG. 20 is a flowchart showing steps of a process for producing an organic EL display device of Fifth Embodiment of the present invention.

Figure 21:
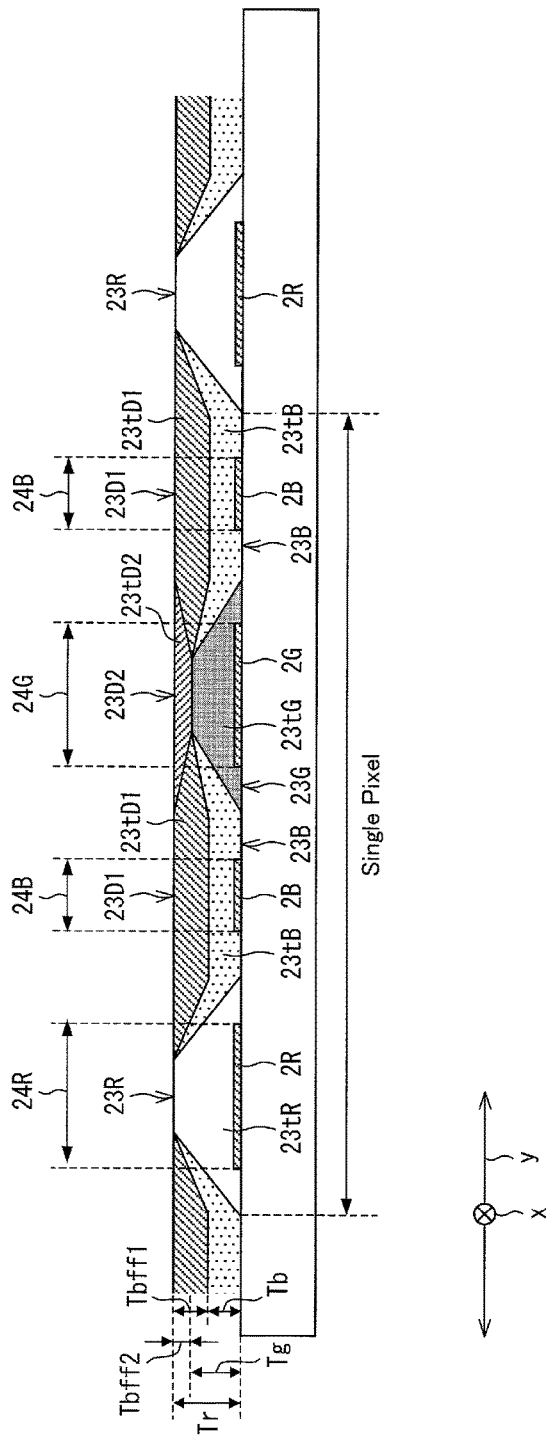

FIG. 21 is a cross-sectional view schematically illustrating luminescent layers of Sixth Embodiment of the present invention.

Figure 22:
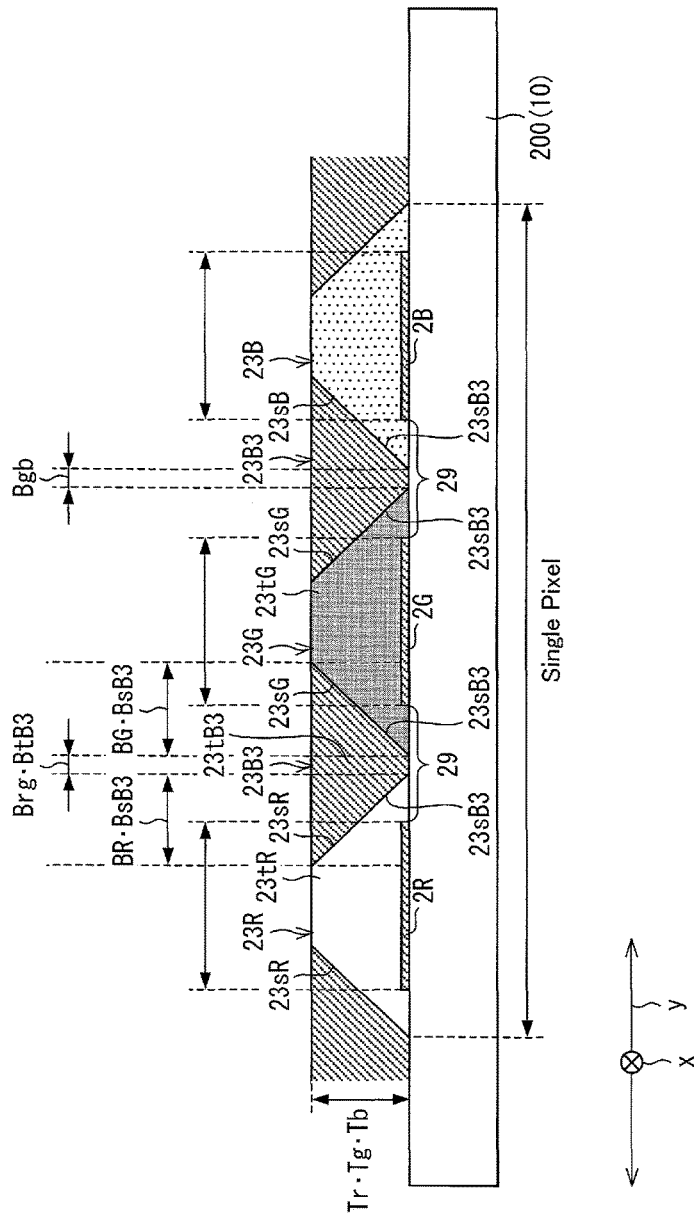

FIG. 22 is a cross-sectional view schematically illustrating luminescent layers of Seventh Embodiment of the present invention.

Figure 23:
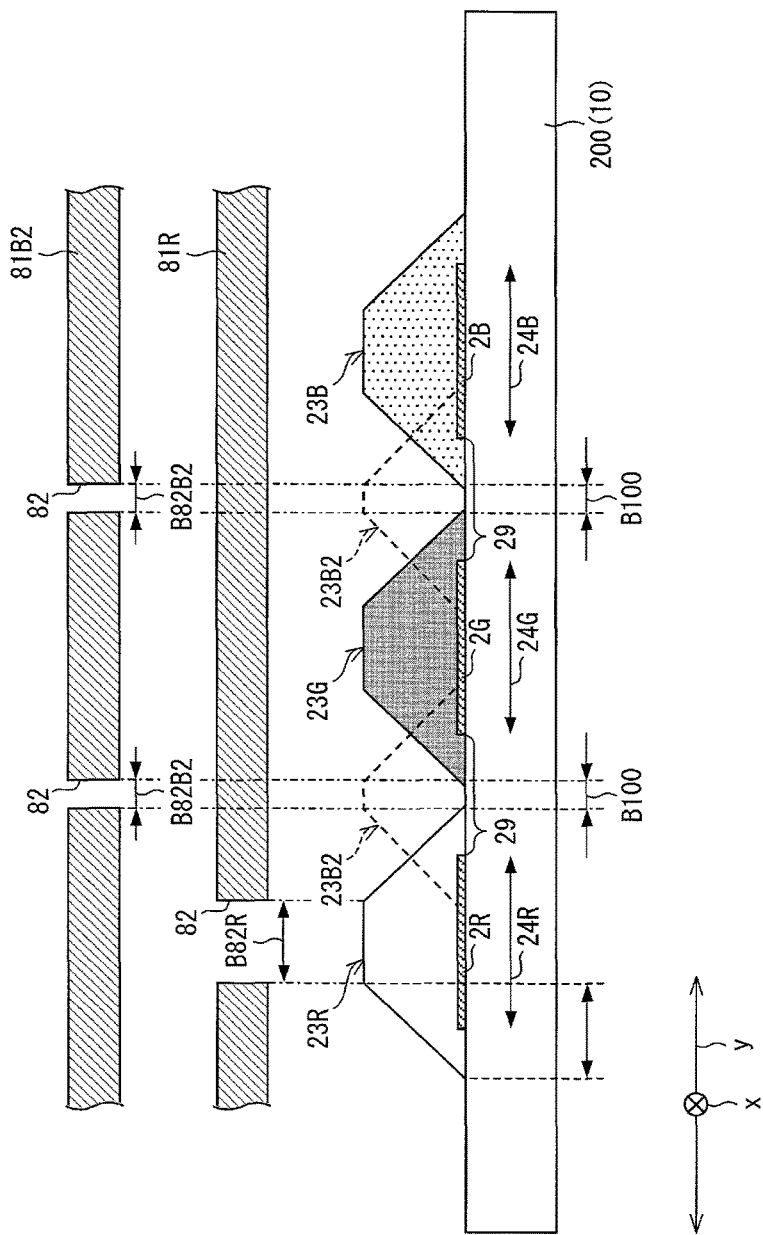

FIG. 23 is a diagram illustrating an example of a relationship among a shadow mask, luminescent regions, and luminescent layers in Seventh Embodiment of the present invention.

Figure 24:
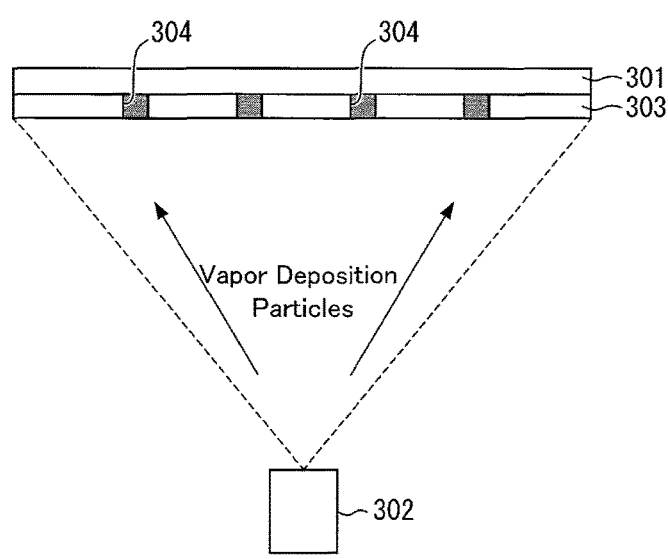

FIG. 24 is a diagram for explaining a conventional vapor deposition method.

Figure 25:
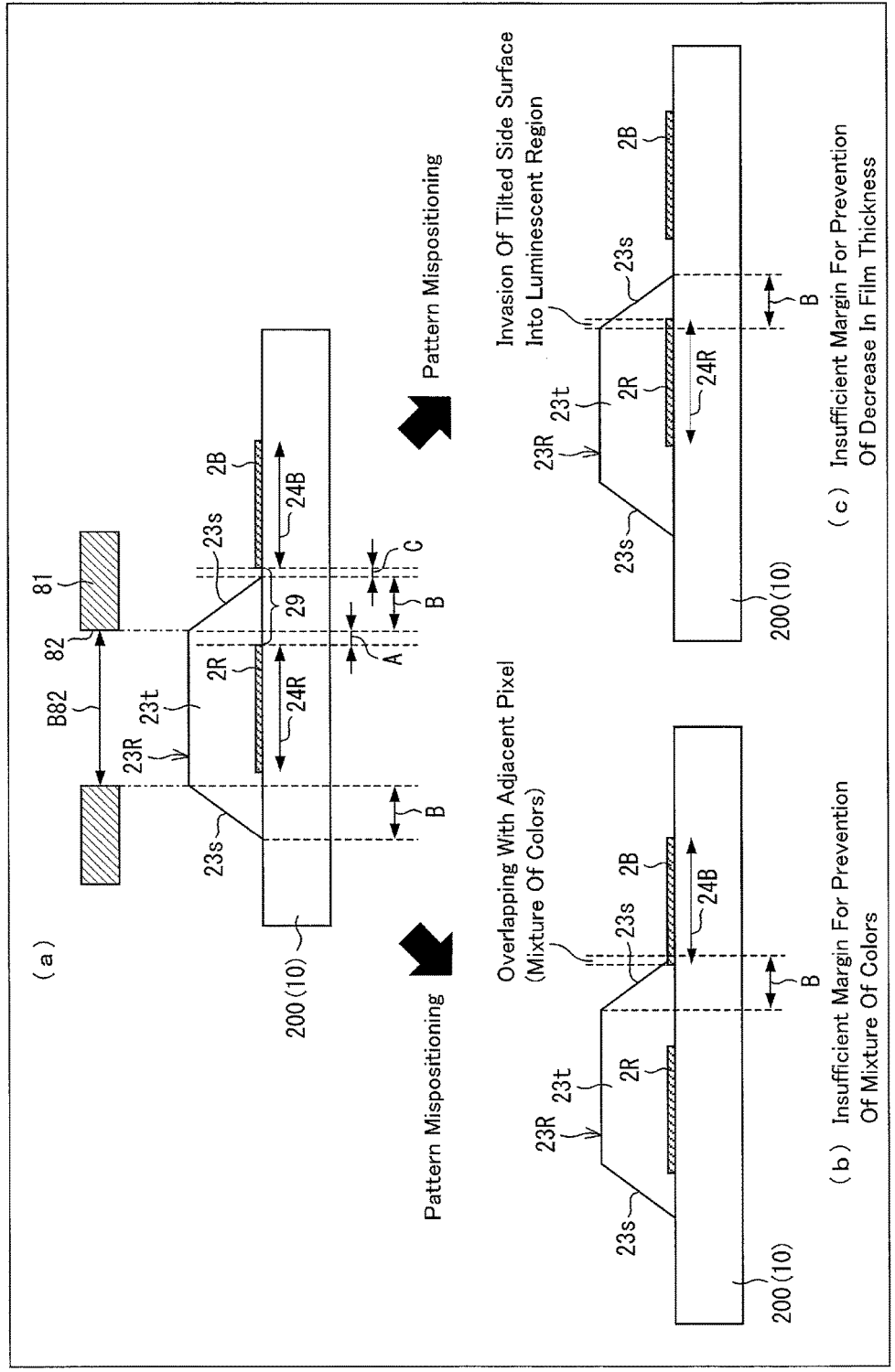

FIG. 25 is a diagram for explaining problems of a conventional art. (a) of FIG. 25 is a diagram illustrating a state where there occurs no pattern mispositioning, (b) of FIG. 25 is a diagram illustrating a state where a color mixture prevention margin is insufficient against pattern mispositioning, and (c) of FIG. 25 is a diagram illustrating a state where a film thickness decrease prevention margin is insufficient against pattern mispositioning.

DESCRIPTION OF EMBODIMENTS

Embodiments of the present invention are described below in detail.

First Embodiment

An embodiment of the present invention is described below with reference to FIGS. 1 through 15.

The present embodiment describes, as an example vapor deposition method involving a vapor deposition device of the present embodiment, a method for producing an organic EL display device that (i) is of a bottom emission type, that is, extracts light from a TFT substrate side, and that (ii) carries out an RGB full color display.

The description first deals with the overall configuration of the organic EL display device.

FIG. 6 is a cross-sectional view schematically illustrating a configuration of the organic EL display device that carries out an RGB full color display. FIG. 7 is a plan view illustrating an arrangement of pixels included in the organic EL display device illustrated in FIG. 6. FIG. 8 is a cross-sectional view, taken long line A-A in FIG. 7, of a TFT substrate included in the organic EL display device illustrated in FIG. 7.

As illustrated in FIG. 6, the organic EL display device 1 produced in the present embodiment includes: a TFT substrate 10 including TFTs 12 (see FIG. 8); organic EL elements 20 provided on the TFT substrate 10 and connected to the TFTs 12; an adhesive layer 30; and a sealing substrate 40 arranged in that order.

The organic EL elements 20, as illustrated in FIG. 6, are contained between the TFT substrate 10 and the sealing substrate 40 by attaching the TFT substrate 10, on which the organic EL elements 20 are provided, to the sealing substrate 40 with use of the adhesive layer 30.

The organic EL display device 1, in which the organic EL elements 20 are contained between the TFT substrate 10 and the sealing substrate 40 as described above, prevents infiltration of oxygen, moisture and the like present outside into the organic EL elements 20.

As illustrated in FIG. 8, the TFT substrate 10 includes, as a supporting substrate, a transparent insulating substrate 11 such as a glass substrate. The insulating substrate 11 is, as illustrated in FIG. 7, provided with a plurality of wires 14 including (i) a plurality of gate lines laid in the horizontal direction and (ii) a plurality of signal lines laid in the vertical direction and intersecting with the gate lines. The gate lines are connected to a gate line driving circuit (not shown in the drawings) that drives the gate lines, whereas the signal lines are connected to a signal line driving circuit (not shown in the drawings) that drives the signal lines.

The organic EL display device 1 is a full-color, active matrix organic EL display device. The organic EL display device 1 includes, on the insulating substrate 11 and in regions defined by the wires 14, sub-pixels 2R, 2G, and 2B arranged in a matrix which include organic EL elements 20 of red (R), green (G), and blue (B), respectively.

In other words, the regions defined by the wires 14 each (i) correspond to a single sub-pixel (dot) and (ii) provide a luminescent region 24R, 24G, or 24B of R, G, or B for each sub-pixel.

A pixel 2 (that is, a single pixel) includes three sub-pixels: a red sub-pixel 2R transmitting red light; a green sub-pixel 2G transmitting green light; and a blue sub-pixel 2B transmitting blue light.

The sub-pixels 2R, 2G, and 2B include, as luminescent regions 24R, 24G, and 24B of the respective colors which luminescent regions 24R, 24G, and 24B perform light emission of the respective sub-pixels 2R, 2G, and 2B, openings 15R, 15G, and 15B that are covered respectively by stripe-shaped luminescent layers 23R, 23G, and 23B of the respective colors. Note that each of the luminescent regions 24R, 24G, and 24B is formed in a stripe shape. Each of the luminescent layers 23R, 23G, and 23B is formed in a stripe shape by being formed on the luminescent regions 24R, 24G, and 24B, respectively.

The luminescent layers 23R, 23G, and 23B are each formed in a pattern by vapor deposition. The openings 15R, 15G, and 15B are described below in detail.

The sub-pixels 2R, 2G, and 2B include respective TFTs 12 each connected to a first electrode 21 of a corresponding one of the organic EL elements 20. The sub-pixels 2R, 2G, and 2B each have an emission intensity that is determined by scan through the wires 14 and selection of the TFTs 12. As described above, the organic EL display device 1 carries out an image display by selectively causing the organic EL elements 20 to emit, by use of the TFTs 12, light with desired luminance.

The following describes in detail respective configurations of the TFT substrate 10 and each of the organic EL elements 20 both included in the organic EL display device 1.

The description below first deals with the TFT substrate 10.

The TFT substrate 10, as illustrated in FIG. 8, includes on a transparent insulating substrate 11 such as a glass substrate: TFTs 12 (switching elements); an interlayer film (interlayer insulating film; planarizing film); wires 14, and an edge cover 15, formed in that order.

The insulating substrate 11 is provided thereon with (i) wires 14 and (ii) TFTs 12 corresponding respectively to the sub-pixels 2R, 2G, and 2B. Since the configuration of a TFT has conventionally been well known, the individual layers of a TFT 12 are not illustrated in the drawings or described herein.

The interlayer film 13 is provided on the insulating substrate 11 throughout the entire region of the insulating substrate 11 to cover the TFTs 12.

There are provided on the interlayer film 13 first electrodes 21 of the organic EL elements 20.

The interlayer film 13 has contact holes 13a for electrically connecting the first electrodes 21 of the organic EL elements 20 to the TFTs 12. This electrically connects the TFTs 12 to the organic EL elements 20 via the contact holes 13a.

The edge cover 15 is an insulating layer for preventing the first electrode 21 and a second electrode 26 of a corresponding organic EL element 20 from short-circuiting with each other due to, for example, (i) a reduced thickness of the organic EL layer in an edge section of the pattern of the first electrode 21 or (ii) an electric field concentration.

The edge cover 15 is so formed on the interlayer film as to cover edge sections of the pattern of the first electrode 21.

The edge cover 15 has openings 15R, 15G, and 15B for the sub-pixels 2R, 2G, and 2B, respectively. The openings 15R, 15G, and 15B of the edge cover 15 define the respective luminescent regions 24R, 24G, and 24B of the sub-pixels 2R, 2G, and 2B.

The sub-pixels 2R, 2G, and 2B are, in other words, isolated from one another by the insulating edge cover 15. The edge cover 15 thus functions as an element isolation film as well.

FIG. 8 illustrates an example in which the edge cover 15 functions as an element isolation film for isolating the sub-pixels 2R, 2G, and 2B from one another. Note, however, that the edge cover 15 does not necessarily need to function as an element isolation film. The following description assumes a case where the edge cover 15 is formed to be thin so as not to function as an element isolation film. In this case, the edge cover 15 can be omitted.

The description below now deals with each of the organic EL elements 20.

The organic EL element 20 is a light-emitting element capable of high-luminance light emission based on low-voltage direct-current driving, and includes: a first electrode 21; an organic EL layer; and a second electrode 26, provided on top of one another in that order.

The first electrode 21 is a layer having the function of injecting (supplying) positive holes into the organic EL layer. The first electrode 21 is, as described above, connected to the TFTs 12 via the contact holes 13a.

The organic EL layer provided between the first electrode 21 and the second electrode 26 includes, as illustrated in FIG. 8: a hole injection layer/hole transfer layer 22; luminescent layers 23R, 23G, and 23B; an electron transfer layer 24; and an electron injection layer 25, formed in that order from the first electrode 21 side.

The above stack order intends to use (i) the first electrode 21 as an anode and (ii) the second electrode 26 as a cathode. The stack order of the organic EL layer is reversed in the case where the first electrode 21 serves as a cathode and the second electrode 26 serves as an anode.

The hole injection layer has the function of increasing efficiency in injecting positive holes into the luminescent layers 23R, 23G, and 23B. The hole transfer layer has the function of increasing efficiency in transferring positive holes to the luminescent layers 23R, 23G, and 23B. The hole injection layer/hole transfer layer 22 is so formed uniformly throughout the entire display region of the TFT substrate 10 as to cover the first electrode 21 and the edge cover 15.

The present embodiment describes an example case involving, as the hole injection layer and the hole transfer layer, a hole injection layer/hole transfer layer 22 that integrally combines a hole injection layer with a hole transfer layer as described above. The present embodiment is, however, not limited to such an arrangement: The hole injection layer and the hole transfer layer may be provided as separate layers independent of each other.

There are provided on the hole injection layer/hole transfer layer 22 the luminescent layers 23R, 23G, and 23B so formed in correspondence with the respective sub-pixels 2R, 2G, and 2B as to cover the respective openings 15R, 15G, and 15B of the edge cover 15.

The luminescent layers 23R, 23G, and 23B are each a layer that has the function of emitting light by recombining (i) holes (positive holes) injected from the first electrode 21 side with (ii) electrons injected from the second electrode 26 side. The luminescent layers 23R, 23G, and 23B are each made of a material with high luminous efficiency, such as a low-molecular fluorescent dye and a metal complex.

More specifically, the luminescent layers 23R, 23G, and 23B are formed as illustrated in FIG. 14. That is, in FIG. 14, the luminescent layers 23R (red (R)), 23G (green (G)), and 23B (blue (B)) are, for example, formed in the order of 23R, 23B, 23G, and 23B from the left hand. This means that the present embodiment employs an arrangement in which sub-pixels 2R, 2B, 2G, and 2B arranged in this order constitute a single pixel.

The luminescent layer 23R (first film) has, at both ends thereof in a y-axis direction (predetermined direction), a film-thickness-gradually-diminishing part 23sR whose thickness gradually diminishes towards a front end in the y-axis direction of the film-thickness-gradually-diminishing part 23sR. A base end of the film-thickness-gradually-diminishing part 23sR in the y-axis direction overlaps the luminescent region (first film formation region) 24R. The front end PR of the film-thickness-gradually-diminishing part 23sR is located in a region (non-luminescent region) 29 between the luminescent region 24R and an adjacent luminescent region 24B at the same side of the film-thickness-gradually-diminishing part 23sR. A distance (i.e., a color mixture prevention margin) C1 between the luminescent layer 23R and the luminescent region 24B of the adjacent sub-pixel 2B is wider than an acceptable pattern mispositioning amount (i.e., an estimated maximum mispositioning amount) of the luminescent layer 23R.

Similarly, the luminescent layer 23G (first film) has, at both ends thereof in the y-axis direction (predetermined direction), a film-thickness-gradually-diminishing part 23sG whose thickness gradually diminishes towards a front end in the y-axis direction of the film-thickness-gradually-diminishing part 23sG. A base end of the film-thickness-gradually-diminishing part 23sG overlaps a luminescent region (first film formation region) 24G. The front end of the film-thickness-gradually-diminishing part 23sG is located in a region (non-luminescent region) 29 between the luminescent region 24G and an adjacent luminescent region 24B at the same side of the film-thickness-gradually-diminishing part 23sG. A distance C2 between the luminescent layer 23G and the luminescent region 24B of the adjacent sub-pixel 2B is wider than an acceptable pattern mispositioning amount (i.e., an estimated maximum mispositioning amount) of the luminescent layer 23G.

Meanwhile, the luminescent layer 23B (second film) has, at both ends thereof in the y-axis direction, a film-thickness-gradually-diminishing part 23sB whose thickness gradually diminishes towards a front end in the y-axis direction of the film-thickness-gradually-diminishing part 23sB. The film-thickness-gradually-diminishing part 23sB is located outside a luminescent region 24B (second film formation region) in the y-axis direction and overlaps the film-thickness-gradually-diminishing part 23sR or 23sG of the luminescent layer 23R or 23G at the same side of film-thickness-gradually-diminishing part 23sB to compensate for a gradually diminished thickness of the film-thickness-gradually-diminishing part 23sR or 23sG of the luminescent layer 23R or 23G.

Note that substantially flat parts (parts other than the film-thickness-gradually-diminishing parts 23sR, 23sG, and 23sB) 23tR, 23tG, and 23tB of the luminescent layers 23R, 23G, and 23B have equal thicknesses Tr, Tg, and Tb. Note also that the film-thickness-gradually-diminishing parts 23sR, 23sG, and 23sB have equal widths BR, BG, and BB in the y-axis direction. Accordingly, the film-thickness-gradually-diminishing parts 23sR, 23sG, and 23sB are equal in inclination.

The widths BR and BG of the film-thickness-gradually-diminishing parts 23sR and 23sG of the luminescent layers 23R and 23G, respectively, are, for example, set to be larger than widths, in the same direction, of the regions 29 between the luminescent regions 24R and 24G and adjacent luminescent regions 24B at the same side of the film-thickness-gradually-diminishing parts 23sR and 23sG, respectively.

The electron transfer layer 24 is a layer that has the function of increasing efficiency in transferring electrons from the second electrode 26 to the luminescent layers 23R, 23G, and 23B. The electron injection layer 25 is a layer that has the function of increasing efficiency in injecting electrons from the second electrode 26 into the electron transfer layer 24.

The electron transfer layer 24 is so provided on the luminescent layers 23R, 23G, and 23B and the hole injection layer/hole transfer layer 22 uniformly throughout the entire display region of the TFT substrate 10 as to cover the luminescent layers 23R, 23G, and 23B and the hole injection layer/hole transfer layer 22. The electron injection layer 25 is so provided on the electron transfer layer 24 uniformly throughout the entire display region of the TFT substrate 10 as to cover the electron transfer layer 24.

The electron transfer layer 24 and the electron injection layer 25 may be provided either (i) as separate layers independent of each other as described above or (ii) integrally with each other. In other words, the organic EL display device 1 may include an electron transfer layer/electron injection layer instead of the electron transfer layer 24 and the electron injection layer 25.

The second electrode 26 is a layer having the function of injecting electrons into the organic EL layer including the above organic layers. The second electrode 26 is so provided on the electron injection layer 25 uniformly throughout the entire display region of the TFT substrate 10 as to cover the electron injection layer 25.

The organic layers other than the luminescent layers 23R, 23G, and 23B are not essential for the organic EL layer, and may thus be included as appropriate in accordance with a required property of the organic EL element 20. The organic EL layer may further include a carrier blocking layer according to need. The organic EL layer can, for example, additionally include, as a carrier blocking layer, a hole blocking layer between the luminescent layers 23R, 23G, and 23B and the electron transfer layer 24 to prevent positive holes from transferring from the luminescent layers 23R, 23G, and 23B to the electron transfer layer 24 and thus to improve luminous efficiency.

The organic EL element 20 can have, for example, any of the layered structures (1) through (8) below.

(1) first electrode/luminescent layer/second electrode
(2) first electrode/hole transfer layer/luminescent layer/electron transfer layer/second electrode (3) first electrode/hole transfer layer/luminescent layer/hole blocking layer (carrier blocking layer)/electron transfer layer/second electrode (4) first electrode/hole transfer layer/luminescent layer/hole blocking layer/electron transfer layer/electron injection layer/second electrode (5) first electrode/hole injection layer/hole transfer layer/luminescent layer/electron transfer layer/electron injection layer/second electrode (6) first electrode/hole injection layer/hole transfer layer/luminescent layer/hole blocking layer/electron transfer layer/second electrode (7) first electrode/hole injection layer/hole transfer layer/luminescent layer/hole blocking layer/electron transfer layer/electron injection layer/second electrode (8) first electrode/hole injection layer/hole transfer layer/electron blocking layer (carrier blocking layer)/luminescent layer/hole blocking layer/electron transfer layer/electron injection layer/second electrode As described above, the hole injection layer and the hole transfer layer, for example, may be integrated with each other. The electron transfer layer and the electron injection layer may be integrated with each other.

The structure of the organic EL element 20 is not limited to the above example layered structure, and may be a desired layered structure according to a required property of the organic EL element 20 as described above.

The description below deals with a method for producing the organic EL display device 1.

FIG. 9 is a flowchart indicating successive steps for producing the organic EL display device 1.

As illustrated in FIG. 9, the method of the present embodiment for producing the organic EL display device 1 includes steps such as a TFT substrate and first electrode preparing step (S1), a hole injection layer/hole transfer layer vapor deposition step (S2), a luminescent layer vapor deposition step (S3), an electron transfer layer vapor deposition step (S4), an electron injection layer vapor deposition step (S5), a second electrode vapor deposition step (S6), and a sealing step (S7).

The following describes, with reference to the flowchart illustrated in FIG. 9, the individual steps described above with reference to FIGS. 6 and 8.

Note, however, that the dimensions, materials, shapes and the like of the respective constituent elements described in the present embodiment merely serve as an embodiment, and that the scope of the present invention should not be construed limitedly on the grounds of such aspects of the constituent elements.

The stack order described in the present embodiment, as mentioned above, intends to use (i) the first electrode 21 as an anode and (ii) the second electrode 26 as a cathode. In the converse case where the first electrode 21 serves as a cathode and the second electrode 26 serves as an anode, the stack order of the organic EL layer is reversed, and the respective materials of the first electrode 21 and the second electrode 26 are switched similarly.

First, as illustrated in FIG. 8, the method of the present embodiment (i) applies a photosensitive resin onto an insulating substrate 11 that is made of a material such as glass and that includes, for example, TFTs 12 and wires 14 each formed by a publicly known technique, and (ii) carries out patterning with respect to the photosensitive resin by photolithography. This forms an interlayer film 13 on the insulating substrate 11.

Figure 1:
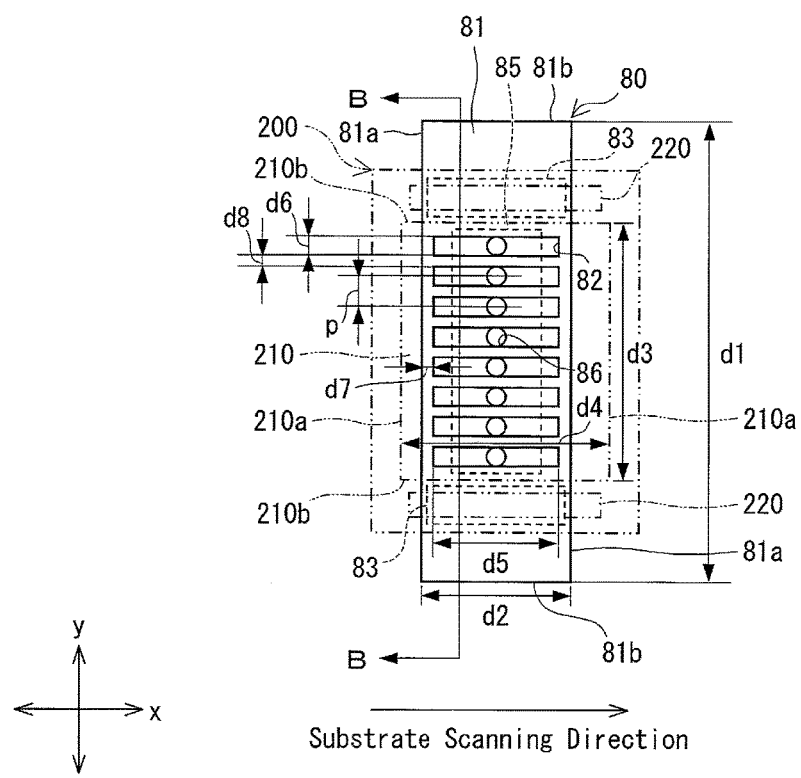
FIG. 1 is a plan view illustrating a film formation substrate and a mask unit inside a vacuum chamber of a vapor deposition device according to First Embodiment of the present invention, the plan view being taken from a back surface side of the film formation substrate.

The insulating substrate 11 is, for example, a glass or plastic substrate having (i) a thickness of 0.7 to 1.1 mm, (ii) a length (longitudinal length) of 400 to 500 mm along a y axis direction, and (iii) a length (lateral length) of 300 to 400 mm along an x axis direction. The insulating substrate 11 of the present embodiment was a glass substrate. Note that an x axis is an axis parallel to a substrate scanning direction and a y axis is an axis perpendicular to the substrate scanning direction as illustrated in FIG. 1.

The interlayer film 13 can be made of, for example, an acrylic resin or a polyimide resin. The acrylic resin is, for example, a product in the Optomer series available from JSR Corporation. The polyimide resin is, for example, a product in the PHOTONEECE™ series available from Toray Industries, Inc. Note that since a typical polyimide resin is not transparent but colored, the interlayer film 13 is more suitably made of a transparency resin such as an acrylic resin in the case where an organic EL display device of the bottom emission type is produced as the organic EL display device 1 as illustrated in FIG. 8.

The interlayer film 13 is simply required to have a film thickness that can compensate for the difference in level created by the TFTs 12. The film thickness is thus not particularly limited. The film thickness was, for example, approximately 2 μm in the present embodiment.

The method of the present embodiment next forms, in the interlayer film 13, contact holes 13a for electrically connecting the first electrode 21 to the TFTs 12.

The method then forms, as a conductive film (electrode film), a film such as an ITO (indium tin oxide) film by a method such as a sputtering method so that the film has a thickness of 100 nm.

The method next applies a photoresist onto the ITO film, carries out patterning with respect to the photoresist by photolithography, and then carries out etching with respect to the ITO film with use of ferric chloride as an etchant. The method then strips the photoresist with use of a resist exfoliative solution, and further washes the substrate. This forms, on the interlayer film 13, a first electrode 21 in a matrix.

The conductive film material for the first electrode 21 is, for example, (i) a transparent conductive material such as ITO, IZO (indium zinc oxide), and gallium-added zinc oxide (GZO) or (ii) a metal material such as gold (Au), nickel (Ni), and platinum (Pt).

The above conductive film can be formed by, instead of the sputtering method, a method such as a vacuum vapor deposition method, a chemical vapor deposition (CVD) method, a plasma CVD method, and a printing method.

The thickness of the first electrode 21 is not particularly limited. The first electrode 21 can have a thickness of, for example, 100 nm as mentioned above.

The method next forms a pattern of an edge cover 15, as with the interlayer film 13, to have a film thickness of, for example, approximately 1 μm. The edge cover 15 can be made of an insulating material similar to that for the interlayer film 13.

The step described above prepares the TFT substrate 10 and the first electrode 21 (S1).

The method of the present embodiment next carries out, with respect to the TFT substrate 10 prepared through the above step, (i) a bake under a reduced pressure for dehydration and (ii) an oxygen plasma treatment for surface washing of the first electrode 21.

The method then carries out vapor deposition of a hole injection layer and a hole transfer layer (in the present embodiment, a hole injection layer/hole transfer layer 22) on the TFT substrate 10 throughout its entire display region with use of a conventional vapor deposition device (S2).

Specifically, the method (i) carries out an alignment adjustment, relative to the TFT substrate 10, of an open mask having an opening corresponding to the entire display region and (ii) closely attaches the open mask to the TFT substrate 10. The method then, while rotating the TFT substrate 10 and the open mask together, carries out, through the opening of the open mask and uniformly throughout the entire display region, vapor deposition of vapor deposition particles scattered from a vapor deposition source.

The above vapor deposition carried out throughout the entire display region refers to vapor deposition carried out unintermittently over sub-pixels having different colors and located adjacent to one another.

The hole injection layer and the hole transfer layer are each made of a material such as (i) benzine, styryl amine, triphenylamine, porphyrin, triazole, imidazole, oxadiazole, polyarylalkane, phenylenediamine, arylamine, oxazole, anthracene, fluorenone, hydrazone, stilbene, triphenylene, azatriphenylene, or a derivative of any of the above, (ii) a polysilane compound, (iii) a vinylcarbazole compound, (iv) and a monomer, an oligomer, or a polymer of an open chain conjugated system, such as a thiophene compound and an aniline compound.

The hole injection layer and the hole transfer layer may be either integrated with each other as described above or formed as separate layers independent of each other. The hole injection layer and the hole transfer layer each have a film thickness of, for example, 10 to 100 nm.

The present embodiment used, as the hole injection layer and the hole transfer layer, a hole injection layer/hole transfer layer 22 that was made of 4,4'-bis[N-(1-naphthyl)-N-phenylamino]biphenyl(α-NPD) and that had a film thickness of 30 nm.

The method of the present embodiment next carries out a selective application formation (pattern formation) of luminescent layers 23R, 23G, and 23B on the hole injection layer/hole transfer layer 22 in correspondence with respective sub-pixels 2R, 2G, and 2B so that the luminescent layers 23R, 23G, and 23B cover respective openings 15R, 15G, and 15B of the edge cover 15 (S3).

As described above, the luminescent layers 23R, 23G, and 23B are each made of a material with high luminous efficiency, such as a low-molecular fluorescent dye and a metal complex.

The luminescent layers 23R, 23G, and 23B are each made of a material such as (i) anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene, or a derivative of any of the above, (ii) a tris(8-hydroxyquinolinate) aluminum complex, (iii) a bis (benzohydroxyquinolinate) beryllium complex, (iv) a tri (dibenzoylmethyl) phenanthroline europium complex, (v) and ditoluoyl vinyl biphenyl.

The luminescent layers 23R, 23G, and 23B each have a film thickness of, for example, 10 to 100 nm.

The vapor deposition method and the vapor deposition device of the present embodiment are each particularly suitably used for a selective application formation (pattern formation) of such luminescent layers 23R, 23G, and 23B.

A description below deals in detail with a selective application formation of the luminescent layers 23R, 23G, and 23B which selective application formation involves the vapor deposition method and the vapor deposition device of the present embodiment.

The method of the present embodiment next carries out, in a manner similar to that described for the above hole injection layer/hole transfer layer vapor deposition step (S2), vapor deposition of an electron transfer layer 24 throughout the entire display region of the TFT substrate 10 so that the electron transfer layer 24 covers the hole injection layer/hole transfer layer 22 and the luminescent layers 23R, 23G, and 23B (S4).

The method then carries out, in a manner similar to that described for the above hole injection layer/hole transfer layer vapor deposition step (S2), vapor deposition of an electron injection layer 25 throughout the entire display region of the TFT substrate 10 so that the electron injection layer 25 covers the electron transfer layer 24 (S5).

The electron transfer layer 24 and the electron injection layer 25 are each made of a material such as a tris(8-hydroxyquinolinate) aluminum complex, an oxadiazole derivative, a triazole derivative, a phenylquinoxaline derivative, or a silole derivative.

Specific examples of the material include (i) Alq(tris(8-hydroxy quinoline)aluminum), anthracene, naphthalene, phenanthrene, pyrene, anthracene, perylene, butadiene, coumarin, acridine, stilbene, 1,10-phenanthroline, and a derivative or metal complex of any of the above, and (ii) LiF.

As mentioned above, the electron transfer layer 24 and the electron injection layer 25 may be either integrated with each other or formed as separate layers independent of each other. The electron transfer layer 24 and the electron injection layer 25 each have a film thickness of, for example, 1 to 100 nm. The respective film thicknesses of the electron transfer layer 24 and the electron injection layer 25 add up to, for example, 20 to 200 nm.

In the present embodiment, (i) the electron transfer layer 24 was made of Alq, whereas the electron injection layer 25 was made of LiF, and (ii) the electron transfer layer 24 had a film thickness of 30 nm, whereas the electron injection layer 25 had a film thickness of 1 nm.

The method of the present embodiment next carries out, in a manner similar to that described for the above hole injection layer/hole transfer layer vapor deposition step (S2), vapor deposition of a second electrode 26 throughout the entire display region of the TFT substrate 10 so that the second electrode 26 covers the electron injection layer 25 (S6).

The second electrode 26 is suitably made of a material (electrode material) such as a metal with a small work function. Examples of such an electrode material include a magnesium alloy (for example, MgAg), an aluminum alloy (for example, AlLi, AlCa, or AlMg) and calcium metal. The second electrode 26 has a thickness of, for example, 50 to 100 nm.

In the present embodiment, the second electrode 26 was made of aluminum and has a film thickness of 50 nm. The operation described above forms, on the TFT substrate 10, organic EL elements 20 each including the organic EL layer, the first electrode 21, and the second electrode 26 described above.

The method of the present embodiment then attached (i) the TFT substrate 10, on which the organic EL elements 20 is provided, to (ii) a sealing substrate 40 with use of an adhesive layer 30 as illustrated in FIG. 6 so that the organic EL elements 20 were contained. The sealing substrate 40 is, for example, an insulating substrate such as a glass substrate and a plastic substrate and 0.4 to 1.1 mm in thickness. The sealing substrate 40 of the present embodiment was a glass substrate.

The longitudinal and lateral lengths of the sealing substrate 40 may each be adjusted as appropriate in accordance with the size of a target organic EL display device 1. The sealing substrate 40 may be an insulating substrate substantially equal in size to the insulating substrate 11 of the TFT substrate 10, in which case a combination of the sealing substrate 40, the TFT substrate 10, and the organic EL elements 20 contained therebetween is divided in accordance with the size of a target organic EL display device 1.

The method for containing the organic EL elements 20 is not limited to the method described above. Examples of other containing methods include (i) a method that uses a centrally depressed glass substrate as the sealing substrate 40 and that the combination of the sealing substrate 40 and the TFT substrate 10 is sealed along the edge in a frame shape with use of, for example, a sealing resin or fritted glass, and (ii) a method that fills a space between the TFT substrate 10 and the sealing substrate 40 with a resin. The method for producing the organic EL display device 1 does not depend on the above containing method, and can employ any of various containing methods.

The second electrode 26 may be provided thereon with a protective film (not shown) that covers the second electrode 26 and that prevents infiltration of oxygen, moisture and the like present outside into the organic EL elements 20.

The protective film is made of an electrically insulating or conductive material such as silicon nitride and silicon oxide. The protective film has a thickness of, for example, 100 to 1000 nm.

Through the above steps, the organic EL display device 1 is finally produced.

The organic EL display device 1, upon receipt of a signal through a wire 14, turns on a TFT 12 and thus allows (i) positive holes to be injected from the first electrode 21 into the organic EL layer and further (ii) electrons to be injected from the second electrode 26 into the organic EL layer. This causes the positive holes and the electrons to recombine with each other inside the luminescent layers 23R, 23G, and 23B. The positive holes and the electrons thus recombined are emitted in the form of light when becoming inactive.

In the above organic EL display device 1, controlling respective light emission luminances of the sub-pixels 2R, 2G, and 2B allows a predetermined image to be displayed.

The following describes an arrangement of a vapor deposition device of the present embodiment.

Figure 2:
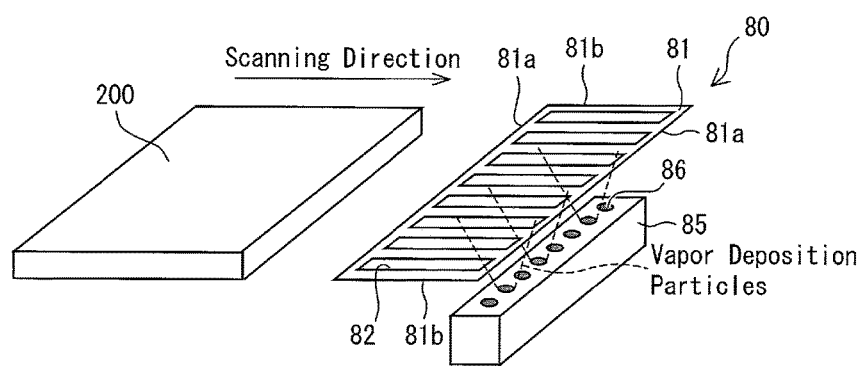
FIG. 2 is a bird's eye view illustrating main constituent elements inside the vacuum chamber of the vapor deposition device according to First Embodiment of the present invention.
Figure 3:
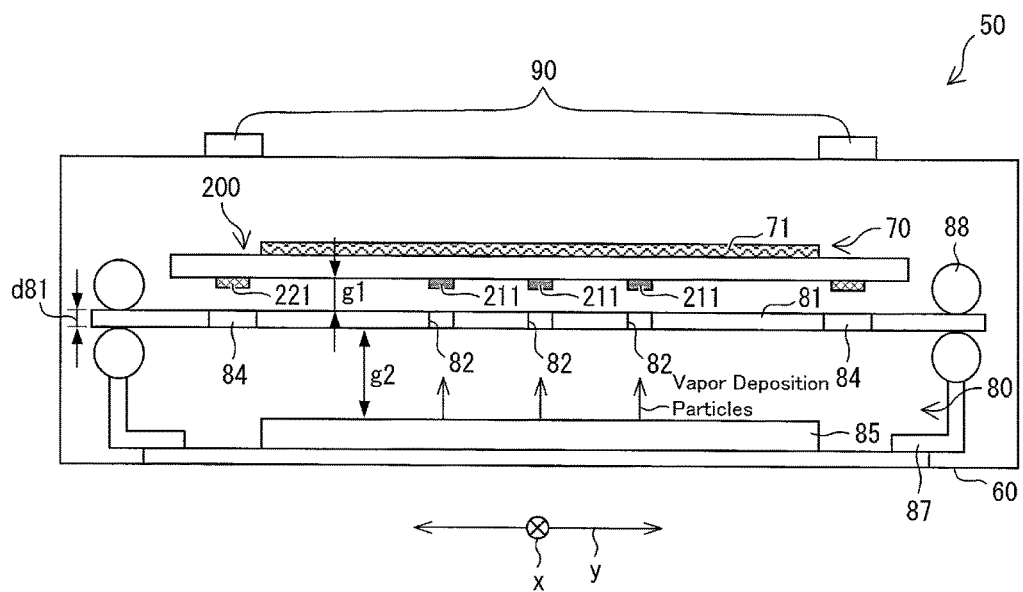
FIG. 3 is a cross-sectional view schematically illustrating a configuration of a main part of the vapor deposition device according to First Embodiment of the present invention.
Figure 4:
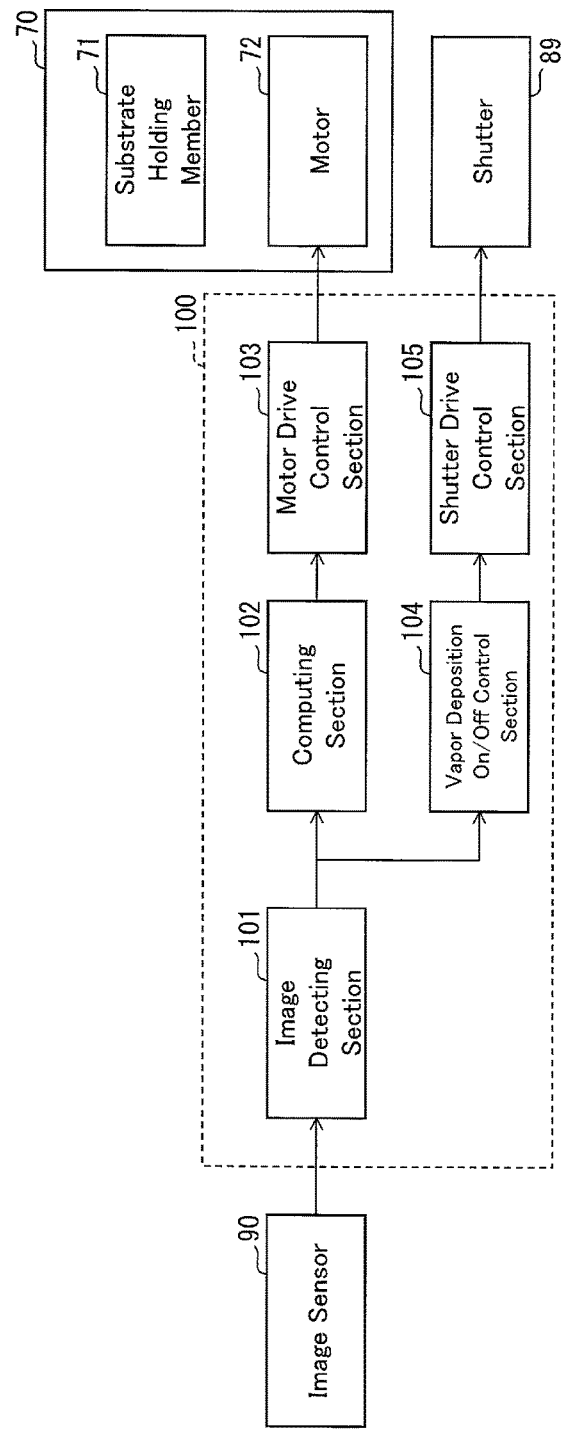
FIG. 4 is a block diagram partially illustrating a configuration of the vapor deposition device according to First Embodiment of the present invention.

FIG. 1 is a plan view of a film formation substrate and a mask unit both inside a vacuum chamber of the vapor deposition device of the present embodiment, the plan view being taken from a back surface side of the film formation substrate (that is, the side opposite to the vapor-deposited surface). For convenience of illustration, FIG. 1 uses a chain double-dashed line to represent the film formation substrate. FIG. 2 is a bird's eye view of main constituent elements inside the vacuum chamber of the vapor deposition device of the present embodiment. FIG. 3 is a cross-sectional view schematically illustrating a configuration of a main part of the vapor deposition device of the present embodiment. FIG. 3 illustrates a cross section of the vapor deposition device, the cross section being taken along line B-B of FIG. 1. FIG. 4 is a block diagram illustrating a part of a configuration of the vapor deposition device of the present embodiment.

The vapor deposition device 50 of the present embodiment, as illustrated in FIG. 3, includes: a vacuum chamber 60 (film growing chamber); a substrate moving mechanism 70 (substrate moving means; moving means); a mask unit 80; image sensors 90; and a control circuit 100 (see FIG. 4).

As illustrated in FIG. 3, the vacuum chamber 60 contains the substrate moving mechanism 70 and the mask unit 80.

The vacuum chamber 60 is provided with a vacuum pump (not shown) for vacuum-pumping the vacuum chamber 60 via an exhaust port (not shown) of the vacuum chamber 60 to keep a vacuum in the vacuum chamber 60 during vapor deposition.

The substrate moving mechanism 70 includes, for example: a substrate holding member 71 (substrate holding means) for holding a film formation substrate 200 (for example, a TFT substrate 10); and a motor 72 (see FIG. 4).

The substrate moving mechanism 70 causes (i) the substrate holding member 71 to hold the film formation substrate 200 and (ii) a below-described motor drive control section 103 (see FIG. 4) to drive the motor 72 so as to hold the film formation substrate 200 and move it in the horizontal direction. The substrate moving mechanism 70 may be provided to be capable of moving the film formation substrate 200 either (i) in both the x axis direction and the y axis direction or (ii) in one of the x axis direction and the y axis direction. Note that the x axis direction is a direction parallel to the substrate scanning direction and the y axis direction is a direction (hereinafter referred to as a direction perpendicular to the scanning direction) perpendicular to the substrate scanning direction, as illustrated in FIG. 1.

The substrate holding member 71 is an electrostatic chuck. The film formation substrate 200 is, in a state in which bend due to its own weight is absent, so held by the electrostatic chuck as to be separated from a below-described shadow mask 81 of the mask unit 80 by a predetermined gap g1 (void; vertical distance). The gap g1 is set to a predetermined distance so that both ends, in the direction (the y axis direction (predetermined direction)) perpendicular to the scanning direction, of each of the luminescent layers 23R, 23B, and 23G become a film-thickness-gradually-diminishing part 23s.

The gap g1 between the film formation substrate 200 and the shadow mask 81 preferably falls within the range of not less than 50 μm and not more than 3 mm, or is more preferably on the order of 500 μm.

If the gap g1 is larger than 3 mm, vapor deposition particles that have passed through openings 82 of the shadow mask 81 are spread widely, which results in a vapor-deposited film 211 being formed to have too large a pattern width. In the case where, for example, the vapor-deposited film 211 is the luminescent layer 23R, the gap g1 being larger than 3 mm may undesirably result in vapor deposition of the material of the luminescent layer 23R through the respective openings 15G and 15B of the adjacent sub-pixels 2G and 2B.

With the gap g1 being approximately 500 μm, (i) there is no risk of the film formation substrate 200 coming into contact with the shadow mask 81, and (ii) the vapor-deposited film 211 can have a small pattern width.

The mask unit 80, as illustrated in FIG. 3, includes: a shadow mask 81 (vapor deposition mask); a vapor deposition source 85; a mask holding member 87 (holding means); a mask tension mechanism 88; and a shutter 89 (see FIG. 4).

The shadow mask 81 is, for example, a metal mask.

The shadow mask 81 is, for example, so formed as to (i) be smaller in area than a display region 210 of the film formation substrate 200 and (ii) have at least one side that is shorter than the width of the display region 210 of the film formation substrate 200.

The shadow mask 81 of the present embodiment has a rectangular shape (that is, in the shape of a belt), and is sized as follows: The shadow mask 81 is, as illustrated in FIG. 1, so formed as to have (i) long sides 81a each with a width d1 (that is, the length along the long-side direction [long-axis direction] of the shadow mask 81) that is larger than the width d3 of a side of the display region 210 (in the example illustrated in FIG. 1, a long side 210a of the display region 210) which side faces the long sides 81a of the shadow mask 81 and (ii) short sides 81b each with a width d2 (that is, the length along the short-side direction [short-axis direction] of the shadow mask 81) that is smaller than the width d4 of a side of the display region 210 (in the example illustrated in FIG. 1, a short side 210b of the display region 210) which side faces the short sides 81b of the shadow mask 81.

The shadow mask 81, as illustrated in FIGS. 1 and 2, has a plurality of openings 82 (through holes) arranged in a one-dimensional direction and each having the shape of, for example, a belt (that is, in a stripe shape). In the case where, for example, a selective application formation of the luminescent layers 23R, 23G, and 23B is carried out with respect to the TFT substrate 10 as a pattern formation of vapor-deposited films 211 (see FIG. 3) on the film formation substrate 200, the openings 82 are formed in correspondence with the size and pitch of columns for each color of the luminescent layers 23R, 23G, and 23B.

More specifically, a width B82R of the opening 82 (first opening) in a pitch direction (the y-axis direction) of the shadow mask 81R (81) (a first vapor deposition mask) for the luminescent layer 23R is smaller than a width of the luminescent region 24R in the y-axis direction (see FIG. 15). Similarly, a width B82G (not illustrated) of the opening 82 (first opening) in a pitch direction of the shadow mask 81G (81) (not illustrated, a first vapor deposition mask) for the luminescent layer 23G is smaller than a width of the luminescent region 24G in the y-axis direction. Meanwhile, a width B82B, in a pitch direction, of each opening 82 (second opening) of a shadow mask 81B (81) (a second vapor deposition mask) for the luminescent layer 23B is larger than a width of the luminescent region 24B in the y-axis direction.

The width B82B is, for example, set to be larger than a sum of (i) the width of the luminescent region 24B in the y-axis direction and (ii) a length that is twice the assumed pattern mispositioning amount of the luminescent layer 23B. This makes it possible to prevent the film-thickness-gradually-diminishing part 23sB of the luminescent layer 23B from overlapping the luminescent region 24B (i.e., prevent occurrence of a film thickness diminished region in the luminescent region 24B) even in a case where there arises pattern mispositioning of the luminescent layer 23B in the y-axis direction, as described later.

In FIG. 15, for convenience of illustration, the shadow mask 81B is disposed farther away from the film formation substrate than the shadow mask 81G. Note, however, that a gap between the shadow masks 81R, 81G, and 81B and the film formation substrate 200 is set as appropriate.

The shadow mask 81, as illustrated in FIG. 1, includes, for example, alignment marker sections 83 extending along a scanning direction (substrate scanning direction) of the film formation substrate 200. The alignment marker sections 83 include respective alignment markers 84 (see FIG. 3) for use in an alignment between the film formation substrate 200 and the shadow mask 81.

The alignment marker sections 83 of the present embodiment are, as illustrated in FIG. 1, provided along the short sides 81b (short axis) of the shadow mask 81.

The shadow mask 81, as described above, has (i) long sides 81a each with a width d1 that is larger than the width d3 of a side of the display region 210 which side faces the long sides 81a and (ii) short sides 81b each with a width d2 that is smaller than the width d4 of a side of the display region 210 which side faces the short sides 81b. This arrangement allows the alignment marker sections 83 to be formed respectively in opposite end sections arranged along the long-side direction (that is, at the opposite short sides 81b and 81b). The above arrangement thus makes it possible to carry out an alignment easily and more precisely.

The film formation substrate 200, as illustrated in FIG. 1, includes alignment marker sections 220 outside the display region 210 and along the scanning direction (substrate scanning direction) of the film formation substrate 200. The alignment marker sections 220 include respective alignment markers 221 (see FIG. 3) for use in an alignment between the film formation substrate 200 and the shadow mask 81.

The alignment marker sections 220 of the present embodiment are, as illustrated in FIG. 1, provided along the respective short sides 210b (short axis) of the display region 210 of the film formation substrate 200. The alignment markers 84 and 221 allow the film formation substrate 200 and the shadow mask to be aligned relative to each other so that a center of a width, in the direction (the y axis direction) perpendicular to the scanning direction, of an opening 82 of each shadow mask 81 substantially coincides with a center of a width, in the direction perpendicular to the scanning direction, of a corresponding luminescent region 24R, 24G, or 24B. This will be described later.

The stripe-shaped openings 82 of the present embodiment are provided to (i) extend along the short side direction of the shadow mask 81, that is, the substrate scanning direction, and to (ii) be arranged next to one another along the long side direction of the shadow mask 81, that is, a direction that orthogonally crosses the substrate scanning direction.

The vapor deposition source 85 is, for example, a container that contains a vapor deposition material. The vapor deposition source 85 is, as illustrated in FIGS. 1 through 3, (i) placed to face the shadow mask 81 and (ii) separated from the shadow mask 81 by a fixed gap g2 (void), that is, positioned away from the shadow mask 81 by a fixed distance.

The vapor deposition source 85 may be a container that itself contains a vapor deposition material or a container that includes a load-lock pipe.

The vapor deposition source 85 includes, for example, a mechanism for emitting vapor deposition particles upward.

The vapor deposition source 85 has, on a surface facing the shadow mask 81, a plurality of injection holes 86 for emitting (scattering) the vapor deposition material in the form of vapor deposition particles. In the present embodiment, each of the injection holes 86 has, for example, a rectangular shape whose one pair of sides is parallel to the direction (the y axis direction) perpendicular to the scanning direction so that inclinations of the film-thickness-gradually-diminishing parts 23s of the luminescent layers 23R, 23G, and 23B are flat. Note, however, that the present embodiment is not limited to this.

The present embodiment is arranged as described above such that (i) the vapor deposition source 85 is provided below the film formation substrate 200 and that (ii) the film formation substrate 200 is held by the substrate holding member 71 in such a state that the display region 210 faces downward. Thus, in the present embodiment, the vapor deposition source 85 carries out vapor deposition of vapor deposition particles through the openings 82 of the shadow mask 81 onto the film formation substrate 200 upward from below (that is, up deposition; hereinafter referred to as "depo-up").

The injection holes 86 are, as illustrated in FIGS. 1 and 2, provided to face the respective openings 82 of the shadow mask 81 so as to be open in respective opening regions of the shadow mask 81. The injection holes 86 of the present embodiment are arranged one-dimensionally (i) along the direction in which the openings 82 of the shadow mask 81 are arranged next to one another and (ii) so as to face the respective openings 82 of the shadow mask 81.

Thus, as illustrated in FIGS. 1 and 2, the vapor deposition source 85 is formed to have a surface that faces the shadow mask 81, the surface (that is, the surface in which the injection holes 86 are provided) having, for example, a rectangular shape (belt shape) as viewed from the back surface side of the film formation substrate 200 (that is, in a plan view) so as to match the rectangular shape (belt shape) of the shadow mask 81.

In the mask unit 80, the shadow mask 81 and the vapor deposition source 85 are fixed in position relative to each other. Specifically, there is constantly a fixed gap g2 between (i) the shadow mask 81 and (ii) the surface of the vapor deposition source 85 in which surface the injection holes 86 are provided, and there is constantly a fixed positional relationship between (i) the openings 82 of the shadow mask 81 and (ii) the injection holes 86 of the vapor deposition source 85.

The injection holes 86 of the vapor deposition source 85 are each so placed as to coincide with the center of a corresponding opening 82 of the shadow mask 81 when the mask unit 80 is viewed from the back surface side of the film formation substrate 200 (that is, in a plan view).

The shadow mask 81 and the vapor deposition source 85 are, for example, attached to the mask holding member 87 (for example, an identical holder) for holding and fixing (i) the shadow mask 81 via the mask tension mechanism 88 and (ii) the vapor deposition source 85 (see FIG. 3). The shadow mask 81 and the vapor deposition source 85 are thus so integrated with each other as to be held and fixed in the respective positions relative to each other.

The shadow mask 81 is under tension caused by the mask tension mechanism 88. The shadow mask 81 is thus adjusted as appropriate so that no bend or elongation due to its own weight is caused.

The vapor deposition device 50 is arranged as described above such that (i) the film formation substrate 200 is adhered by suction to a fixing plate by the substrate holding member 71 (electrostatic chuck), and is thus prevented from being bent due to its own weight and (ii) the shadow mask 81 is under tension caused by the mask tension mechanism 88 so that the distance between the film formation substrate 200 and the shadow mask 81 is uniformly maintained throughout the entire region by which the film formation substrate 200 overlaps the shadow mask 81 in a plan view.

The shutter 89 is used according to need in order to control reaching of vapor deposition particles to the shadow mask 81. The shutter 89 is either closed or opened by a shutter drive control section 105 (see FIG. 4) in accordance with a vapor deposition OFF signal or vapor deposition ON signal from a vapor deposition ON/OFF control section 104 (see FIG. 4) described below.

The shutter 89 is, for example, provided to be capable of moving in a space between the shadow mask 81 and the vapor deposition source 85 (that is, capable of being inserted between them). The shutter 89 is inserted between the shadow mask 81 and the vapor deposition source 85 to close the openings 82 of the shadow mask 81. Appropriately inserting the shutter 89 between the shadow mask 81 and the vapor deposition source 85 can prevent vapor deposition on a portion for which vapor deposition is unnecessary (that is, a non vapor deposition region).

The vapor deposition device 50 is so adjusted that vapor deposition particles from the vapor deposition source are scattered below the shadow mask 81. The vapor deposition device 50 may be arranged such that vapor deposition particles scattered beyond the shadow mask 81 are blocked as appropriate by, for example, a deposition preventing plate (shielding plate).

The vacuum chamber 60 is provided with, for example, image sensors 90 (see FIG. 4) each (i) attached to an outer surface of the vacuum chamber 60, (ii) including a CCD, and (iii) serving as image sensing means (image reading means). The vacuum chamber 60 is further provided with a control circuit 100 (i) attached to the outer surface of the vacuum chamber 60, (ii) connected to the image sensors 90, and (iii) serving as control means.

The image sensors 90 each function as position detecting means for use in an alignment of the film formation substrate 200 and the shadow mask 81 (alignment for causing a center of a width, in the direction (the y axis direction) perpendicular to the scanning direction, of each opening 82 of the shadow mask 81 to coincide with a center of a width, in the direction perpendicular to the scanning direction, of a corresponding luminescent region 24R, 24G, or 24B of the film formation substrate 200).

The control circuit 100 includes: an image detecting section 101; a computing section 102; a motor drive control section 103; a vapor deposition ON/OFF control section 104; and a shutter drive control section 105.

As described above, the film formation substrate 200 includes, as illustrated in FIG. 1, alignment marker sections 220 provided (i) outside the display region 210 and (ii) along, for example, the substrate scanning direction, the alignment marker sections 220 each including an alignment marker 221.

The image detecting section 101 detects, on the basis of an image captured by the image sensors 90, respective images of (i) the alignment markers 221 included in the film formation substrate 200 and (ii) the alignment markers 84 of the shadow mask 81. The image detecting section 101 further detects the start-end and rear-end of the display region 210 of the film formation substrate 200 on the basis of, among the alignment markers 221 included in the film formation substrate 200, (i) a start-end marker indicative of the start-end of the display region 210 and (ii) a rear-end marker indicative of the rear-end of the display region 210.

The start-end marker and the rear-end marker mentioned above may be identical to each other. In this case, the image detecting section 101 detects, with respect to the substrate scanning direction, whether a particular end of the display region 210 is its start-end or rear-end.

The computing section 102 determines, from the image detected by the image detecting section 101, the amount of movement of the film formation substrate 200 and the shadow mask 81 relative to each other (for example, the amount of movement of the film formation substrate 200 relative to the shadow mask 81). The computing section 102, for example, measures the amount of positional difference (that is, a shift component along the x axis direction and the y axis direction, and a rotation component on the x-y plane) between the alignment markers 221 and the alignment markers 84 to determine a correction value for a substrate position of the film formation substrate 200 by computation. In other words, the computing section 102 determines the correction value by computation with respect to the direction perpendicular to the substrate scanning direction and a rotation direction of the film formation substrate 200.

The rotation direction of the film formation substrate refers to a direction of rotation on the x-y plane about a z axis (that is, an axis perpendicular to both of the x axis and the y axis), as a rotation axis, at the center of a film formation surface of the film formation substrate 200.

The correction value is outputted in the form of a correction signal to the motor drive control section 103. The motor drive control section 103, on the basis of the correction signal from the computing section 102, drives the motor 72 connected to the substrate holding member 71 and thus corrects the substrate position of the film formation substrate 200.

How the substrate position is corrected with use of the alignment markers 84 and 221 is described below together with example shapes of the alignment markers 84 and 221.

The motor drive control section 103 drives the motor 72 to move the film formation substrate 200 in the horizontal direction (the x axis direction) as mentioned above while preserving a state in which a center of a width, in the direction (the y axis direction) perpendicular to the scanning direction, of each opening 82 of the shadow mask 81 substantially coincides with a center of a width, in the direction perpendicular to the scanning direction, of a corresponding luminescent region 24R, 24G, or 24B.

The vapor deposition ON/OFF control section 104 generates (i) a vapor deposition OFF signal when the image detecting section 101 detects the rear-end of the display region 210 and (ii) a vapor deposition ON signal when the image detecting section 101 detects the start-end of the display region 210.

The shutter drive control section 105 (*i*) closes the shutter 89 upon receipt of a vapor deposition OFF signal from the vapor deposition ON/OFF control section 104 and (*ii*) opens the shutter 89 upon receipt of a vapor deposition ON signal from the vapor deposition ON/OFF control section 104.

The following describes (i) how the substrate position is corrected with use of the alignment markers 84 and 221 and (ii) example shapes of the alignment markers 84 and 221.

(a) through (c) of FIG. 5 illustrate example shapes of the alignment markers 84 and 221. (b) and (c) of FIG. 5 each illustrate only two of the juxtaposed alignment markers 84 and of the juxtaposed alignment markers 221 for convenience of illustration.

The computing section 102, on the basis of an image of the alignment markers 84 and 221, the image having been detected by the image detecting section 101, measures (determines) (i) a distance r between respective ends (outer edges) of each alignment marker 84 and its corresponding alignment marker 221 along the x axis direction and (ii) a distance q between respective ends (outer edges) of each alignment marker 84 and its corresponding alignment marker 221 along the y axis direction. The computing section 102 thus determines the amount of positional difference in alignment to compute a correction value for a substrate position.

In the case where, for example, the substrate scanning direction is the x axis direction, the sign "r" in (a) through (c) of FIG. 5 indicates a distance between the respective ends along the substrate scanning direction, whereas the sign "q" in (a) through (c) of FIG. 5 indicates a distance between the respective ends along the direction perpendicular to the substrate scanning direction. The computing section 102 measures (determines) the distances r and q at, for example, opposite ends of the display region 210 of the film formation substrate 200 to determine the amount of shift caused in alignment during a substrate scan.

The present embodiment describes an example case that involves simultaneously scanning the film formation substrate 200 and carrying out an alignment between the shadow mask 81 and the film formation substrate 200. The present embodiment is, however, not limited to such an arrangement. The present embodiment can alternatively be arranged such that a sufficient alignment is carried out before a substrate scan and that no alignment is carried out during a substrate scan.

The present embodiment can be arranged such that, for example, the film formation substrate 200 is moved along a first side of the display region 210 of the film formation substrate 200 (for example, along the y axis direction in (a) through (c) of FIG. 5), and is then moved along a second side (for example, the x axis direction in (a) through (c) of FIG. 5) orthogonal to the first side. In this case, the sign "r" in (a) through (c) of FIG. 5 indicates a distance between the respective ends along the direction perpendicular to the substrate scanning direction, whereas the sign "q" in (a) through (c) of FIG. 5 indicates a distance between the respective ends along the direction (shift direction) in which the film formation substrate 200 is moved.

In this case, the computing section 102 measures distances r and q for alignment markers located at the four corners, and thus determines (i) the amount of positional difference present in alignment at the start of a substrate scan and (ii) the amount of positional difference present in alignment after the film formation substrate 200 is moved (shifted).

The alignment markers 84 and 221 may each be, as illustrated in (a) through (c) of FIG. 5, in the shape of, for example, (i) a belt, (ii) a quadrangle such as a square, (iii) a frame, or (iv) a cross. The alignment markers 84 and 221 are thus not particularly limited in terms of shape.

In the case where a sufficient alignment is carried out before a substrate scan and no alignment is carried out during a substrate scan as described above, the alignment markers 221 do not need to be provided along a side of the display region 210 of the film formation substrate 200, and may instead be provided at, for example, the four corners of the film formation substrate 200.

The following describes in detail a method for forming a pattern of an organic EL layer by using, as a device for producing the organic EL display device 1, the above vapor deposition device 50 of the present embodiment.

The description below deals with an example case that, as described above, involves (i) using, as the film formation substrate 200, a TFT substrate 10 obtained after the hole injection layer/hole transfer layer vapor deposition step (S2) is finished and (ii) carrying out, as a pattern formation of an organic EL layer, a selective application formation of luminescent layers 23R, 23G, and 23B during the luminescent layer vapor deposition step (S3).

The present embodiment assumed (i) 100 mm for the gap g2 between the vapor deposition source 85 and the shadow mask 81 (that is, the distance between a surface of the vapor deposition source 85 in which surface the injection holes 86 are provided and the shadow mask 81) and (ii) 500 μm for the distance between the TFT substrate 10 serving as the film formation substrate 200 and the shadow mask 81.

The present embodiment further assumed (i) for a substrate size of the TFT substrate 10, 320 mm along the scanning direction and 400 mm along the direction perpendicular to the scanning direction and (ii) for widths of the display region, 260 mm for the width along the scanning direction (that is, the width d4) and 310 mm for the width (that is, the width d3) along the direction perpendicular to the scanning direction.

Regarding the openings 15R, 15B, 15G, and 15B for the respective sub-pixels 2R, 2B, 2G, and 2B of the TFT substrate 10, the present embodiment assumed (i) 360 μm (along the scanning direction)×110 μm (along the direction perpendicular to the scanning direction) for widths of the openings 15R and 15G for the sub-pixels 2R and 2G and (ii) 360 μm (along the scanning direction)×50 μm (along the direction perpendicular to the scanning direction) for widths of the opening 15B for the sub-pixel 2B. The present embodiment further assumed 480 μm (along the scanning direction)×120 μm (along the direction perpendicular to the scanning direction) for a pitch between the openings 15R, 15B, 15G, and 15B. The pitch between the openings 15R, 15B, 15G, and 15B (that is, a pitch between pixel openings) refers to a pitch between respective openings 15R, 15B, 15G, and 15B for the sub-pixels 2R, 2B, 2G, and 2B adjacent to one another, but not to a pitch between sub-pixels of an identical color.

The present embodiment used, as the shadow mask 81, a shadow mask having (i) a length of 600 mm along the width d1 (that is, the width along the direction perpendicular to the scanning direction) along each long side 81a (corresponding to the long-axis direction) and (ii) a length of 200 mm along the width d2 (that is, the width along the scanning direction) along each short side 81b (corresponding to the short-axis direction). The shadow mask 81 had openings 82 (i) each having opening widths of 150 mm (along the width d5 in the long-axis direction; see FIG. 1)×70 μm (along the width d6 in the short-axis direction; see FIG. 1), (ii) having a length of 410 μm for the openings 15R and 15G and 170 μm for the opening 15B along an interval d8 (see FIG. 1) between adjacent openings 82 and 82, and (iii) having a length of 480 μm for the openings 15R and 15G and 240 μm for the opening 15B along a pitch p (see FIG. 1) between respective centers of adjacent openings 82 and 82.

In the present embodiment, the shadow mask 81 preferably has a length of not less than 200 mm for the width d2 (that is, a short side length) along each short side 81b. This is due to the reason below.

The vapor deposition rate is preferably not higher than 10 nm/s. If the vapor deposition rate exceeds 10 nm/s, a deposited film (that is, a vapor-deposited film) will have a decreased uniformity, thus resulting in a decreased organic EL property.

A vapor-deposited film typically has a film thickness of not larger than 100 nm. A film thickness of larger than 100 nm will require application of a high voltage, and consequently increase power consumption of a produced organic EL display device. The above vapor deposition rate and the film thickness of a vapor-deposited film allow estimation of a necessary vapor deposition period of 10 seconds.

Due to a limit in processing capability (tact time), a scan rate of 13.3 mm/s or higher is at least necessary in order to, for example, complete vapor deposition with respect to a 2 m-wide glass substrate in 150 seconds. The processing time of 150 seconds is a tact time that allows processing of about 570 glass substrates per day.

Securing the above vapor deposition period of 10 seconds at the above scan rate requires the shadow mask 81 to have openings 82 each having a width of at least 133 mm along the scanning direction.

Assuming that approximately 30 mm is appropriate for the distance (margin width d7; see FIG. 1) from each end of an opening 82 to a corresponding end of the shadow mask 81, the shadow mask 81 requires a length of 133+30+30≈200 mm for the width along the scanning direction.

The shadow mask 81 thus preferably has a short side length (that is, the width d2) of not less than 200 mm. The short side length is, however, not limited to not less than 200 mm if there is a change in the vapor deposition rate, the film thickness of a vapor-deposited film, and/or the allowable amount of the tact time.

The present embodiment assumes 30 mm/s for the rate of scanning the TFT substrate 10.

FIG. 10 is a flowchart illustrating an example method for forming a predetermined pattern on the TFT substrate 10 with use of the vapor deposition device 50 of the present embodiment.

The following specifically describes, with reference to the flow illustrated in FIG. 10, a method of FIG. 8 for forming luminescent layers 23R, 23G, and 23B with use of the vapor deposition device 50.

The method first, as illustrated in FIG. 3, places (fixes) the shadow mask 81 (81R) for the luminescent layer 23R above the vapor deposition source 85 for the luminescent layer 23R in the vacuum chamber 60 with use of the mask holding member 87 via the mask tension mechanism 88, and horizontally holds the shadow mask 81 under tension by the mask tension mechanism 88 so that no bending or elongation due to the self weight is caused to the shadow mask 81. During this step, the method simultaneously (i) maintains the distance between the vapor deposition source 85 and the shadow mask 81 with use of the mask holding member 87 and (ii) carries out an alignment with use of the alignment markers 84 of the shadow mask 81 in such a manner that the substrate scanning direction is identical to the long-axis direction of the stripe-shaped openings 82 provided in the shadow mask 81. The above step assembles the mask unit 80 (preparation of a mask unit).

The method next inserts the TFT substrate 10 in the vacuum chamber 60 and, as indicated in FIG. 10, carries out a rough alignment with use of the alignment markers 221 of the TFT substrate 10 as the film formation substrate 200 so that each sub-pixel column of an identical color of the TFT substrate 10 has a direction that is identical to the substrate scanning direction (S11). The method holds the TFT substrate 10 with use of the substrate holding member 71 so that no bending due to the self weight is caused to the TFT substrate 10.

The method then carries out a rough alignment between the TFT substrate 10 and the shadow mask 81 (S12). The method further adjusts the gap g1 (substrate-mask gap) between the TFT substrate 10 and the shadow mask 81 so that the gap is uniform, and places the TFT substrate 10 and the shadow mask 81 so that they face each other and so that a center of a width, in the direction (the y axis direction) perpendicular to the scanning direction, of the luminescent region 24R on the TFT substrate 10 substantially coincides with a center of a width, in the direction perpendicular to the scanning direction, of the opening 82 of the shadow mask 81 (81R) (see FIG. 15). This allows the TFT substrate 10 and the shadow mask 81 to be aligned with each other (S13). The present embodiment adjusted the gap g1 between the TFT substrate 10 and the shadow mask 81 to approximately 500 μm throughout the entire TFT substrate 10.

The method next carried out vapor deposition of materials for the red luminescent layer 23R with respect to the TFT substrate 10 while scanning the TFT substrate 10 at 30 mm/s.

The above step carried out a substrate scan in such a manner that the TFT substrate 10 passed through a position above the shadow mask 81. The above step simultaneously carried out the scan and a precise alignment with use of the alignment markers 84 and 221 so that the openings 82 of the shadow mask 81 coincide with red sub-pixel 2R columns (that is, so that a center of a width, in the direction (the y axis direction) perpendicular to the scanning direction, of the opening 82 substantially coincides with a center of a width, in the direction perpendicular to the scanning direction, of the luminescent region 24R of the sub-pixel 2R) (S14).

The luminescent layer 23R was made of (i) 3-phenyl-4 (1'-naphthyl)-5-phenyl-1,2,4-triazole (TAZ) (host material) and (ii) bis(2-(2'-benzo[4,5-α]thienyl)pyridinato-N,C3') iridium (acetylacetonate) (btp2Ir(acac)) (red-light emitting dopant). These materials (red organic materials) were codeposited at respective vapor deposition rates of 5.0 nm/s and 0.53 nm/s to form the luminescent layer 23R.

Vapor deposition particles of the red organic materials which particles are emitted from vapor deposition source 85 are deposited, through the openings 82 of the shadow mask 81 and onto positions (i.e., the luminescent regions 24R) of the TFT substrate 10 which face the respective openings 82 of the shadow mask 81, when the TFT substrate 10 passes through a position directly above the shadow mask 81. In the present embodiment, the TFT substrate 10 having passed through the position directly above the shadow mask 81 had the red organic materials deposited on the luminescent regions 24R at a film thickness of 25 nm.

The following describes, with reference to FIG. 11, a method for adjusting an alignment in S14 above.

FIG. 11 is a flowchart illustrating the alignment adjustment method. The alignment is adjusted as illustrated in the flow of FIG. 11.

The method first captures a substrate position of the TFT substrate 10 as the film formation substrate 200 with use of the image sensors 90 (S21).

Next, the image detecting section 101, on the basis of the image captured by the image sensors 90, detects respective images of (i) the alignment markers 221 of the TFT substrate 10 and of (ii) the alignment markers 84 of the shadow mask 81 (S22).

Then, the computing section 102 calculates, from the respective images of the alignment markers 221 and 84, the images having been detected by the image detecting section 101, the amount of positional difference between the alignment markers 221 and the alignment markers 84 to determine a correction value for a substrate position by computation (S23).

Next, the motor drive control section 103 drives the motor 72 on the basis of the correction value to correct the substrate position (S24).

Then, the image sensors 90 detect the substrate position as corrected, after which the steps S21 through S25 are repeated.

As described above, the present embodiment causes the image sensors 90 to repeatedly detect a substrate position to correct it. This makes it possible to simultaneously carry out a substrate scan and correct a substrate position so that a center of a width, in the direction (the y axis direction) perpendicular to the scanning direction, of the luminescent region 24R on the TFT substrate 10 substantially coincides with a center of a width, in the direction perpendicular to the scanning direction, of the opening 82 of the shadow mask 81, and consequently to form a film while carrying out a precise alignment between the TFT substrate 10 and the shadow mask 81.

The film thickness of the luminescent layer 23R can be adjusted on the basis of (i) a reciprocating scan (that is, reciprocating movement of the TFT substrate 10) and (ii) a scan rate. As indicated in FIG. 10, the present embodiment, after the scan in S14, (i) reversed the direction of scanning the TFT substrate 10, and (ii) further deposited the red organic materials by the same method as in S14 at the positions at which the red organic materials were deposited in S14 (S16). This formed a luminescent layer 23R having a film thickness of 50 nm.

While in S14 through S16, the non vapor deposition region of the TFT substrate 10 was positioned directly above the openings 82 of the shadow mask 81 (for example, during the period after the step in S14 ends and before the scanning direction is reversed in S16), the shutter 89 was inserted between the vapor deposition source 85 and the shadow mask 81 to prevent vapor deposition particles from adhering to the non vapor deposition region (S15).

The following describes, with reference to FIGS. 12 and 13, a vapor deposition control in S15 above which vapor deposition control involves the shutter 89.

FIG. 12 is a flowchart illustrating a flow of a vapor deposition control carried out when vapor deposition is turned OFF. FIG. 13 is a flowchart illustrating a flow of a vapor deposition control carried out when vapor deposition is turned ON.

The description below first deals with the flow carried out when vapor deposition is turned OFF.

As indicated in FIG. 12, the substrate position of the TFT substrate 10 serving as the film formation substrate 200 is constantly captured by the image sensors 90 during a vapor deposition process as described above with reference to FIG. 11 (S31).

As indicated in FIG. 11, the image detecting section 101, on the basis of an image captured by the image sensors 90, detects respective images of (i) the alignment markers 221 of the TFT substrate 10 and of (ii) the alignment markers 84 of the shadow mask 81. The image detecting section 101 detects, as an alignment marker 221 of the TFT substrate 10, a rear-end marker indicative of the rear-end of the display region 210 to detect the rear-end of the display region 210 as indicated in FIG. 12 (S32).

When the image detecting section 101 has detected the rear-end of the display region 210 as described above, the vapor deposition ON/OFF control section 104 generates a vapor deposition OFF signal (S33).

The shutter drive control section 105, upon receipt of the vapor deposition OFF signal from the vapor deposition ON/OFF control section 104, closes the shutter 89 (S34). The shutter 89 thus closed prevents vapor deposition particles from reaching the mask, which achieves the state of vapor deposition OFF (S35).

The description below now deals with the flow carried out when vapor deposition is turned ON.

As indicated in FIG. 13, the substrate position of the TFT substrate 10 serving as the film formation substrate 200 is, as described above, constantly captured by the image sensors 90 during a vapor deposition process (S41).

The image detecting section 101 detects, as an alignment marker 221 of the TFT substrate 10, a start-end marker indicative of the start-end of the display region to detect the start-end of the display region 210 (S42).

When the image detecting section 101 has detected the rear-end of the display region 210, the vapor deposition ON/OFF control section 104 generates a vapor deposition ON signal (S43).

The shutter drive control section 105, upon receipt of the vapor deposition ON signal from the vapor deposition ON/OFF control section 104, opens the shutter 89 (S44). The shutter 89 thus opened allows vapor deposition particles to reach the mask, which achieves the state of vapor deposition ON (S45).

The reciprocating scan in S16 above is carried out as follows: First, through the steps S21 to S24, the TFT substrate 10 is scanned while a precise alignment is carried out. When the image detecting section 101 has detected the rear-end of the display region 210, the motor drive control section 103 drives the motor 72 to reverse the direction of scanning the TFT substrate 10. During this operation, (i) vapor deposition is turned OFF through the steps S31 to S35, (ii) the position of the TFT substrate 10 is corrected through the steps S21 to S24, and (iii) vapor deposition is turned ON at the start-end of the display region 210 through the steps S41 to S45. Then, the TFT substrate 10 is scanned again while a precise alignment is carried out through the steps S21 to S24.

In this way, the luminescent layer 23R having, at both ends thereof in the direction (the y-axis direction) perpendicular to the scanning direction, the film-thickness-gradually-diminishing part 23sR is formed so as to completely cover the luminescent region 24R (see FIG. 14 or FIG. 15).

More specifically, the luminescent layer 23R has (i) the substantially flat part 23tR which has a substantially uniform thickness Tr and (ii) the film-thickness-gradually-diminishing part 23sR formed at both ends, in the direction (the y-axis direction) perpendicular to the scanning direction, of the luminescent layer 23R. The substantially flat part 23tR is formed on the luminescent region 24R so that its width in the direction perpendicular to the scanning direction is equal to the width B82R (see FIG. 15) of each opening 82 of the shadow mask 81R and overlaps an inner part of the width, in the direction perpendicular to the scanning direction, of the luminescent region 24R. An inclination of the film-thickness-gradually-diminishing part 23sR is formed to be flat. The film-thickness-gradually-diminishing part 23sR is formed so as to straddle (i) the luminescent region 24R and (ii) a non-luminescent region 29 that is adjacent to the luminescent region 24R and is at the same side of the film-thickness-gradually-diminishing part 23sR and so as not to overlap an adjacent luminescent region 24B at the same side of the film-thickness-gradually-diminishing part 23sR.

In the present embodiment, after S16, the TFT substrate 10 on which the luminescent layer 23R has been formed is taken out of the vacuum chamber 60 (S17). Then, a green luminescent layer 23G is formed, in a manner similar to formation of the luminescent layer 23R, with the use of a mask unit 80 for formation of the green luminescent layer 23G (i.e., a shadow mask 81G and a vapor deposition source 85 for the luminescent layer 23G) and the vacuum chamber 60 so as to completely cover the luminescent region 24G.

The luminescent layer 23G has (i) the substantially flat part 23tG which has a substantially uniform thickness Tg and (ii) the film-thickness-gradually-diminishing part 23sG formed at both ends of the luminescent layer 23G in the direction (the y-axis direction) perpendicular to the scanning direction (see FIG. 14). The substantially flat part 23tG is formed on the luminescent region 24G so that its width in the direction perpendicular to the scanning direction is equal to the width B82G of each opening 82 of the shadow mask 81G and overlaps an inner part of the width, in the direction perpendicular to the scanning direction, of the luminescent region 24G. An inclination of the film-thickness-gradually-diminishing part 23sG is formed to be flat. The film-thickness-gradually-diminishing part 23sG is formed (i) so as to straddle the luminescent region 24G and a non-luminescent region 29 that is adjacent to the luminescent region 24G and is at the same side of the film-thickness-gradually-diminishing part 23sG and (ii) so as not to overlap a luminescent region 24B at the same side of the film-thickness-gradually-diminishing part 23sG. The thickness Tg of the luminescent layer 23G is equal to the thickness Tr of the luminescent layer 23R.

After formation of the luminescent layer 23G, a blue luminescent layer 23B is formed, in a manner similar to formation of the luminescent layers 23R and 23G, with the use of a mask unit 80 for formation of the blue luminescent layer 23B (i.e., a shadow mask 81B and a vapor deposition source 85 for the luminescent layer 23B) and the vacuum chamber 60 so as to completely cover the luminescent region 24B.

The luminescent layer 23B has (i) the substantially flat part 23tB which has a substantially uniform thickness Tb and (ii) the film-thickness-gradually-diminishing part 23sB formed at both ends of the luminescent layer 23B in the direction (the y-axis direction) perpendicular to the scanning direction (see FIG. 14). The substantially flat part 23tB is formed on the luminescent region 24B so that its width in the direction perpendicular to the scanning direction is equal to the width B82B (see FIG. 15) of each opening 82 of the shadow mask 81B and covers the width, in the direction perpendicular to the scanning direction, of the luminescent region 24B. An inclination of the film-thickness-gradually-diminishing part 23sB is formed to be flat. The film-thickness-gradually-diminishing part 23sB at the same side of the luminescent region 24R is formed so as to straddle (i) the luminescent region 24R and (ii) a non-luminescent region 29 between the luminescent region 24B and the luminescent region 24R. The film-thickness-gradually-diminishing part 23sB at the same side of the luminescent region 24G is formed so as to straddle (i) the luminescent region 24G and (ii) a non-luminescent region 29 between the luminescent region 24B and the luminescent region 24G.

The thickness Tb of the luminescent layer 23B is equal to the thickness Tr of the luminescent layer 23R and to the thickness Tb of the luminescent layer 23G. A width BB, in the direction perpendicular to the scanning direction, of the film-thickness-gradually-diminishing part 23sB at the same side of the luminescent region 24R is equal to the width BR, in the same direction, of the film-thickness-gradually-diminishing part 23sR of the luminescent layer 23R, whereas a width BB, in the direction perpendicular to the scanning direction, of the film-thickness-gradually-diminishing part 23sB at the same side of the luminescent region 24G is equal to the width, in the same direction, of the film-thickness-gradually-diminishing part 23sG of the luminescent layer 23G.

Accordingly, inclinations of the film-thickness-gradually-diminishing parts 23sB and 23sR are equal to each other, and inclinations of the film-thickness-gradually-diminishing parts 23sB and 23sG are equal to each other. Since both of the film-thickness-gradually-diminishing parts 23sB have the same width BB, inclinations of the film-thickness-gradually-diminishing parts 23sB, 23sR, and 23sG are equal to one another.

The luminescent layer 23R has, in regions 24R1 of the luminescent region 24R in the direction (the y-axis direction) perpendicular to the scanning direction, a gradually diminished thickness due to the film-thickness-gradually-diminishing part 23sR, but such gradually diminished thickness are compensated by the film-thickness-gradually-diminishing part 23sB of the luminescent layer 23B. As a result, the thickness in the regions 24R1 is equal to the thickness Tr of the substantially flat part 23tR. Similarly, a thickness in regions 24G1 is equal to the thickness of the substantially flat part 23tG. This makes it unnecessary to secure the distance (the film thickness decrease prevention margin) between the luminescent region 24R end and the substantially flat part 23tR end and the distance (the film thickness decrease prevention margin) between the luminescent region 24G end and the substantially flat part 23tG end (i.e., makes it possible to omit the film thickness decrease prevention margins).

The film thicknesses in the luminescent regions 24R, 24G, and 24B are uniform. That is, (i) the film thickness is uniform in each of the luminescent regions 24R, 24G, and 24B and (ii) the film thickness is uniform among the luminescent regions 24R, 24G, and 24B. This makes it possible to prevent a decline in organic EL properties.

Note that the luminescent layer 23B serves as an electron transfer layer in the luminescent regions 24R and 24G, and therefore no mixture of colors occurs.

Specifically, the present embodiment, for each of the processes of forming the luminescent layers 23G and 23B, prepared shadow masks 81G and 81B having openings 82 at positions corresponding to the luminescent layers 23G and 23B. The present embodiment placed the shadow masks 81G and 81B in respective vacuum chambers 60 for forming the luminescent layers 23G and 23B, respectively, and thus scanned the TFT substrate 10 for vapor deposition while carrying out an alignment so that the openings 82 of the shadow masks 81G and 81B coincide with (i) sub-pixel 2G columns and (ii) sub-pixel 2B columns, respectively.

The luminescent layer 23G was made of (TAZ) (host material) and Ir(ppy) 3 (green-light emitting dopant). These materials (green organic materials) were codeposited at respective vapor deposition rates of 5.0 nm/s and 0.67 nm/s to form the luminescent layer 23G.

The luminescent layer 23B was made of TAZ (host material) and 2-(4'-t-butyl phenyl)-5-(4"-biphenylyl)-1,3,4-oxadiazole (t-Bu PBD) (blue-light emitting dopant). These materials (blue organic materials) were codeposited at respective vapor deposition rates of 5.0 nm/s and 0.67 nm/s to form the luminescent layer 23B.

The luminescent layers 23G and 23B each had a film thickness of 50 nm.

The above steps prepared a TFT substrate 10 on which were formed respective patterns of the luminescent layers 23R, 23G, and 23B having respective colors of red (R), green (G), and blue (B).

In the TFT substrate 10 thus obtained, the non-luminescent region 29 between the luminescent regions 24R and 24B is expressed by the following equation 3:

the non-luminescent region 29 between the luminescent regions 24R and 24B=(the width BR of the film-thickness-gradually-diminishing part 23sR−the width 24R1 of the film-thickness-gradually-diminishing part 23sR in the luminescent region 24R)+the color mixture prevention margin C1 between the luminescent layer 23R and the luminescent region 24B            equation 3

Similarly, the non-luminescent region 29 between the luminescent regions 24G and 24B is expressed by the following equation 4:

the non-luminescent region 29 between the luminescent regions 24G and 24B=(the width BG of the film-thickness-gradually-diminishing part 23sG−the width 24G1 of the film-thickness-gradually-diminishing part 23sG in the luminescent region 24G)+the color mixture prevention margin C2 between the luminescent layer 23G and the luminescent region 24B            equation 4

According to the equations 3 and 4, the width BR of the non-luminescent region 29 between the luminescent regions 24R and 24B and the width BG of the non-luminescent region 29 between the luminescent regions 24G and 24B can be made smaller than the width (see the equation 1), in the same direction, of the non-luminescent region 29 of the conventional art and can be made smaller than the film-thickness-gradually-diminishing parts (vapor deposition blurs) 23sR and 23sG. This makes it possible to achieve a high-resolution display screen as compared with the conventional art.

Smaller regions 29 between luminescent regions allows wider luminescent regions 24R, 24G, and 24B to be secured. This allows a reduction in electric current density of pixels and an improvement in lifetime of an organic EL element. This ultimately allows an improvement in reliability of an organic EL display device.

Since the TFT substrate 10 can omit the film thickness decrease prevention margin as described above, the distance (the color mixture prevention margin) C1 between the luminescent layer 23R end and the luminescent region 24B of an adjacent pixel can be made larger. This makes it possible to prevent the luminescent layer 23R from overlapping the adjacent luminescent region 24B (i.e., prevent occurrence of mixture of colors) even if there arises pattern mispositioning of the luminescent layer 23R in the direction perpendicular to the scanning direction. Similarly, since the color mixture prevention margin C2 can be made larger, it is possible to prevent the luminescent layer 23G from overlapping the adjacent luminescent region 24B even if there arises pattern mispositioning of the luminescent layer 23G in the direction perpendicular to the scanning direction. It is therefore possible to prevent mixture of a color with a color of an adjacent pixel and a decrease in film thickness in the pixel without sacrificing display quality and reliability.

Moreover, since the luminescent regions 24R, 24G, and 24B are provided in the order of R/B/G/B, the luminescent layers 23R and 23G do not directly overlap each other. It is therefore possible to prevent mixture of colors between the luminescent regions 24R and 24G.

The present embodiment has discussed a case where the structure of the present invention is applied to the scan vapor deposition method for carrying out vapor deposition while securing a gap between the substrate 10 and the shadow mask 81. Note, however, that the structure of the present invention is applicable to other vapor deposition methods, provided that the film-thickness-gradually-diminishing parts 23sR, 23sG, and 23sB of the vapor-deposited films (i.e., the luminescent layers 23R, 23G, and 23B) can be formed in the luminescent regions 24R, 24G, and 24B, respectively. For example, a shadow effect, which is produced by increasing a thickness of the shadow mask 81, can be used to cause side surfaces of a vapor-deposited film to have a tilted shape so that film-thickness-gradually-diminishing parts are formed in a luminescent region.

Alternatively, it is possible to modify the present embodiment by additionally providing a restriction plate, for restricting a direction in which vapor deposition particles are injected, between the shadow mask 81 and the vapor deposition source 85. The addition of the restriction plate for restricting a direction in which vapor deposition particles are injected makes it possible to adjust widths of the film-thickness-gradually-diminishing parts 23sR, 23sG, and 23sB. For example, a width of each film-thickness-gradually-diminishing part can be adjusted by providing a restriction plate, having a plurality of openings, between the shadow mask 81 and the vapor deposition source 85 so that injection holes through which vapor deposition particles which will constitute a vapor-deposited film in a region on a film formation substrate are injected are restricted or specified.

The present embodiment is arranged such that the mask unit 80 is fixedly placed in the vacuum chamber 60. The present embodiment is, however, not limited to such an arrangement.

The vapor deposition device 50 may include, instead of the substrate moving mechanism 70, (i) a substrate holding member 71 (for example, an electrostatic chuck) for fixing the film formation substrate 200 and (ii) a mask unit moving mechanism (mask unit moving means) for moving the mask unit 80 relative to the film formation substrate 200 while maintaining the respective positions of the shadow mask 81 and the vapor deposition source 85 relative to each other. The vapor deposition device 50 may alternatively include both the substrate moving mechanism 70 and the mask unit moving mechanism.

In other words, the film formation substrate 200 and the mask unit 80 simply need to be so provided that at least one of them is moveable relative to the other. The advantages of the present invention can be achieved regardless of which of the film formation substrate 200 and the mask unit 80 is arranged to move.

In the case where the mask unit 80 is moved relative to the film formation substrate 200 as described above, the mask unit 80 is arranged, for example, such that the shadow mask 81 and the vapor deposition source 85 are moved, relative to the film formation substrate 200, together with the mask holding member 87 (for example, an identical holder). This arrangement makes it possible to move the mask unit 80 relative to the film formation substrate 200 while maintaining the respective positions of the shadow mask 81 and the vapor deposition source 85 relative to each other.

In the case where the mask unit 80 is moved relative to the film formation substrate 200 as described above, the shadow mask 81 and the vapor deposition source 85 are preferably so held by, for example, an identical holder (holding member; holding means) as to be integrated with each other.

In the case where the film formation substrate 200 is moved relative to the mask unit 80 as described above, the shadow mask 81 and the vapor deposition source 85 simply need to be fixed in position relative to each other, but do not necessarily need to be integrated with each other.

The mask unit 80 may be arranged, for example, such that (i) the vapor deposition source 85 is fixed to, for example, a bottom wall among inner walls of the vacuum chamber 60, (ii) the mask holding member 87 is fixed to one of the inner walls of the vacuum chamber 60, and consequently (iii) the shadow mask 81 and the vapor deposition source 85 are fixed in position relative to each other.

The present embodiment describes an example case in which the openings 82 of the shadow mask 81 are aligned with the injection holes 86 of the vapor deposition source 85 so that the injection holes 86 are each positioned inside one of the openings 82 in a plan view and that the openings 82 are provided in a one-to-one correspondence with the injection holes 86. The present embodiment is, however, not limited to such an arrangement. The openings 82 do not necessarily need to be provided (i) to face the injection holes 86 or (ii) in a one-to-one correspondence with the injection holes 86.

Specifically, the openings 82 may each have a pitch p that is unequal to the pitch of an injection hole 86. Further, the widths d5 and d6 of an opening 82 do not need to match the opening width (opening diameter) of an injection hole 86. For example, in the example illustrated in FIG. 1, the injection holes 86 may each have an opening diameter that is larger or smaller than the width d6 of an opening 82. In addition, a plurality of injection holes 86 may be provided to correspond to a single opening 82, whereas a single injection hole 86 may be provided to correspond to a plurality of openings 82. Further, a part (that is, at least one) of a plurality of injection holes 86 or a partial region of an injection hole 86 may be provided to face a non-opening section (that is, a region of the shadow mask 81 which region is other than the openings 82; for example, a region between openings 82 and 82).

To improve material use efficiency, the openings 82 and the injection holes 86 are desirably provided in a one-to-one correspondence with the each other.

The present embodiment describes an example case in which both (i) the openings 82 of the shadow mask 81 and (ii) the injection holes 86 of the vapor deposition source 85 are arranged one-dimensionally. The present embodiment is, however, not limited to such an arrangement. It is alternatively possible to arrange both the openings 82 of the shadow mask 81 and the injection holes 86 of the vapor deposition source 85 two-dimensionally, provided that the openings 82 face the injection holes 86, respectively.

The present embodiment describes an example case involving a plurality of openings 82 in the shadow mask 81 and a plurality of injection holes 86 in the vapor deposition source 85. The present embodiment is, however, not limited to such an arrangement. The shadow mask 81 is simply required to include at least one opening 82, whereas the vapor deposition source 85 is simply required to include at least one injection hole 86.

The present embodiment describes an example case in which the shadow mask 81 includes slit-shaped openings 82. The shape of the openings 82 can, however, be simply set as appropriate to form a desired vapor deposition pattern, and is thus not particularly limited to any specific one.

The present embodiment describes an example case in which the substrate moving mechanism 70 includes an electrostatic chuck as the substrate holding member 71. Using the electrostatic chuck to hold the film formation substrate 200 as described above can effectively prevent self-weight bending of the film formation substrate 200.

The present embodiment is, however, not limited to such an arrangement. Depending on the size of the film formation substrate 200, the substrate holding member 71 may be, for example, a holding member such as a roller for applying tension to the substrate to mechanically sandwich and hold it.

The present embodiment describes an example case involving, as the shutter 89, a shutter capable of moving in a space between the shadow mask 81 and the vapor deposition source 85. The present embodiment is, however, not limited to such an arrangement. The present embodiment may alternatively be arranged, for example, such that (i) the vapor deposition source 85 is a vapor deposition source 85 that can be switched ON/OFF and that (ii) when a portion of the film formation substrate 200 which portion needs no vapor deposition is positioned in a region (that is, a region facing an opening 82) that faces an opening region of the shadow mask 81, vapor deposition is turned OFF so that no vapor deposition particles fly.

The present embodiment may alternatively be arranged, for example, such that the shutter 89 is a shutter 89 provided to the vapor deposition source 85 and serving to close the injection holes 86 of the vapor deposition source 85 to block emission (release) of vapor deposition particles.

The present embodiment may further alternatively be arranged such that instead of providing the shutter 89 to the injection holes 86, the vapor deposition source 85 is switched ON/OFF on the basis of a vapor deposition ON signal or a vapor deposition OFF signal to stop the generation itself of vapor deposition particles.

The present embodiment describes an example method for producing, as described above, an organic EL display device 1 of the bottom emission type, which extracts light from the TFT substrate 10 side. The present embodiment is, however, not limited to such production. The present invention is also suitably applicable to an organic EL display device 1 of a top emission type, which extracts light from the sealing substrate 40 side.

The present embodiment describes an example case that uses a glass substrate as a supporting substrate for each of the TFT substrate 10 and the sealing substrate 40. The present embodiment is, however, not limited to such an arrangement.

The respective supporting substrates for the TFT substrate 10 and the sealing substrate 40 may, for example, each be, other than a glass substrate, a transparent substrate such as a plastic substrate in the case where the organic EL display device 1 is an organic EL display device of the bottom emission type. In the case where the organic EL display device 1 is an organic EL display device of the top emission type, the respective supporting substrates may, for example, each be an opaque substrate such as a ceramics substrate other than the above transparent substrate.

The present embodiment describes an example case involving an anode (in the present embodiment, the first electrode 21) formed in a matrix. The anode is, however, not particularly limited in terms of shape, material, or size as long as it has the function as an electrode for supplying positive holes to an organic EL layer. The anode may have, for example, a stripe shape. By the nature of an organic EL element, at least one of the anode and the cathode is preferably transparent. An organic EL element typically includes a transparent anode.

Second Embodiment

With reference to FIG. 16, the following description will discuss another embodiment of the present invention.

First Embodiment employs an arrangement in which the thicknesses Tr, Tg, and Tb of the substantially flat parts 23tR, 23tG, and 23tB of the luminescent layers 23R, 23G, and 23B are equal to each other. The present embodiment employs an arrangement in which (i) thicknesses Tr and Tg of substantially flat parts 23tR and 23tG of luminescent layers 23R and 23G (first films) are equal to each other but (ii) a thickness Tb of a substantially flat part 23tB of a luminescent layer 23B (a second film) is larger than the thicknesses Tr and Tg of the substantially flat parts 23tR and 23tG of the luminescent layers 23R and 23G (see FIG. 16).

Further, in the present embodiment, a luminescent layer 23B2 (a third film) having the same color (i.e., blue) as the luminescent layer 23B is provided on each of the luminescent layers 23R and 23G so that film thicknesses in the luminescent regions 24R, 24G, and 24B are uniform.

More specifically, a thickness Tb2 of a substantially flat part 23tB2 of the luminescent layer 23B2 is expressed by the following equation 5:

$$Tb2 = Tb1 - Trg \qquad \text{equation 5}$$

where Trg (=Tr=Tg) is a thickness of each of the substantially flat parts 23tR and 23tG of the luminescent layers 23R and 23G and Tb1 (=Tb) is a thickness of the substantially flat part 23tB of the luminescent layer 23B.

Note that the luminescent layer 23B2 can be made of the same material as a material of which the luminescent layer 23B is made.

Differently from First Embodiment, according to a method of the present embodiment for producing an organic EL display device, (i) the substantially flat part 23tB of the luminescent layer 23B is formed so as to have the thickness Tb(=Tb1) that is larger than the thickness Trg of the substantially flat parts 23tR and 23tG of the luminescent layers 23R and 23G in a step for forming the luminescent layer 23B and (ii) a step for forming the luminescent layer 23B2 is added after the step for forming the luminescent layer 23B. Except (i) and (ii) above, the present embodiment is similar to First Embodiment.

In the step for forming the luminescent layer 23B2, the luminescent layer 23B2 is formed as described above, in a manner similar to formation of the luminescent layers 23R and 23G, with the use of a mask unit 80 for formation of the blue luminescent layer 23B2 (i.e., a shadow mask 81B2 (see FIG. 16) and a vapor deposition source 85 for the luminescent layer 23B2) and a vacuum chamber 60.

Note that the shadow mask 81B2 has openings 82r for the luminescent layer 23B2 formed on the luminescent layer 23R and openings 82g for the luminescent layer 23B2 formed on the luminescent layer 23G. A width B82r, in a direction (the y-axis direction) perpendicular to the scanning direction, of each of the openings 82r is equal to a width, in the same direction, of the substantially flat part 23tR of the luminescent layer 23R. A width B82g, in the direction (the y-axis direction) perpendicular to the scanning direction, of each of the openings 82g is equal to a width, in the same direction, of the substantially flat part 23tG of the luminescent layer 23G.

As described above, according to the present embodiment, (i) the thickness Tb1 of the substantially flat part 23tB of the luminescent layer 23B (second film) is larger than the thicknesses Tr and Tg of the substantially flat parts 23tR and 23tG of the luminescent layers 23R and 23G (first films) and (ii) the luminescent layer 23B2 (third film) is further provided on the substantially flat parts 23tR and 23tG of the luminescent layers 23R and 23G and on the film-thickness-gradually-diminishing part 23sB of the luminescent layer 23B so as to be substantially parallel to the substantially flat part 23tB of the luminescent layer 23B. Accordingly, in a case where the thickness Tb1 of the substantially flat part 23tB of the luminescent layer 23B is larger than the thicknesses Tr and Tg of the substantially flat parts 23tR and 23tG of the luminescent layers 23R and 23G, the luminescent layer 23B2 allows film thicknesses in the luminescent regions 24R, 24G, and 24B (first and second film formation regions) to be uniform.

Third Embodiment

With reference to FIG. 17, the following description will discuss another embodiment of the present invention.

In Second Embodiment, the thicknesses Tr and Tg of the luminescent layers 23R and 23G, respectively, are equal to each other. In contrast, in the present embodiment, as illustrated in FIG. 17, the thicknesses Tr and Tg of the luminescent layers 23R and 23G (first film) are different from each other.

In the present embodiment, a luminescent layer 23B2 (hereinafter luminescent layer 23B2R; third film) on the luminescent layer 23R and a luminescent layer 23B2 (hereinafter luminescent layer 23B2G; third film) on the luminescent layer 23G have a substantially flat part 23tB2R with a thickness Tb2r and a substantially flat part 23tB2G with a thickness Tb2r, respectively. The thickness Tb2r of the substantially flat part 23tB2R and the thickness Tb2r of the substantially flat part 23tB2G are represented by equations 6 and 7, respectively.

$$Tb2r=Tb1-Tr \quad \text{equation 6}$$

$$Tb2g=Tb1-Tg \quad \text{equation 7}$$

Also in the present embodiment, the luminescent layers 23R, 23G, and 23B have a uniform thickness.

A method for producing an organic EL display device in accordance with the present embodiment is the same as Second Embodiment except that the method of Second Embodiment is arranged such that the step of forming the luminescent layer 23B is divided into the step of forming the luminescent layer 23B2R and the step of forming the luminescent layer 23B2G, which are carried out in this order for example.

In the step of forming the luminescent layer 23B2R, using a mask unit 80 for forming the luminescent layer 23B2R (i.e. shadow mask 81B2R (not illustrated) and a vapor deposition source 85 for the luminescent layer 23B2R) and a vacuum chamber 60, the luminescent layer 23B2R is formed as above similarly with the film formation process of the luminescent layer 23B2 in Second Embodiment. In the step of forming the luminescent layer 23B2G, using a mask unit 80 for forming the luminescent layer 23B2G (i.e. shadow mask 81B2G (not illustrated) and a vapor deposition source 85 for the luminescent layer 23B2G) and the vacuum chamber 60, the luminescent layer 23B2G is formed as above similarly with the film formation process of the luminescent layer 23B2 in Second Embodiment.

The shadow mask 81B2R (not illustrated) for the luminescent layer 23B2R is formed similarly with the shadow mask 81R for the luminescent layer 23R, and the shadow mask 81B2G (not illustrated) for the luminescent layer 23B2G is formed similarly with the shadow mask 81G for the luminescent layer 23G.

As described above, in the present embodiment, a configuration in which the thicknesses Tr and Tg of the luminescent layers 23R and 23G (first film) are different from each other yields an effect similar to that of Second Embodiment.

Fourth Embodiment

With reference to FIG. 18, the following description will discuss another embodiment of the present invention.

In First Embodiment, the thicknesses Tr, Tg, and Tb of the substantially flat parts 23tR, 23tG, and 23tB of the luminescent layers 23R, 23G, and 23B, respectively, are equal to one another (Tr=Tg=Tb). In contrast, in the present embodiment, thicknesses Tr, Tg, and Tb of luminescent layers 23R (first film), 23G (first film), and 23B (second film), respectively, are set so that resistances Rr, Rg, and Rb in film thickness direction of substantially flat parts 23tR, 23tG, and 23tB of the luminescent layers 23R, 23G, and 23B, respectively, are equal to one another (Rr=Rg=Rb).

In other words, when resistivity of the luminescent layers 23R, 23G, and 23B in film thickness direction are set to ρr, ρg, and ρb, respectively, and resistivity of the substantially flat parts 23tR, 23tG, and 23tB of the luminescent layers 23R, 23G, and 23B in film thickness direction are set to R (=Rr=Rg=Rb), the thicknesses Tr, Tg, and Tb of the luminescent layers 23R, 23G, and 23B are determined in such a manner as to meet equation 8.

$$R=\rho r \times Tr = \rho g \times Tg = \rho b \times Tb \quad \text{equation 8}$$

In the present embodiment, the thicknesses Tr, Tg, and Tb of the luminescent regions 24R, 24G, and 24B, respectively, are not equal to one another, whereas the resistances Rr, Rg, and Rb in film thickness direction are equal to one another even at regions where the luminescent layers 23R, 23G, and 23B overlap one another (i.e. a region 24R1 where film-thickness-gradually-diminishing parts 23sR and 23sB overlap each other (see FIG. 14) and a region 24G1 where film-thickness-gradually-diminishing parts 23sG and 23sB overlap each other (see FIG. 14)).

This is verified with respect to the luminescent layers 23R and 23B. As illustrated in FIG. 18, it is assumed that film-thickness-gradually-diminishing parts 23sR and 23sB of the luminescent layers 23R and 23B, respectively, overlap each other at an overlapping region 77.

The resistances Rr and Rb in film thickness direction of the substantially flat parts 23tR and 23tB of the luminescent layers 23R and 23B, respectively, are equal to each other according to the equation 8. On the other hand, assume that one end of the overlapping region 77 in the direction perpendicular to the scanning direction is regarded as an origin O, u-axis extends from the origin O toward the other end of the overlapping region 77, and the width of the overlapping region 77 in u-axis direction is set to B. In this case, the whole resistance Ru at a position u in film thickness direction is the sum of resistance of the luminescent layer 23R at the position u (ρr×Tr×(u/B)) and resistance of the luminescent layer 23B at the position u (ρb×Tb×{(B−u)/B}), and the whole resistance Ru is represented by equation 9. Here, inclinations of the film-thickness-gradually-diminishing parts 23sR and 23sB are assumed to be flat.

$$Ru=\rho r \times Tr \times (u/B) + \rho b \times Tb \times \{(B-u)/B\} \quad \text{equation 9}$$

Equation 10 is derived from the equations 8 and 9.

$$Ru=\rho b \times Tb=R \quad \text{equation 10}$$

According to the equation 10, resistance Ru in film thickness direction of the overlapping region 77 (and therefore region 24R1 overlapping film-thickness-gradually-diminishing part 23sR) is equal to resistance R in film thickness direction of the substantially flat part 23tR.

As described above, the thicknesses Tr, Tg, and Tb of the substantially flat parts 23tR, 23tG, and 23tB of the luminescent layers 23R, 23G, and 23B, respectively, are set in such a manner that the resistances Rr, Rg, and Rb in film thickness direction of the substantially flat parts 23tR, 23tG, and 23tB of the luminescent layers 23R, 23G, and 23B, respectively, are equal to one another. Consequently, even when the film-thickness-gradually-diminishing parts 23sR, 23sG, and 23sB appear in the luminescent layers 23R, 23G, and 23B, respectively, merely overlapping the film-thickness-gradually-diminishing parts 23sR, 23sG, and 23sB allow equalizing resistances in film thickness direction of the luminescent regions 24R, 24G, and 24B, respectively.

Equalizing resistances in film thickness direction of the luminescent regions 24R, 24G, and 24B allows eliminating distributions of resistance values in the luminescent regions 24R, 24G, and 24B, respectively, allowing uniformly passing currents in the luminescent regions 24R, 24G, and 24B, respectively. This allows preventing damages to organic EL elements and variations in life of the organic EL elements due to local concentration of a current, thereby realizing an organic EL display device with high reliability.

Fifth Embodiment

With reference to FIGS. 19 and 20, the following description will discuss another embodiment of the present invention.

In First Embodiment, the thicknesses Tr, Tg, and Tb of the substantially flat parts 23$t$R, 23$t$G, and 23$t$B of the luminescent layers 23R, 23G, and 23B, respectively, are equal to one another. In contrast, in the present embodiment, as illustrated in FIG. 19, thicknesses Tr and Tg of substantially flat parts 23$t$R and 23$t$G of luminescent layers 23R and 23G (first film), respectively, are equal to each other, whereas a thickness Tb of a substantially flat part 23$t$B of a luminescent layer 23B (second film) is smaller than the thicknesses Tr and Tg of the substantially flat parts 23$t$R and 23$t$G of the luminescent layers 23R and 23G, respectively.

In the present embodiment, a buffer layer 23D (first buffer layer) is formed on the luminescent layer 23B so that the thicknesses of the luminescent regions 24R, 24G, and 24B are uniformed. To be more specific, assume that the thicknesses of the substantially flat parts 23$t$R and 23$t$G of the luminescent layers 23R and 23G are Trg (=Tr=Tg), the thickness of the substantially flat part 23$t$B of the luminescent layer 23B is Tb, and the thickness of a substantially flat part 23$t$D of the buffer layer 23D is Tbff. In this case, the thickness Tbff is represented by equation 11.

$$Tbff=Trg-Tb \quad \text{equation 11}$$

The buffer layer 23D is a layer having the same function as that of an electron transfer layer. Examples of the material for the buffer layer 23D include a host material for a luminescent layer (e.g. 23B) and the same material as that for an electron transfer layer.

The method for producing an organic EL display device in accordance with the present embodiment is the same as First Embodiment except that the step of forming the luminescent layer 23B in the step S3 in First Embodiment is arranged such that the thickness Tb of the substantially flat part 23$t$B of the luminescent layer 23B is smaller than the thickness Trg of the substantially flat parts 23$t$R and 23$t$G of the luminescent layers 23R and 23G, respectively, and that a buffer layer vapor deposition step S3-2 for forming the buffer layer 23D is carried out after the step of forming the luminescent layer 23B (i.e. after the step S3).

In the buffer layer vapor deposition step S3-2, using a mask unit 80 for forming the buffer layer 23D (i.e. shadow mask 81D (not illustrated) and a vapor deposition source 85 for the buffer layer 23D) and the vacuum chamber 60, the buffer layer 23D is formed as above similarly with the film formation process for the luminescent layers 23R, 23G, and 23B. The shadow mask 81D for the buffer layer 23D may be the same as the shadow mask 81B for the luminescent layer 23B.

As described above, in the present embodiment, the thickness Tb of the substantially flat part 23$t$B of the luminescent layer 23B (second film) is smaller than the thicknesses Tr and Tg of the substantially flat parts 23$t$R and 23$t$G of the luminescent layers 23R and 23G (first film), respectively, and the buffer layer 23D is further provided on the luminescent layer 23B in such a manner as to form a flat plane with the substantially flat parts 23$t$R and 23$t$G of the luminescent layers 23R and 23G, respectively. Consequently, in a case where the thickness Tbff of the substantially flat part 23$t$D of the luminescent layer 23B is smaller than the thicknesses Tr and Tg of the substantially flat parts 23$t$R and 23$t$G of the luminescent layers 23R and 23G, respectively, provision of the buffer layer 23D allows the luminescent regions 24R, 24G, and 24B (first and second film formation regions) to have a uniform thickness.

Sixth Embodiment

With reference to FIG. 21, the following description will discuss another embodiment of the present invention.

In Fifth Embodiment, the thicknesses Tr and Tg of the luminescent layers 23R and 23G, respectively, are equal to each other. In contrast, in the present embodiment, as illustrated in FIG. 21, thicknesses Tr and Tg of luminescent layers 23R and 23G (first film), respectively, are different from each other (e.g. Tr>Tg). Also in the present embodiment, similarly with Fifth Embodiment, a thickness Tb of a luminescent layer 23B (second film) is smaller than the thicknesses Tr and Tg of the luminescent layers 23R and 23G, respectively (i.e. Tr>Tg>Tb).

In the present embodiment, provision of a first buffer layer 23D1 (first buffer layer) on the luminescent layer 23B (second film) allows the thickness of a luminescent region 24B to be equal to the thickness Tr of the luminescent layer 23B (i.e. larger one of the thicknesses Tr and Tg). Furthermore, provision of a second buffer layer 23D2 (second buffer layer) on the luminescent layer 23G (i.e. one of the luminescent layers 23R and 23G with smaller one of the thicknesses Tr and Tg) (first film) allows the thickness of a luminescent region 24G (i.e. luminescent region corresponding to one of the luminescent layers 23R and 23G with smaller one of the thicknesses Tr and Tg) to be equal to the thickness Tr of the luminescent layer 23R. This uniforms the thicknesses of the luminescent regions 24R, 24G, and 24B.

To be more specific, a thickness Tbff1 of a substantially flat part 23$t$D1 of a first buffer layer 23D1 is represented by equation 12. A thickness Tbff2 of a substantially flat part 23$t$D2 of a second buffer layer 23D2 is represented by equation 13.

$$Tbff1=Tr-Tb \quad \text{equation 12}$$

$$Tbff2=Tr-Tg \quad \text{equation 13}$$

Materials for the first buffer layer 23D1 and the second buffer layer 23D2 may be the same as that for the buffer layer 23D in Fifth Embodiment.

The method for producing an organic EL display device in accordance with the present embodiment is the same as Fifth Embodiment except that the method of Fifth Embodiment is arranged such that the buffer layer vapor deposition step S3-2 is divided into the step of forming the first buffer layer 23D1 and the step of forming the second buffer layer 23D2 and the step of forming the second buffer layer 23D2 is carried out after the step of forming the first buffer layer 23D1.

To be more specific, in the step of forming the first buffer layer 23D1, using a mask unit 80 for forming the first buffer layer 23D1 (i.e. shadow mask (e.g. one formed similarly with the shadow mask 81B for the luminescent layer 23B) and a vapor deposition source 85 for the first buffer layer 23D1) and a vacuum chamber 60, the first buffer layer 23D1 with a thickness Tbff1 is formed on the luminescent layer 23B similarly with the film formation process for the luminescent layer 23B.

Furthermore, in the step of forming the second buffer layer 23D2, using a mask unit 80 for forming the second buffer layer 23D2 (i.e. shadow mask (e.g. one formed similarly with the shadow mask 81G for the luminescent layer 23G) and a vapor deposition source 85 for the second buffer layer 23D2) and the vacuum chamber 60, the second buffer layer 23D2 with a thickness Tbff2 is formed on the luminescent layer 23G similarly with the film formation process for the luminescent layer 23G.

As described above, in the present embodiment, in a case where the thickness Tb of the substantially flat part 23$t$B of the luminescent layer 23B (second film) is smaller than the thickness Tg of the substantially flat part 23$t$G of the luminescent layer 23G (first film), provision of the first buffer layer 23D1 and the second buffer layer 23D2 allows the film thicknesses in the luminescent regions 24G and 24B (first and second film formation regions) to be uniformed to be predetermined one (thickness Tr of the luminescent layer 23R) which is larger than the thickness Tg of the substantially flat part 23tG of the luminescent layer 23G.

In the present embodiment, a description was provided as to the case of Tr>Tg. It should be noted that the same is applied to the case of Tr<Tg.

Seventh Embodiment

With reference to FIGS. 22 and 23, the following description will discuss another embodiment of the present invention.

In First Embodiment, only the luminescent layers 23R and 23G have, at both ends thereof in y-axis direction (predetermined direction), film-thickness-gradually-diminishing parts 23sR and 23sG whose thickness gradually diminishes toward front ends in y-axis direction of the film-thickness-gradually-diminishing parts 23sR and 23sG, respectively, and base ends in y-axis direction of the film-thickness-gradually-diminishing parts 23sR and 23sG overlap the luminescent regions 24R and 24G, respectively. In contrast, in the present embodiment, as illustrated in FIG. 22, luminescent layers 23R, 23G, and 23B (first film) have, at both ends thereof in y-axis direction (predetermined direction), film-thickness-gradually-diminishing parts 23sR, 23sG, and 23tB whose thickness gradually diminishes toward front ends in y-axis direction of the luminescent layers 23R, 23G, and 23B, respectively, and base ends in y-axis direction of the film-thickness-gradually-diminishing parts 23sR, 23sG, and 23tB overlap the luminescent regions 24R, 24G, and 24B (film formation region), respectively.

In the present embodiment, the film-thickness-gradually-diminishing parts 23sR and 23sG of the luminescent layers 23R and 23G, respectively, which are adjacent to each other, are formed at the center, in the direction perpendicular to the scanning direction, of a region (non-luminescent region) 29 between the luminescent regions 24R and 24G in such a manner that the film-thickness-gradually-diminishing parts 23sR and 23sG do not overlap each other. Similarly, the film-thickness-gradually-diminishing parts 23sG and 23sB of the luminescent layers 23G and 23B, respectively, which are adjacent to each other, are formed at the center, in the direction perpendicular to the scanning direction, of a region (non-luminescent region) 29 between the luminescent regions 24G and 24B in such a manner that the film-thickness-gradually-diminishing parts 23sG and 23sB do not overlap each other.

Similarly with First Embodiment, in the present embodiment, the thicknesses Tr, Tg, and Tb of the luminescent layers 23R, 23G, and 23B, respectively, are equal to one another (i.e. Tr=Tg=Tb).

Similarly with the conventional art, in the present embodiment, one pixel is constituted by sub-pixels 2R, 2G, and 2B which are arranged in the order of R, G, and B.

In the present embodiment, the region (non-light-emitting region) 29 between the luminescent regions has a luminescent layer 23B3 (second film). The luminescent layer 23B3 emits light of the same color as that of the luminescent layer 23B for example (i.e. blue), and has the same thickness as the thicknesses Tr, Tg, and Tb of the luminescent layers 23R, 23G, and 23B, respectively.

The widths of openings 15R, 15G, and 15B of the sub-pixels 2R, 2G, and 2B, respectively, in a TFT substrate 10 are set to 360 µm (in scanning direction)×110 µm (in direction perpendicular to scanning direction). The pitch among the openings 15R, 15G, and 15B is set to 480 µm (in scanning direction)×160 µm (in direction perpendicular to scanning direction). It should be noted that the pitch among the openings 15R, 15G, and 15B (pitch among openings of pixels) indicates a pitch among the openings 15R, 15G, and 15B of the sub-pixels 2R, 2G, and 2B, respectively, which are adjacent to one another, and does not indicate a pitch among sub-pixels of the same color.

The luminescent layer 23B3 on the region 29 between the luminescent regions 24R and 24G have, at both ends thereof in y-axis direction (predetermined direction), a film-thickness-gradually-diminishing part 23sB3 whose thickness gradually diminishes toward a front end in y-axis direction of the luminescent layer 23B3, and the film-thickness-gradually-diminishing part 23sB3 overlaps a film-thickness-gradually-diminishing part 23sR or 23sR of the light-emitting layer 23R or 23R at the same side of the film-thickness-gradually-diminishing part 23sB3 to compensate for a gradually diminished thickness of the film-thickness-gradually-diminishing part 23sR or 23sR. Provision of the luminescent layer 23B3 as above uniforms the film thicknesses in the luminescent regions 24R, 24G, and 24B.

A width BtB3 in y-axis direction of the substantially flat part 23tB3 of the luminescent layer 23B3 is set to be equal in size to a distance Brg between the luminescent layers 23R and 23G in y-axis direction which are at both ends of the luminescent layer 23B3 or a distance Bgb between the luminescent layers 23G and 23B in y-axis direction which are at both ends of the luminescent layer 23B3.

A width BsB3, in the direction perpendicular to the scanning direction, of the film-thickness-gradually-diminishing part 23sB3 of the luminescent layer 23B3 is set to be equal to widths BR, BG, and BB in scanning perpendicular direction of film-thickness-gradually-diminishing parts 23sR, 23sG, and 23sB, respectively, which overlap the film-thickness-gradually-diminishing part 23sB3.

The method for producing an organic EL display device in accordance with the present embodiment is the same as First Embodiment except that the method in accordance with First Embodiment is arranged such that in the luminescent layer vapor deposition step S3, the luminescent layers 23R, 23G, and 23B are formed as above and then the luminescent layer 23B2 is formed as above.

As illustrated in FIG. 23, a shadow mask 81R for the luminescent layer 23R is designed such that a width B82R in y-axis direction of an opening 82 of the shadow mask 81R is set to be smaller than the width in y-axis direction of the luminescent region 24R. In the step of forming the luminescent layer 23R, the shadow mask 81B is used in such a manner that the center in y-axis direction of the opening 82 of the shadow mask 81B substantially coincides with the center in y-axis direction of the luminescent region 24R and there is provided a distance between the shadow mask 81B and a film formation substrate 200. Similarly, the shadow masks 81G and 81B (not illustrated) for the luminescent layers 23G and 23B, respectively, are designed such that widths B82G and B82B (not illustrated) in y-axis direction of the openings 82 of the shadow masks 81G and 81B, respectively, are set to be smaller than the widths in y-axis direction of the luminescent regions 24G and 24B, respectively. In the step of forming the luminescent layers 23G and 23B, the shadow masks 81G and 81B are used in such a manner that the centers in y-axis direction of the openings 82 of the shadow masks 81G and 81B substantially coincides with the centers in y-axis direction of the luminescent regions 24G and 24B, respectively, and there is provided a distance between each of the shadow masks 81G and 81B and the film formation substrate 200.

Here, opening widths of openings B82R, B82G, and B82B of the shadow masks 81R, 81G, and 81B with respect to the luminescent layers 23R, 23G, and 23B (first film), respectively, are set to be 150 mm (width d5 in long axis direction; see FIG. 1)×50 µm (width d6 in short axis direction; see FIG. 1), a distance d8 between adjacent openings 82 (see FIG. 1) is set to be 430 µm, and a pitch p between centers of adjacent openings 82 (see FIG. 1) is set to be 480 µm.

A shadow mask 81B3 for a luminescent layer 23B3 is designed such that a width B82B3 in y-axis direction of the opening 82 of the shadow mask 81B3 is set to be equal in size to a distance B100 between the luminescent layers 23R and 23G (or between 23G and 23B). In the step of forming the luminescent layer 23B3, the shadow mask 81B3 is used in such a manner that the center in y-axis direction of the opening 82 of the shadow mask 81B3 substantially coincides with the center in y-axis direction of the region (non-luminescent region) 29 between the luminescent regions 24R and 24G (or 24G and 24B) and there is provided a distance between the shadow mask 81B3 and the film formation substrate 200.

Here, an opening width B82B3 of the opening 82 of the shadow mask 81B3 with respect to the luminescent layer 23B3 (second film) is set to be 150 mm (width d5 in long axis direction; see FIG. 1)×10 µm (width d6 in short axis direction; see FIG. 1), a distance d8 between adjacent openings 82 (see FIG. 1) is set to be 150 µm, and a pitch p between centers of adjacent openings 82 (see FIG. 1) is set to be 160 µm.

As described above, in the present embodiment, the luminescent layers 23R, 23G, and 23B (first film) are formed in such a manner that the film-thickness-gradually-diminishing parts 23sR, 23sG, and 23sB overlap, at base ends thereof, the luminescent regions 24R, 24G, and 24B (film formation region). Consequently, it is possible to secure a wide region (color mixture prevention margin) 29 between the luminescent layer 23R, 23G, or 23B and a film formation region (one of 23R, 23G, and 23B) adjacent to the film-thickness-gradually-diminishing part 23sR, 23sG, or 23sB. This allows preventing mixture of colors caused by the luminescent layers 23R, 23G, and 23B overlapping adjacent film formation regions at the film-thickness-gradually-diminishing parts 23sR, 23sG, and 23sB sides, respectively, even when the luminescent layers 23R, 23G, and 23B suffer large pattern shift in y-axis direction.

Furthermore, since the region 29 between each of the luminescent regions 24R, 24G, and 24B and the adjacent film formation region is not required to be wide in order to widen the color mixture prevention margin, the luminescent regions 24R, 24G, and 24B (i.e. display screen) can have high resolution.

Furthermore, the luminescent layer 23B3 (second film) is formed in such a manner that the film-thickness-gradually-diminishing part 23sB3 thereof overlaps the base end part of the film-thickness-gradually-diminishing part 23sR, 23sG, or 23sB of the luminescent layer 23R, 23G, or 23B at the same side as the film-thickness-gradually-diminishing part 23sB3 so as to compensate for the diminished thickness of the base end part of the film-thickness-gradually-diminishing part 23sR, 23sG, or 23sB. This allows preventing decrease in film thickness in the luminescent regions 24R, 24G, and 24B.

In the present embodiment, the second film is a luminescent layer. However, the present invention is not limited to this, and the second film may be a host material constituting a luminescent layer or an electron transfer layer.

Overview

As described above, the film formation substrate in accordance with an embodiment of the present invention is preferably arranged such that the second film-thickness-gradually-diminishing part overlaps a base end of the first film-thickness-gradually-diminishing part.

According to the arrangement, in which the second film-thickness-gradually-diminishing part overlaps a base end of the first film-thickness-gradually-diminishing part, the second film-thickness-gradually-diminishing part completely compensates for a gradually diminished thickness at the base end of the first film-thickness-gradually-diminishing part. It is therefore possible to prevent a decrease in film thickness in the first film formation region.

The film formation substrate in accordance with an embodiment of the present invention is preferably arranged such that a base end, in the predetermined direction, of the first film-thickness-gradually-diminishing part overlaps a corresponding one of the first film formation regions.

According to the arrangement, in which a base end, in the predetermined direction, of the first film-thickness-gradually-diminishing part overlaps a corresponding one of the first film formation regions, it is possible to secure a wide space (i.e., color mixture prevention margin) between the first film and the second film formation region without shortening a width, in the predetermined direction, of the first film-thickness-gradually-diminishing part. This makes it possible to prevent mixture of colors caused by overlapping between the first film and the second film formation region even if the first film is largely mispositioned in the predetermined direction.

In addition, since the color mixture prevention margin can be widened without widening a region between the first film formation region and the second film formation region, the first film formation region and the second film formation region (i.e., a display screen) can have higher resolution.

The film formation substrate in accordance with an embodiment of the present invention is preferably arranged such that the second film-thickness-gradually-diminishing part is disposed on an outside, in the predetermined direction, of a corresponding one of the second film formation regions.

According to the arrangement, the second film-thickness-gradually-diminishing part is disposed on an outside, in the predetermined direction, of a corresponding one of the second film formation regions. That is, a second substantially flat part, which is a part of the second film other than the second film-thickness-gradually-diminishing part, sufficiently covers the second film formation region. It is therefore possible to prevent a lack of the second film in the second film formation region even if the second film is largely mispositioned in the predetermined direction.

The film formation substrate in accordance with an embodiment of the present invention is preferably arranged such that the first films are red and/or green luminescent layers, and the second films are blue luminescent layers.

According to the arrangement, in which the first films are red and/or green luminescent layers, and the second films are blue luminescent layers, it is possible to prevent mixture of colors caused by overlapping between the second film and the first film formation region.

The film formation substrate in accordance with an embodiment of the present invention is preferably arranged such that the first films and the second films are disposed in an order of red, blue, green, and blue luminescent layers.

According to the arrangement, in which the first films and the second films are disposed in an order of red, blue, green, and blue luminescent layers, the present invention can be applied to a display device in which red, blue, green, and blue pixels are provided in each pixel in this order.

The film formation substrate in accordance with an embodiment of the present invention is preferably arranged such that a first substantially flat part, which is a part of said each of the first films other than the first film-thickness-gradually-diminishing part, has a thickness equal to a thickness of a second substantially flat part, which is a part of said each of the second films other than the second film-thickness-gradually-diminishing part, and a sum of a thickness of the first film-thickness-gradually-diminishing part and a thickness of the second film-thickness-gradually-diminishing part is equal to the thickness of the first substantially flat part and the second substantially flat part.

According to the arrangement, a first substantially flat part, which is a part of said each of the first films other than the first film-thickness-gradually-diminishing part, has a thickness equal to a thickness of a second substantially flat part, which is a part of said each of the second films other than the second film-thickness-gradually-diminishing part, and a sum of a thickness of the first film-thickness-gradually-diminishing part and a thickness of the second film-thickness-gradually-diminishing part is equal to the thickness of the first substantially flat part and the second substantially flat part. This allows film thicknesses in the first film formation region and the second film formation region to be uniform.

The film formation substrate in accordance with an embodiment of the present invention is preferably arranged such that a second substantially flat part, which is a part of said each of the second films other than the second film-thickness-gradually-diminishing part, has a thickness larger than a thickness of a first substantially flat part, which is a part of said each of the first films other than the first film-thickness-gradually-diminishing part, and the film formation substrate further comprises a third film provided on the first substantially flat part and on the second film-thickness-gradually-diminishing part.

According to the arrangement, a second substantially flat part, which is a part of said each of the second films other than the second film-thickness-gradually-diminishing part, has a thickness larger than a thickness of a first substantially flat part, which is a part of said each of the first films other than the first film-thickness-gradually-diminishing part. In a case where the thickness of the second substantially flat part is larger than the thickness of the first substantially flat part, the third film allows a difference between the thickness in the first film formation region and the thickness in the second film formation region to be smaller.

The film formation substrate in accordance with an embodiment of the present invention is preferably arranged such that a surface of the second substantially flat part and a surface of the third film form a substantially flat plane.

According to the arrangement, in which a surface of the second substantially flat part and a surface of the third film form a substantially flat plane, film thicknesses in the first film formation region and the second film formation region can be made uniform.

The film formation substrate in accordance with an embodiment of the present invention is preferably arranged such that the third film is a blue luminescent layer or an electron transfer layer.

According to the arrangement, in which the third film is a blue luminescent layer or an electron transfer layer, it is possible to prevent mixture of colors caused by overlapping between the third film and the first film formation region.

The film formation substrate in accordance with an embodiment of the present invention is preferably arranged such that a first substantially flat part, which is a part of said each of the first films other than the first film-thickness-gradually-diminishing part, has a resistance equal to a resistance of a second substantially flat part, which is a part of said each of the second films other than the second film-thickness-gradually-diminishing part.

According to the arrangement, resistances, in a film thickness direction, of the first and second substantially flat parts are equal to one another. Accordingly, resistances of the first and second film-thickness-gradually-diminishing part can be made equal to the resistances, in the film thickness direction, of the first and second substantially flat parts simply by causing the first and second film-thickness-gradually-diminishing parts to overlap each other.

The film formation substrate in accordance with an embodiment of the present invention is preferably arranged such that a second substantially flat part, which is a part of said each of the second films other than the second film-thickness-gradually-diminishing part, has a thickness smaller than a thickness of a first substantially flat part, which is a part of said each of the first films other than the first film-thickness-gradually-diminishing part, and the film formation substrate further includes a first buffer layer provided on said each of the second films.

According to the arrangement, a second substantially flat part, which is a part of said each of the second films other than the second film-thickness-gradually-diminishing part, has a thickness smaller than a thickness of a first substantially flat part, which is a part of said each of the first films other than the first film-thickness-gradually-diminishing part, and the film formation substrate further includes a first buffer layer provided on said each of the second films. Accordingly, in a case where the thickness of the second substantially flat part is smaller than the thickness of the first substantially flat part, the first buffer layer makes it possible to reduce a difference between the thickness of the first film and the thickness of the second film. This allows film thicknesses in the first film formation region and the second film formation region to be nearly uniform.

The film formation substrate in accordance with an embodiment of the present invention is preferably arranged such that the thickness of the first substantially flat part is equal to a sum of a thickness of the first buffer layer and a thickness of said each of the second films.

According to the arrangement, in which the thickness of the first substantially flat part is equal to a sum of a thickness of the first buffer layer and a thickness of said each of the second films, the first buffer layer allows film thicknesses in the first film formation region and the second film formation region to be uniform.

The film formation substrate in accordance with an embodiment of the present invention is preferably arranged to further include a second buffer layer provided on at least some of the first films.

According to the arrangement, the second buffer layer is provided on at least some of the first films. In a case where a thickness of first substantially flat parts of the at least some of the first films is smaller than a thickness of first substantially flat parts of the other first films, the second buffer layer makes it possible to reduce a shortage of the thickness of the at least some of the first films. This allows film thicknesses in first film formation regions to be nearly uniform.

The film formation substrate in accordance with an embodiment of the present invention is preferably arranged such that a sum of a thickness of a first substantially flat part of each of the at least some of the first films and a thickness of the second buffer layer is equal to a sum of a thickness of the first buffer layer and a thickness of the second film.

According to the arrangement, a sum of a thickness of a first substantially flat part of each of the at least some of the first films and a thickness of the second buffer layer is equal to a sum of a thickness of the first buffer layer and a thickness of the second film. This allows film thicknesses in the first film formation region and the second film formation region to be uniform.

The film formation substrate in accordance with an embodiment of the present invention is preferably arranged such that the first buffer layer is (i) a host material constituting a blue luminescent layer or (ii) an electron transfer layer.

According to the arrangement, in which the first buffer layer is (i) a host material constituting a blue luminescent layer or (ii) an electron transfer layer, it is possible to prevent mixture of colors caused by overlapping between the first buffer layer and the first film formation region and the second film formation region.

The film formation substrate in accordance with an embodiment of the present invention is preferably arranged such that the second buffer layer is (i) a host material constituting a blue luminescent layer or (ii) an electron transfer layer.

According to the arrangement, in which the second buffer layer is (i) a host material constituting a blue luminescent layer or (ii) an electron transfer layer, it is possible to prevent mixture of colors caused by overlapping between the first buffer layer and the first film formation region and the second film formation region.

The film formation substrate in accordance with an embodiment of the present invention is preferably arranged such that a width, in the predetermined direction, of the first film-thickness-gradually-diminishing part is larger than a width, in the predetermined direction, of a region between the first and second film formation regions.

According to the arrangement, a width, in the predetermined direction, of the first film-thickness-gradually-diminishing part is larger than a width, in the predetermined direction, of a region between the first and second film formation regions. That is, an inclination of the first film-thickness-gradually-diminishing part can be made gradual. It is therefore possible to reduce an influence of mixture of colors even in a case where the first film-thickness-gradually-diminishing part overlaps the second film formation region.

The film formation substrate in accordance with an embodiment of the present invention is preferably arranged such that the second film-thickness-gradually-diminishing part overlaps a base end of the first film-thickness-gradually-diminishing part.

According to the arrangement, in which the second film-thickness-gradually-diminishing part overlaps a base end of the first film-thickness-gradually-diminishing part, the second film-thickness-gradually-diminishing part completely compensates for a gradually diminished thickness of the base end of the first film-thickness-gradually-diminishing part. It is therefore possible to prevent a decrease in film thickness in each film formation region.

The film formation substrate in accordance with an embodiment of the present invention is preferably arranged such that the base end, in the predetermined direction, of the first film-thickness-gradually-diminishing part overlaps a corresponding one of the plurality of film formation regions.

According to the arrangement, in which the base end, in the predetermined direction, of the first film-thickness-gradually-diminishing part overlaps a corresponding one of the plurality of film formation regions, it is possible to secure a wide space (i.e., color mixture prevention margin) between the first film and the second film formation region without shortening a width, in the predetermined direction, of the first film-thickness-gradually-diminishing part. This makes it possible to prevent mixture of colors caused by overlapping between the first film and an adjacent film formation region even if the first film is largely mispositioned in the predetermined direction.

In addition, since the color mixture prevention margin can be widened without widening a region between film formation regions, the film formation regions (i.e., a display screen) can have higher resolution.

The film formation substrate in accordance with an embodiment of the present invention is preferably arranged such that a first substantially flat part, which is a part of said each of the first films other than the first film-thickness-gradually-diminishing part, has a thickness equal to a thickness of a second substantially flat part, which is a part of said each of the second films other than the second film-thickness-gradually-diminishing part, and a sum of the thickness of the first film-thickness-gradually-diminishing part and the thickness of the second film-thickness-gradually-diminishing part is equal to the thickness of the first substantially flat part and the second substantially flat part.

The film formation substrate in accordance with an embodiment of the present invention is preferably arranged such that at least some of the first films are red luminescent layers, at least some of the first films are green luminescent layers, at least some of the first films are blue luminescent layers, and each of the second films is (i) a blue luminescent layer, (ii) a host material constituting the blue luminescent layer, or (iii) an electron transfer layer.

According to the arrangement, at least some of the first films are red luminescent layers, at least some of the first films are green luminescent layers, at least some of the first films are blue luminescent layers, and each of the second films is (i) a blue luminescent layer, (ii) a host material constituting the blue luminescent layer, or (iii) an electron transfer layer. It is therefore possible to prevent mixture of colors caused by overlapping between the second film and the film formation region.

An organic EL display device of an embodiment of the present invention includes the film formation substrate.

According to the arrangement, it is possible to provide an organic EL display device that has effects of the film formation substrate.

INDUSTRIAL APPLICABILITY

The vapor deposition method and the vapor deposition device of the present invention are suitably applicable to, for example, a device and method for producing an organic EL display device which are used in a process of, for example, discriminative application formation of an organic layer in an organic EL display device. Further, the vapor deposition method and the vapor deposition device of the present invention are applicable to production of a film formation substrate in which mispositioning of a patterned film affects other regions.

REFERENCE SIGNS LIST

1: Organic EL display device
2: Pixel
2R, 2G, 2B: Sub-pixel
10: TFT substrate (substrate)
20: Organic EL element
22: Hole injection layer/hole transfer layer
23B2: Luminescent layer (third film)
23B3: Luminescent layer (second film)
23D: Buffer layer (first buffer layer)
23D1: First buffer layer (first buffer layer)
23D2: Second buffer layer (second buffer layer)
23R, 23G, 23B: Luminescent layer (first film, second film)
23sR, 23sG, 23sB: Film-thickness-gradually-diminishing part
23tR, 23tG, 23tB: Substantially flat part
24: Electron transfer layer (organic layer)
25: Electron injection layer (organic layer)
50: Vapor deposition device
60: Vacuum chamber
70: Substrate moving mechanism
71: Substrate holding member
72: Motor
80: Mask unit
81, 81R, 81G, 81B: Shadow mask
81a: Long side
81b: Short side
82: Opening
83: Alignment marker section
84: Alignment marker
84R, 84G, 84B: Alignment marker
85: Vapor deposition source
86: Injection hole
87: Mask holding member
88: Mask tension mechanism
89: Shutter
90: Image sensor
100: Control circuit
101: Image detecting section
102: Computing section
103: Motor drive control section
104: Vapor deposition ON/OFF control section
105: Shutter drive control section
200: Film formation substrate
210: Display region
210a: Long side
210b: Short side
211: Vapor-deposited film
220: Alignment marker section
221: Alignment marker
221: Vapor-deposited film
x: Direction parallel to a substrate scanning direction
y: Direction perpendicular to a substrate scanning direction (predetermined direction)

The invention claimed is:
1. A film formation substrate comprising:
a substrate on which a plurality of film formation regions are provided in a predetermined direction with spaces therebetween;
first films each of which is formed on the substrate so as to cover a corresponding one of the plurality of film formation regions;
second films each of which is formed in a region between the plurality of film formation regions;
an edge cover formed adjacent the first films and the second films; and
a plurality of sub-pixels each of which has a first electrode and an opening to the edge cover, wherein the opening to the edge cover is formed by positioning the edge cover to cover edge sections of the first electrode, and wherein the opening is contained in corresponding one of the first films or the second films,
each of the first films having, at both ends thereof in the predetermined direction, a first film-thickness-gradually-diminishing part whose thickness gradually diminishes towards a front end, in the predetermined direction, of the first film-thickness-gradually-diminishing part,
each of the second films having, at both ends thereof in the predetermined direction, a second film-thickness-gradually-diminishing part whose thickness gradually diminishes towards a front end, in the predetermined direction, of the second film-thickness-gradually-diminishing part, and
the second film-thickness-gradually-diminishing part overlapping the first film-thickness-gradually-diminishing part, wherein
at least some of the first films are red luminescent layers,
at least some of the first films are green luminescent layers,
at least some of the first films are blue luminescent layers, and
each of the second films is (i) a blue luminescent layer, (ii) a host material constituting the blue luminescent layer, or (iii) an electron transfer layer,
each of the first films has a first substantially flat part and each of the second films has a second substantially flat part, and
the first film-thickness-gradually-diminishing part overlaps the opening corresponding to one of the first films, and the second film-thickness-gradually-diminishing part does not overlap the opening corresponding to one of the second films.

2. The film formation substrate according to claim 1, wherein the second film-thickness-gradually-diminishing part overlaps a base end of the first film-thickness-gradually-diminishing part.

3. The film formation substrate according to claim 1, wherein the base end, in the predetermined direction, of the first film-thickness-gradually-diminishing part overlaps a corresponding one of the plurality of film formation regions.

4. The film formation substrate according to claim 1, wherein:
a first substantially flat part, which is a part of said each of the first films other than the first film-thickness-gradually-diminishing part, has a thickness equal to a thickness of a second substantially flat part, which is a part of said each of the second films other than the second film-thickness-gradually-diminishing part, and
a sum of the thickness of the first film-thickness-gradually-diminishing part and the thickness of the second film-thickness-gradually-diminishing part is equal to the thickness of the first substantially flat part and the second substantially flat part.

5. An organic EL display device comprising a film formation substrate as set forth in claim 1.

6. A production method for producing a film formation substrate as set forth in claim 1,
said production method comprising the steps of:
preparing a substrate on which first and second film formation regions are alternately provided in a predetermined direction with spaces therebetween;
(i) disposing, opposite to the substrate, a first vapor deposition mask having a first opening whose width in the predetermined direction is smaller than a width, in the predetermined direction, of the first film formation region so that a center, in the predetermined direction, of the first opening substantially coincides with a center, in the predetermined direction, of the first film formation region, and (ii) depositing vapor deposition particles on the substrate through the first opening so as to form, in the first film formation region, a first film having, at both ends thereof in the predetermined direction, a first film-thickness-gradually-diminishing part whose thickness gradually diminishes towards a front end, in the predetermined direction, of the first film-thickness-gradually-diminishing part; and
(i) disposing, opposite to the substrate, a second vapor deposition mask having a second opening so that a center, in the predetermined direction, of the second opening substantially coincides with a center, in the predetermined direction, of the second film formation region, and (ii) depositing the vapor deposition particles on the substrate through the second opening so as to form, in the second film formation region, a second film having, at both ends thereof in the predetermined direction, a second film-thickness-gradually-diminishing part whose thickness gradually diminishes towards a front end, in the predetermined direction, of the second film-thickness-gradually-diminishing part.

7. The film formation substrate according to claim 1, wherein the second film-thickness-gradually-diminishing part overlaps the opening corresponding to one of the first films.

8. The film formation substrate according to claim 1, wherein each of the first films has a third film-thickness-gradually-diminishing part above the first film-thickness-gradually-diminishing part and each of the second films has a fourth-film-thickness-gradually-diminishing part above the second film-thickness-gradually-diminishing part, and
the third film-thickness-gradually-diminishing part overlaps the opening corresponding to one of the first films, and the fourth film-thickness-gradually-diminishing part does not overlap the opening corresponding to one of the second films.

9. The film formation substrate according to claim 7, wherein the third film-thickness-gradually-diminishing part overlaps the opening corresponding to one of the first films.

* * * * *